United States Patent [19]
Purcell et al.

[11] Patent Number: 5,379,356
[45] Date of Patent: Jan. 3, 1995

[54] DECOMPRESSION PROCESSOR FOR VIDEO APPLICATIONS

[75] Inventors: Stephen C. Purcell, Mountain View; David E. Galbi, Santa Clara; Frank H. Liao, Sunnyvale; Yvonne C. Tse, Fremont, all of Calif.

[73] Assignee: C-Cube Microsystems, Milpitas, Calif.

[21] Appl. No.: 46,474

[22] Filed: Apr. 13, 1993

Related U.S. Application Data

[63] Continuation of Ser. No. 669,818, Mar. 15, 1991, abandoned.

[51] Int. Cl.⁶ .......................... G06K 9/36; G06K 9/46; H04N 7/12
[52] U.S. Cl. ........................................ 382/56; 382/43; 348/416
[58] Field of Search .................... 382/43, 56; 358/133, 358/135, 136; G06K 9/36, 9/46; H04N 7/12; 348/402, 416

[56] References Cited

U.S. PATENT DOCUMENTS

| | | | |
|---|---|---|---|
| 4,703,349 | 10/1987 | Bernstein | 382/56 |
| 4,748,511 | 5/1988 | Nichols et al. | 382/56 |
| 4,827,338 | 5/1989 | Gerard | 358/136 |
| 4,897,717 | 1/1990 | Hamilton et al. | 358/133 |
| 4,969,040 | 11/1990 | Gharavi | 358/136 |
| 4,974,078 | 11/1990 | Tsai | 358/133 |
| 5,057,918 | 10/1991 | Denoyelle et al. | 358/136 |
| 5,136,371 | 8/1992 | Savatier et al. | 358/135 |

OTHER PUBLICATIONS

"A Chip Set Core for Image Compression", by Alain Artieri, et al., IEEE Transactions on Consumer Electronics, vol. 36, No. 3, Aug. 1990, New York, pp. 395–402.

"A Parallel Architechture for Real-Time Video Coding", by Luis de Sa, et al., Microprocessing and Microprogramming, vol. 30, No. 1–5, Aug. 1990, Amsterdam, NL, pp. 439–445.

"A Multiprocessor System Utilizing Enhanced DSP's for Image Processing", by Hirotada Ueda, et al., Proceedings International Conference on Systolic Arrays, 25 May 1988, San Diego, pp. 611–620.

"A General Architecture of Video Codec for Real Time Communications at 64 kbit/s", by M. Balestri, et al., Signal Processing Image Communication, vol. 1, No. 2, Oct. 1989, Amsterdam, NL, pp. 239–243.

*Primary Examiner*—Jose L. Couso
*Attorney, Agent, or Firm*—Skjerven, Morrill, MacPherson, Franklin & Friel

[57] ABSTRACT

A method and a structure are provided to decode intraframe and interframe coded compressed video data. In one embodiment, a decompression structure having a processor is provided with a global bus over which a decoder coprocessor, an inverse discrete cosine transform coprocessor and a motion compensation coprocessor communicate. The decompression structure communicates with a host computer over a host bus and with an external dynamic random access memory over a memory bus. The processor provides overall control to the coprocessors by reading and writing into a plurality of data and control registers, each register associated with one of the coprocessors. A structure including four of the decompression structures and a method are provided for decoding high definition television (HDTV) signals. In this structure for decoding HDTV signals, each decompression structure decodes a 480×1088-pixel picture area with access to up to two additional 240×1088-pixel picture areas.

13 Claims, 33 Drawing Sheets op: 2-bit major operation ( arith, shift, LD, ST )
d: 1-bit destination control ( local, global )
opc: 3-bit minor opcode
C: 5-bit destination register
B: 5-bit source register
src: 2-bit Atype ( 0:RegA, 1:imm5 (A), 2:imm14 (or,J, A)
br: 4-bit branch control
J: 5-bit jump target
A: 5-bit source register ( or imm literal )

(Octal) Byte Addresses (2 per Pixel)

Screen addresses in a 16 x 16 Macro Block

```
100
  ↓
4→  000  002 | 100  102 | 200  202  300  302 | 400  402  500  502  600  602  700  702
    004  006 | 104  106 | 204  206  304  306 | 404  406  504  506  604  606  704  706
    010  012   110  112   210  212  310  312   410  412  510  512  610  612  710  712
    014  016   114  116   214  216  314  316   414  416  514  516  614  616  714  716
    020  022   120  122   220  222  320  322   420  422  520  522  620  622  720  722
    024  026   124  126   224  226  324  326   424  426  524  526  624  626  724  726
    030  032   130  132   230  232  330  332   430  432  530  532  630  632  730  732
    034  036   134  136   234  236  334  336   434  436  534  536  634  636  734  736
    040  042   140  142   240  242  340  342   440  442  540  542  640  642  740  742
    044  046   144  146   244  246  344  346   444  446  544  546  644  646  744  746
    050  052   150  152   250  252  350  352   450  452  550  552  650  652  750  752
    054  056   154  156   254  256  354  356   454  456  554  556  654  656  754  756
    060  062   160  162   260  262  360  362   460  462  560  562  660  662  760  762
    064  066   164  166   264  266  364  366   464  466  564  566  664  666  764  766
    070  072   170  172   270  272  370  372   470  472  570  572  670  672  770  772
    074  076   174  176   274  276  374  376   474  476  574  576  674  676  774  776
```

| Adr | MDATA [63:32] | MDATA [31:0] |
|---|---|---|
| 000: | 000, 001, 002, 003, | 004, 005, 006, 007, |
| 010: | 010, 011, 012, 013, | 014, 015, 016, 017, |
| ::: | | |
| 070: | 070, 071, 072, 073, | 074, 075, 076, 077, |
| 100: | 104, 105, 106, 107, | 100, 101, 102, 103, |
| 110: | 114, 115, 116, 117, | 110, 111, 112, 113, |

SPECIAL (Scan Line) Addressing:

| Adr | MDATA [63:32] | MDATA [31:0] |
|---|---|---|
| 000: | 000, 001, 002, 003, | 100, 101, 102, 103, |
| 010: | 010, 011, 012, 013, | 110, 111, 112, 113, |
| ::: | | |
| 070: | 070, 071, 072, 073, | 170, 171, 172, 173, |
| 100: | 104, 105, 106, 107, | 004, 005, 006, 007, |
| 110: | 114, 115, 116, 117, | 014, 015, 016, 017, |

FIG. 8B

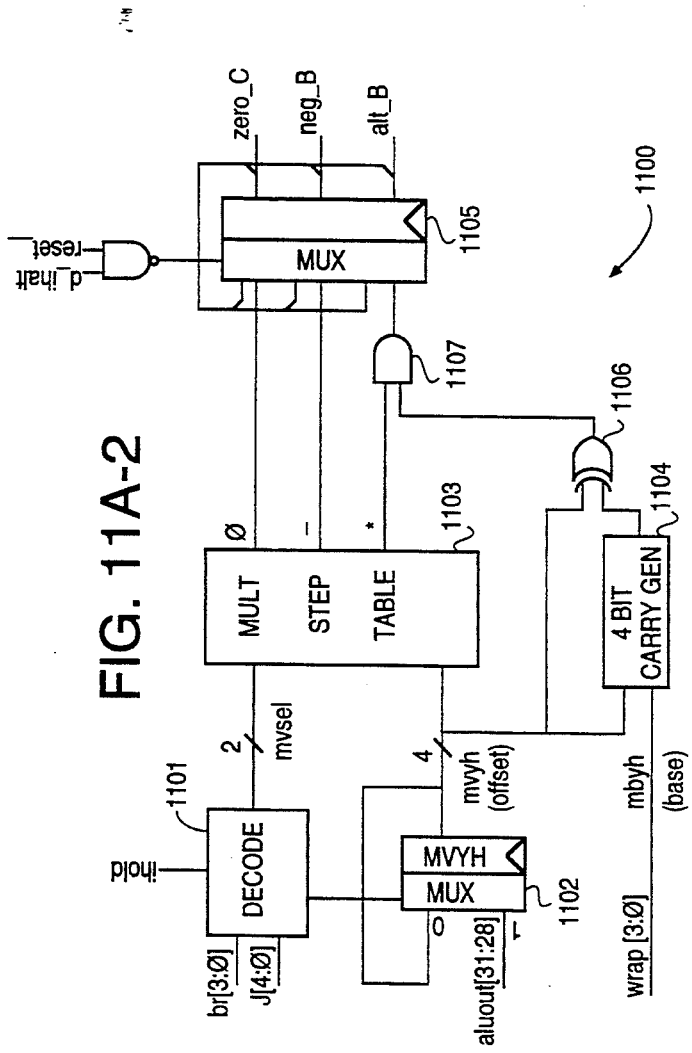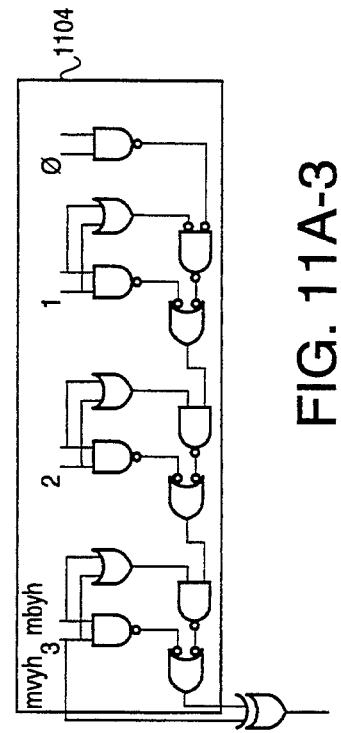
FIG. 11A-2
FIG. 11A-3
FIG. 11A-1

| 00 | 01 | 02 | 03 | 04 | 05 | 06 | 07 |
|----|----|----|----|----|----|----|----|
| 10 | 11 | 12 | 13 | 14 | 15 | 16 | 17 |

FIG. 12A

| 00 | 02 | 04 | 06 | 10 | 12 | 14 | 16 |
|----|----|----|----|----|----|----|----|
| 01 | 03 | 05 | 07 | 11 | 13 | 15 | 17 |

FIG. 12B

| 00 | 04 | 10 | 14 | 01 | 05 | 11 | 15 |
|----|----|----|----|----|----|----|----|
| 02 | 06 | 12 | 16 | 03 | 07 | 13 | 17 |

FIG. 12C

| 00 | 10 | 01 | 11 | 02 | 12 | 03 | 13 |
|----|----|----|----|----|----|----|----|
| 04 | 14 | 05 | 15 | 06 | 16 | 07 | 17 |

FIG. 12D

| INPUT | OUTPUT | | | |
|---|---|---|---|---|
| | ROTATE 0 (PATTERN 0) | ROTATE 1 (PATTERN 1) | ROTATE 2 (PATTERN 2) | ROTATE 3 (PATTERN 3) |
| 0 0 0 0 | 0 0 0 0 | 0 0 0 0 | 0 0 0 0 | 0 0 0 0 |
| 0 0 0 1 | 0 0 0 1 | 1 0 0 0 | 0 1 0 0 | 0 0 1 0 |
| 0 0 1 0 | 0 0 1 0 | 0 0 0 1 | 1 0 0 0 | 0 1 0 0 |
| 0 0 1 1 | 0 0 1 1 | 1 0 0 1 | 1 1 0 0 | 0 1 1 0 |
| 0 1 0 0 | 0 1 0 0 | 0 0 1 0 | 0 0 0 1 | 1 0 0 0 |
| 0 1 0 1 | 0 1 0 1 | 1 0 1 0 | 0 1 0 1 | 1 0 1 0 |
| 0 1 1 0 | 0 1 1 0 | 0 0 1 1 | 1 0 0 1 | 1 1 0 0 |
| 0 1 1 1 | 0 1 1 1 | 1 0 1 1 | 1 1 0 1 | 1 1 1 0 |
| 1 0 0 0 | 1 0 0 0 | 0 1 0 0 | 0 0 1 0 | 0 0 0 1 |
| 1 0 0 1 | 1 0 0 1 | 1 1 0 0 | 0 1 1 0 | 0 0 1 1 |
| 1 0 1 0 | 1 0 1 0 | 0 1 0 1 | 1 0 1 0 | 0 1 0 1 |
| 1 0 1 1 | 1 0 1 1 | 1 1 0 1 | 1 1 1 0 | 0 1 1 1 |
| 1 1 0 0 | 1 1 0 0 | 0 1 1 0 | 0 0 1 1 | 1 0 0 1 |
| 1 1 0 1 | 1 1 0 1 | 1 1 1 0 | 0 1 1 1 | 1 0 1 1 |
| 1 1 1 0 | 1 1 1 0 | 0 1 1 1 | 1 0 1 1 | 1 1 0 1 |
| 1 1 1 1 | 1 1 1 1 | 1 1 1 1 | 1 1 1 1 | 1 1 1 1 |

FIG. 12E

DECOMPRESSION PROCESSOR FOR VIDEO APPLICATIONS

This application is a continuation of Ser. No. 07/669,818 filed Mar. 15, 1991 now abandoned.

BACKGROUND OF THE INVENTION

1. Field of the Invention

This invention relates to the field of digital signal processing, and in particular relates to the processing of digital video signals.

2. Description of Related Arts

Motion pictures are provided at thirty frames per second to create the illusion of continuous motion. Since each picture is made up of thousands of pixels, the amount of storage necessary for storing even a short motion sequence is enormous. As high definition is desired, the number of pixels in each picture is expected to grow also. Fortunately, taking advantage of special properties of the human visual system, lossy compression techniques have been developed to achieve very high data compression without loss of perceived picture quality. (A lossy compression technique involves discarding information not essential to achieve the target picture quality). Nevertheless, the decompression processor is required to reconstruct in real time every pixel of the stored motion sequence.

The Motion Picture Experts Group (MPEG) is charged with providing a standard (hereinbelow "MPEG standard") for achieving compatibility between compression and decompression equipment. This standard specifies both the coded digital representation of video signal for the storage media, and the method for decoding. The representation supports normal speed playback, as well as other play modes of color motion pictures, and reproduction of still pictures. The standard covers the common 525- and 625-line television, personal computer and workstation display formats. The MPEG standard is intended for equipment supporting continuous transfer rate of up to 1.5 Mbits per second, such as compact disks, digital audio tapes, or magnetic hard disks. The MPEG standard is intended to support picture frames of approximately 288×352 pixels each at a rate between 24 Hz and 30 Hz. A publication by MPEG entitled "Coding for Moving Pictures and Associated Audio for digital storage medium at 1.5 Mbit/s," included herein as Appendix A, provides in draft form the proposed MPEG standard, which is hereby incorporated by reference in its entirety to provide detailed information about the MPEG standard.

Under the MPEG standard, the picture frame is divided into a series of "Macroblock slices" (MBS), each MBS containing a number of picture areas (called "macroblocks") each covering an area of 16×16 pixels. Each of these picture areas is represented by one or more 8×8 matrices which elements are the spatial luminance and chrominance values. In one representation (4:2:2) of the macroblock, a luminance value (Y type) is provided for every pixel in the 16×16 pixels picture area (in four 8×8 "Y" matrices), and chrominance values of the U and V (i.e., blue and red chrominance) types, each covering the same 16×16 picture area, are respectively provided in two 8×8 "U" and two 8×8 "V" matrices. That is, each 8×8 U or V matrix covers an area of 8×16 pixels. In another representation (4:2:0), a luminance value is provided for every pixel in the 16×16 pixels picture area, and one 8×8 matrix for each of the U and V types is provided to represent the chrominance values of the 16×16 pixels picture area. A group of four contiguous pixels in a 2×2 configuration is called a "quad pixel"; hence, the macroblock can also be thought of as comprising 64 quad pixels in an 8×8 configuration.

The MPEG standard adopts a model of compression and decompression shown in FIG. 1. As shown in FIG. 1, interframe redundancy (represented by block 101) is first removed from the color motion picture frames. To achieve interframe redundancy removal, each frames is designated either "intra" "predicted" or "interpolated" for coding purpose. Intra frames are least frequently provided, the predicted frames are provided more frequently than the intra frames, and all the remaining frames are interpolated frames. The values of every pixels in an intra frame ("I-picture") is independently provided. In a prediction frame ("P-picture"), only the incremental changes in pixel values from the last I-picture or P-picture are coded. In an interpolation frame ("B-picture"), the pixel values are coded with respect to both an earlier frame and a later frame. Note that the MPEG standard does not require frames to be stored in strict time sequence, such that the intraframe from which a predicted frame is coded can be provided in the picture sequence either earlier or later in time as the predicted frame. By coding frames incrementally, using predicted and interpolated frames, much interframe redundancy can be eliminated to result in tremendous savings in storage. Motion of an entire macroblock can be coded by a motion vector, rather than at the pixel level, thereby providing further data compression.

The next steps in compression under the MPEG standard remove intraframe redundancy. In the first step, represented by block 102 of FIG. 1, a 2-dimensional discrete cosine transform (DCT) is performed on each of the 8×8 values matrices to map the spatial luminance or chrominance values into the frequency domain.

Next, represented by block 103 of FIG. 1, a process called "quantization" weights each element of the 8×8 matrix in accordance with its chrominance or luminance type and its frequency. In an I-picture, the quantization weights are intended to reduce to one many high frequency components to which the human eye is not sensitive. In P- and B- pictures, which contain mostly higher frequency components, the weights are not related to visual perception. Having created many zero elements in the 8×8 matrix, each matrix can now be represented without information loss as an ordered list of a "DC" value, and alternating pairs of a non-zero "AC" value and a length of zero elements following the non-zero value. The list is ordered such that the elements of the matrix are presented as if the matrix is read in a zigzag manner (i.e., the elements of a matrix A are read in the order A00, A01, A10, A02, A11, A20 etc.). This representation is space efficient because zero elements are not represented individually.

Finally, an entropy encoding scheme, represented by block 104 in FIG. 1, is used to further compress the representations of the DC block coefficients and the AC value-run length pairs using variable length codes. Under the entropy encoding scheme, the more frequently occurring symbols are represented by shorter codes. Further efficiency in storage is thereby achieved.

Decompression under MPEG is shown by blocks 105–108 in FIG. 1. In decompression, the processes of entropy encoding, quantization and DCT are reversed, as shown respectively in blocks 105–107. The final step, called "absolute pixel generation" (block 108), provides the actual pixels for reproduction, in accordance to the play mode (forward, reverse, slow motion e.g.), and the physical dimensions and attributes of the display used.

Further, since the MPEG standard is provided only for noninterlaced video signal, in order to display the output motion picture on a conventional NTSC or PAL television set, the decompressor must provide the output video signals in the conventional interlaced fields. Guidelines for decompression for interlaced television signals have been proposed as an extension to the MPEG standard. This extended standard is compatible with the International Radio Consultative Committee (CCIR) recommendation 601 (CCIR-601). The process of converting from a picture to the two interlaced fields of a frame is discussed in ANNEX C of the MPEG publication "Coding for Moving Pictures and Associated Audio for digital storage medium at 1.5 Mbit/s" incorporated by reference above.

Since the steps involved in compression and decompression, such as illustrated for the MPEG standard discussed above, are very computationally intensive, for such a compression scheme to be practical and widely accepted, the decompression processor must be designed to provide decompression in real time, and allow economical implementation using today's computer or integrated circuit technology.

SUMMARY OF THE INVENTION

In accordance with the present invention, a method and a structure are provided for decoding intraframe and interframe coded compressed video data. In one embodiment of the present invention, a decompression structure includes a processor, a decoder coprocessor, an inverse discrete cosine transform coprocessor and a motion compensation coprocessor, and a global bus for communication. The decompression structure in accordance with the present invention can also communicate with a host computer over a host bus and with an external dynamic random access memory (DRAM) over a memory bus.

The processor in the decompression structure of the present invention provides overall control to the decoder, IDCT and motion compensation coprocessors by reading and writing into a plurality of data and control registers each associated with one of the decoder, the IDCT and the motion compensation coprocessors.

In one embodiment of the present invention, the 2-dimensional display space is mapped into the linear address space of the external DRAM by embedding in the linear DRAM addresses X and Y vectors of the display space. Further, the mapping of the X and Y vectors in accordance with the present invention allows a macroblock of pixels to be stored in one DRAM memory page, so that access to a macroblock can be efficiently accomplished under page mode access to the DRAM page. In one embodiment, timing of the CAS signal is satisfied by delaying the falling edge of the clock signal. By looping the CAS signal back into the chip from an output pin, timing of data arrival from the external DRAM is better controlled. By providing special control to one address bit, data of four pixels can be obtained at one time in a 2×2-pixel ("quad pixel") configuration, or in a 4×1-pixel ("scan") configuration.

In one embodiment of the present invention, an HDTV decompression structure, including four of the decompression structures mentioned above, and a method are provided for decoding high definition television (HDTV) signals. In this HDTV decompression structure, each decompression structure decodes a 480×1088-pixel picture area with access to two 240×1088-pixel picture area. A method using a divide-by-15 divisor is provided in the HDTV decompression structure to map the display space into the external DRAM with efficient use of the DRAM physical address space.

In one embodiment of the present invention, a decoder logic unit, including a plurality of decode tables, and a method are provided in the decoder coprocessor to decode coded video data. Each coded datum to be decoded is provided to all of the decode tables. The decoded datum is selected by a finite-state machine from among the output data of all the decoded tables.

In one embodiment of the present invention, the processor of the decompression structure is provided with a structure and a method for minimizing the cost of computing a product by reducing the computation to a sum of modified operands obtained by using ternary arithmetic and either zeroing, negating or leaving unchanged precomputed constants.

In one embodiment of the current invention, a block memory structure and a method are provided for receiving 8×8-pixel blocks column by column in a 16×16-pixel picture area, such that the 16×16-pixel picture area can be output column by column simultaneously as the 8×8-pixel blocks are received, without double-buffering.

In one embodiment of the current invention, a motion compensation structure and a method are provided for interpolating interframe coded video data using motion vectors. The motion compensation structure comprises a filter for resampling the pixel data in both vertical and horizontal directions, a prediction memory structure and a weighted adder structure. In one embodiment of the present invention, a weighted adder structure and a method are provided for performing bilinear interpolation of two values using a plurality of multiplexers and an multiple-input adder.

In one embodiment of the present invention, a structure and a method are provided for accessing a 16×16-pixel picture area in two parts, in order that the number of DRAM page boundaries crossed during such access of the 16×16-pixel picture area is minimized, thereby increasing the efficiency of memory access by reducing the overhead cost associated with initial accesses of DRAMs under page access mode.

BRIEF DESCRIPTION OF THE DRAWINGS

FIG. 8b shows the byte addresses (lower 9 bits) of a 16×16-pixel macroblock.

FIG. 11a is a schematic diagram of a circuit 1200 for generating the control signals to multiply the Y-component of the motion vector and the screen width.

FIG. 12a–d shows the four patterns of memory access in bank0 of the block memory 314.

FIG. 12e shows the address bit patterns generated to access bank0 of block memory 314 in each of the four memory access patterns 0–3 of FIGS. 12a–d.

DETAILED DESCRIPTION OF THE PREFERRED EMBODIMENTS

Figure 1:
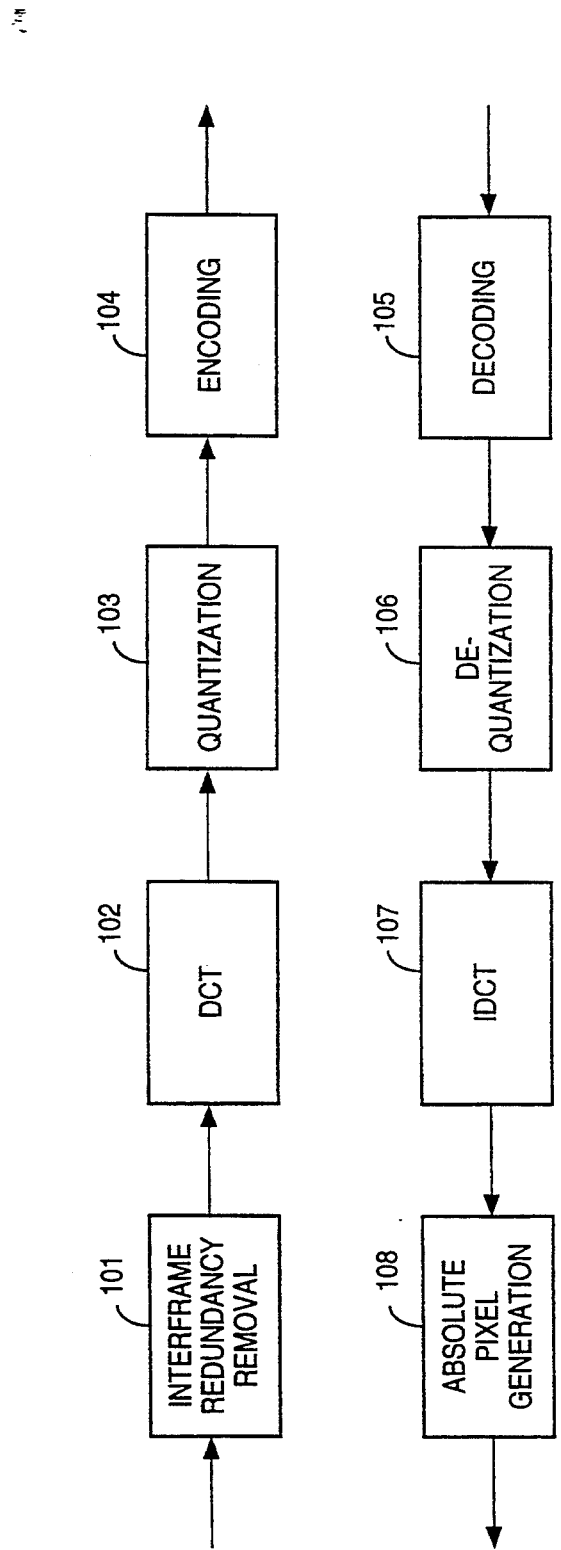
FIG. 1 is a model of the compression and decompression processes under the MPEG standard.
Figure 2:
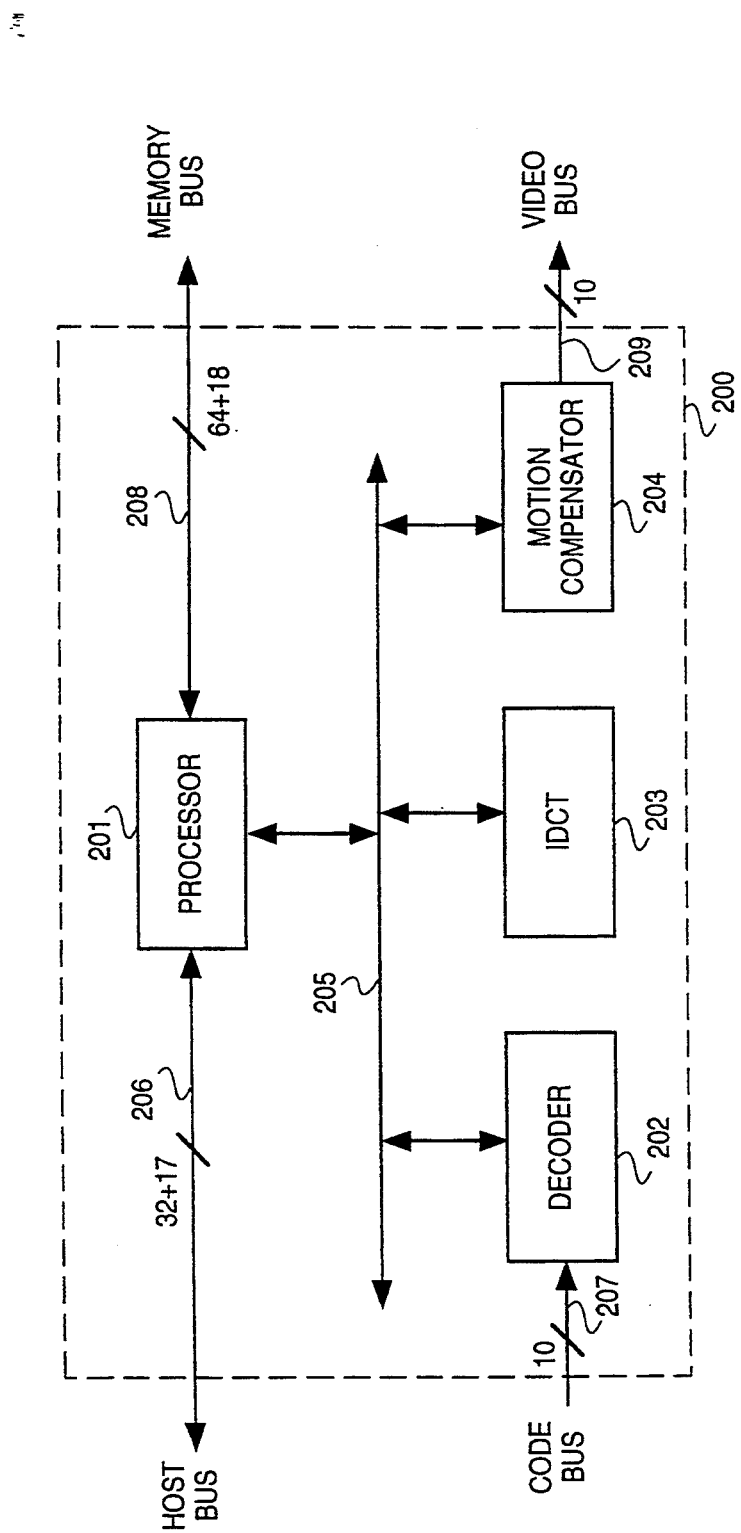
FIG. 2 is a block diagram of an embodiment of the present invention in a video decompression circuit 200.

FIG. 2 shows an embodiment of the present invention in a video decompression circuit 200. This embodiment of the present invention is provided in the CL950 MPEG Video Decompression Processor (the "CL950 chip"), available from C-Cube Microsystems, San Jose Calif.

As shown in FIG. 2, a video decompression circuit 200 has a processor 201, a decoder coprocessor 202, an IDCT coprocessor 203, and a motion compensation coprocessor 204 connected by a global bus 205. Video decompression circuit 200 has four interfaces: a 49-bit host bus 206, a 10-bit code bus 207, a 82-bit memory bus 208, and a 15-bit video bus 209.

The global bus 205 provides the conduit of communication amongst the processor 201, and the coprocessors 202–204. The global bus comprises a 32-bit data bus and a 7-bit address bus, with the least significant bit of the 7-bit address bus indicating whether the 7-bit address is a read address or a write address. Selected modules in the coprocessors 202–204 are each assigned four coprocessor addresses: a "read data" address (base address), a "write data" address (base+1 address), a "read control" address (base+2 address), and a "write control" address (base+3 address). In addition, processor 201 is assigned sixty four addresses to read and write thirty two registers in processor 201. As will be explained below, processor 201 monitors and controls the operations of the modules in coprocessors 202–204 by reading and writing into each module's control and data addresses.

The host bus 206 communicates with a conventional host computer using a standard communication protocol such as the ANSI/IEEE Standard 1196–1987 ("NuBus" Standard). The type of host computer and the communication protocol used are not consequential to the present invention. In this embodiment, the host bus 206 has a bidirectional 32-bit bus for data input and output purposes, an 8-bit address bus which includes "host request" (Hreq) and "read/write" (Hwrite) signals, 4 control input and output pins, a host clock, a global clock pin, a reset pin, an interrupt pin, and a test pin. Host bus 206 is a module given access to the global bus. The 7-bit address bus of the global bus 205 corresponds to the 7-bit address bus of the host bus 206.

The code bus 207 receives a 1-bit "code valid" (CVALID) signal indicating arrival of compressed video data ("code") in a byte stream CBUS[7:0] and provides a "ready" (CRDY) signal when code bus 207 is ready for the next byte of code.

The memory bus 208 connects up to three banks of dynamic random access memory (DRAM) external to circuit 200. Memory bus 208 has a bidirectional 64-bit data bus (208b) mdata[63:0] and an 11-bit address bus (208a) for multiplexing column and row addresses, consisting of bus maddr[9:1] and leads maddr0H and maddr0L. The mapping of the bits in the memory address bus 208a to row and the column addresses are discussed in a later section. Memory bus 208 can access the external DRAM under a fast page mode, which is discussed in further detail below. Three 1-bit "row'address strobe" (RAS[1:0], RAS2) signals and a 1-bit "column address strobe" (CAS) signal are provided. The CAS signal is looped back as a "data ready" (MCASIN) signal. Because of clock skews and other factors, such as output loading, it is very difficult to control when the column address strobe signal actually arrives at the external DRAM, and hence when data are ready from the external DRAM. However, by looping back the CAS signal on the output pin, this embodiment can monitor the time at which the CAS signal is asserted at the external DRAM. Therefore, the uncertainty as to when the external DRAM receives the column address is removed, and hence the data arrival time, which is within a specified time from the assertion of the CAS signal, is known. Read or write operation is indicated by two bits of the write enable signal (MWE[1:0]).

The video bus 209 is a byte serial bus in CCIR-601 format operating synchronously with a video clock. The present embodiment supports both interlaced and non-interlaced applications. The video bus 209 has a 8-bit data bus (VBUS[7:0]). The VSYNC signal, which indicates the beginning of a frame, can be generated by video bus 209 as an output signal, or can be provided by the external display equipment as input signal to the video bus 209. A signal VPOP is provided to the video bus 209 when the external display equipment requests a byte of video data to be transferred in the next clock period. In addition, in this embodiment, five pins are reserved for future enhancement, such as for expanding the VBUS [7:0] bus to support direct output to an RGB type display.

Processor 201 is a 32-bit processor unit that provides overall control to the coprocessors 202-204, controls access to the external memory system, and generally handles exceptions and low frequency tasks.

Decoder 202 is a coprocessor which receives from code bus 206 a byte stream of variable length entropy-encoded codes. Decoder 202 performs decoding and dequantization of the entropy-encoded codes. The decoded code is provided to the IDCT unit 203 to be mapped from frequency space into the display space using an 8×8 2-dimensional inversed discrete cosine transform.

Motion compensation coprocessor 204 reconstructs P-pictures and B-pictures from motion vectors and past and/or future frames.

Figure 3:
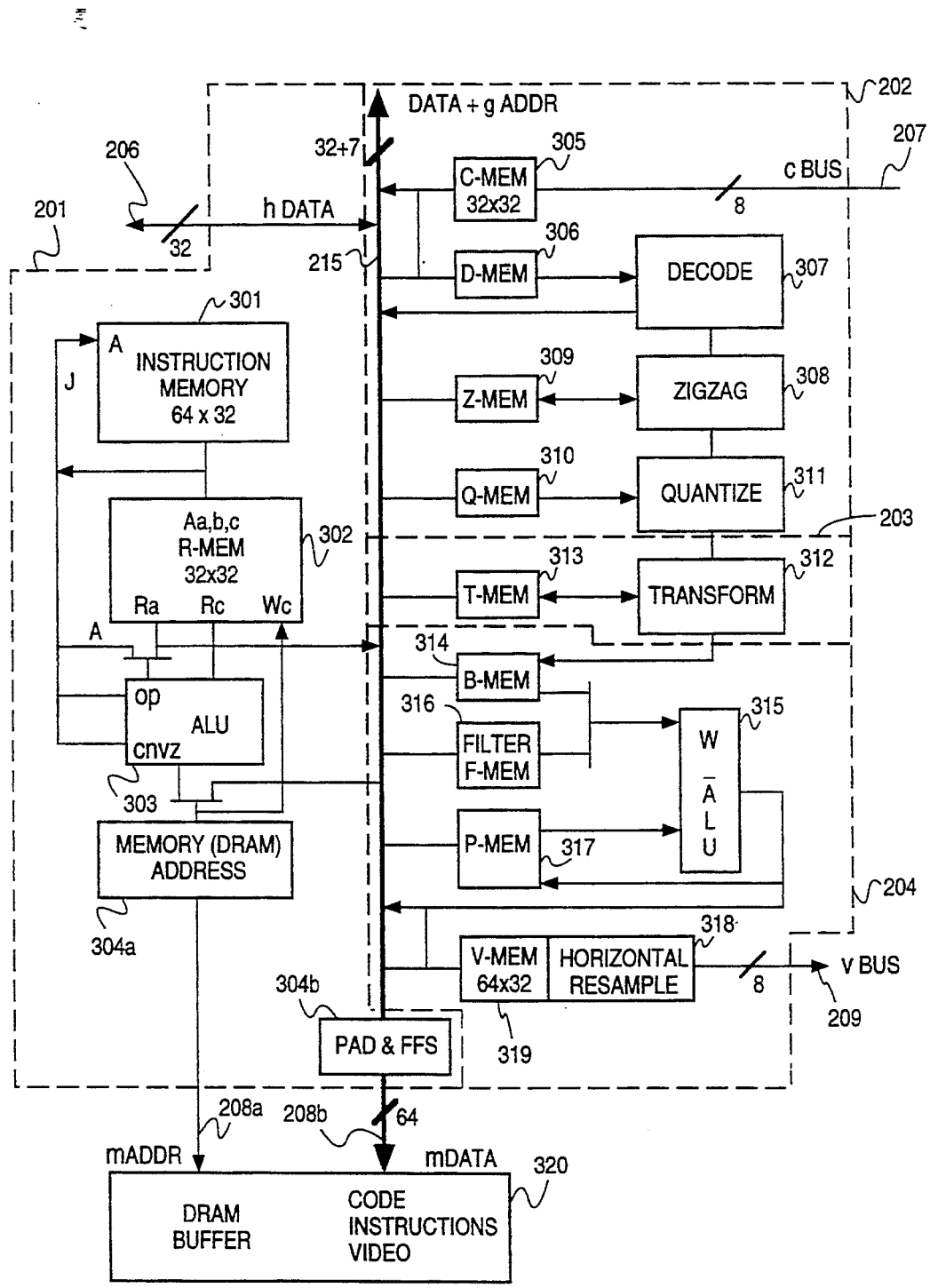
FIG. 3 is a more detailed block diagram of the video compression circuit 200 shown in FIG. 2.

FIG. 3 is a more detailed block diagram of FIG. 2's circuit 200, showing the functional blocks in processor 201, and coprocessors 202-204. As shown in FIG. 3, the processor 201 comprises a 64×32-bit instruction memory 301, a register file 302, which consists of 32 general-purpose 32-bit registers, an ALU 303, and a DRAM controller unit 304, which comprises both the DRAM address generation unit 304a and the "Pads and FF" or global bus interface unit 304b.

The decoder coprocessor 202 is shown in FIG. 3 to comprise a 32×32-bit code memory unit 305, a 32×32-bit decode memory unit 306, decode logic unit 307, zig-zag logic unit 308, 128×8-bit zigzag memory 309, a 2×64×8-bit quantizer memory 310, and quantizer logic unit 311. The IDCT coprocessor 203 comprises a transform logic unit 312, and transform memory 313. The motion compensation unit 204 comprises a block memory unit 314, a pixel filter unit 316, a weighted adder/ALU unit 315, a pixel or prediction memory 317, consisting of a 128×16-bit and a 64×16-bit memory, a 64×32-bit video memory 319, and a horizontal resampler circuit 318.

Processor 201

As discussed above, the processor 201 controls the overall operation of circuit 200, including the operations of the coprocessors 202-204 and access to the external DRAM. The instructions of processor 201 have the general format shown in FIG. 4.

Figure 4:
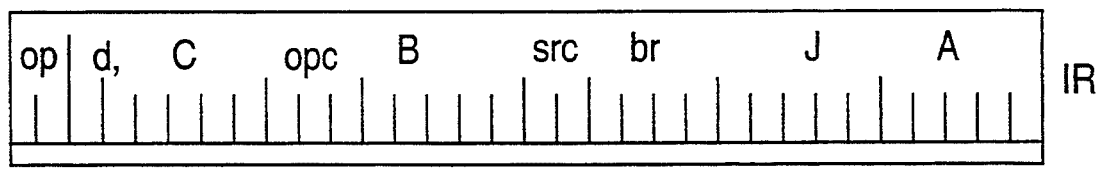
FIG. 4 is an instruction format of processor 201 in the video decompression circuit 200 of FIG. 2.

As shown in FIG. 4, the opcode field (combination of "op", "opc" fields) in an instruction of processor 201 consists of five bits, in which a 2-bit field "op" indicates the "major operation," which is either an arithmetic operation, a shift-operation, a load operation, or a store operation. A typical instruction specifies two sources "A" and "B" of operands and provides the result at a destination register "C". An instruction of processor 201 specifies in a 2-bit field "SRC" the "A" operand's source type, which can be either a register, a 5-bit immediate value, or a 14-bit immediate value. The "B" source of the instruction of processor 201 is always a 5-bit register, including a globally addressable register (see below), or a local register in register file 302. A bit "d" specifies whether the destination is a local register in register file 302, or a globally addressable register. The execution of an instruction in processor 201 sets a number of flags, which are tested by the next instruction to determine if a branch condition is satisfied. The condition to be tested is specified in a 4-bit branch control field "br". Upon a successful test of the branch condition, control is transferred to the instruction which address is contained in the register specified in the 5-bit jump target field "J". When the "A" source specifies a 14-bit immediate value, the "br", "J" and "A" fields are not available. Appendix E provides the instruction set of processor 201.

Prior to executing an instruction, the instruction must be loaded in the 64×32-bit instruction memory 301, which includes a 32-word instruction cache. The instruction cache holds one block of 32 instructions from the DRAM, and 32 always-resident instructions provided for cache management and for responding to the interrupts of the coprocessors 202-204 (see below). The instructions are fetched in a pipeline. To increase performance, the next sequential instruction and the instruction at the potential branch target are both fetched.

Thirty two general purpose registers are provided in register file 302. Register file 302 is provided with two read ports and one write port, to allow fetching of the two source operands and writing the result into the destination register, if required in the instruction format discussed above. Bypass multiplexers are provided for simultaneous read and write into the same register.

Each instruction of the processor 201 is executed in one clock cycle, excluding overhead or stall cycles. In memory load instructions, depending on whether a 32-bit or a 64-bit datum is loaded, an additional one or two cycles may be required before the destination register is updated. Because a special DRAM page access method is used (see below), successive accesses to DRAM locations in the same row can be initiated every other instruction. For the initial access to a new row, the access time can be four to six clock cycles. This period is hidden from the user by stalling the execution of the fourth instruction the requisite number of cycles. Hence, a load instruction latency of four instructions is maintained.

In certain time critical instructions, where there are no branch condition specified (i.e., the "branch never" condition), the field "J" (branch target address) is used to enhance performance by providing control signals to special circuits. These controls signals specify operations such as RAS precharge, video line access, memory refresh, and the special operations used in computing addresses of the motion compensated reference blocks. These special operations are discussed below in conjunction with the motion compensation coprocessor 204.

As discussed above, processor 201 controls the operations in each of the coprocessors 202-204 by writing into the control and data registers of modules in each of the coprocessor 202-204 over the global bus 205. The globally addressable registers are: the hCntl register in the host bus 205, the iCntl and iData registers in the processor 201, the cCntl register associated with code memory unit 305, the dCntl register associated with decode memory 306, the kCntl, dData0, dData1, dDiag, dMV1 and dMV2 registers associated with decode logic 307, fCntl register associated with pixel filter unit 316, the sCntl and tCntl registers associated with IDCT unit 203, the zCtl register associated with zigzag unit 308, bCntl register associated with block memory unit 314, the qCntl register associated with quantizer unit 311, the pCntl register associated with pixel memory 317, the vCntl register associated with Video memory 318, and the mCntl register associated with memory controller 304. A detailed description of the fields in each of these control registers are provided in Appendix B.

Under the control scheme of the current invention, each coprocessor, after initialization by processor 201, is controlled internally by a finite state machine. Processor 201 controls each of the coprocessors 202-204 is an independent process running in parallel other control processes. Four of these control processes are the code input, the decompression (both the code input and the decompression tasks are directed at decoder coprocessor 202), the motion compensation and the video output tasks (both motion compensation and video output are directed at the motion compensation coprocessor 204). These tasks are given priority to access the external DRAM in the order: a) video output, b) code input, c) decompression, and d) motion compensation. Some modules are initialized after reset, and some registers are updated after every frame. The filter control register in motion compensation coprocessor 204 is updated once every macroblock.

Figure 5:
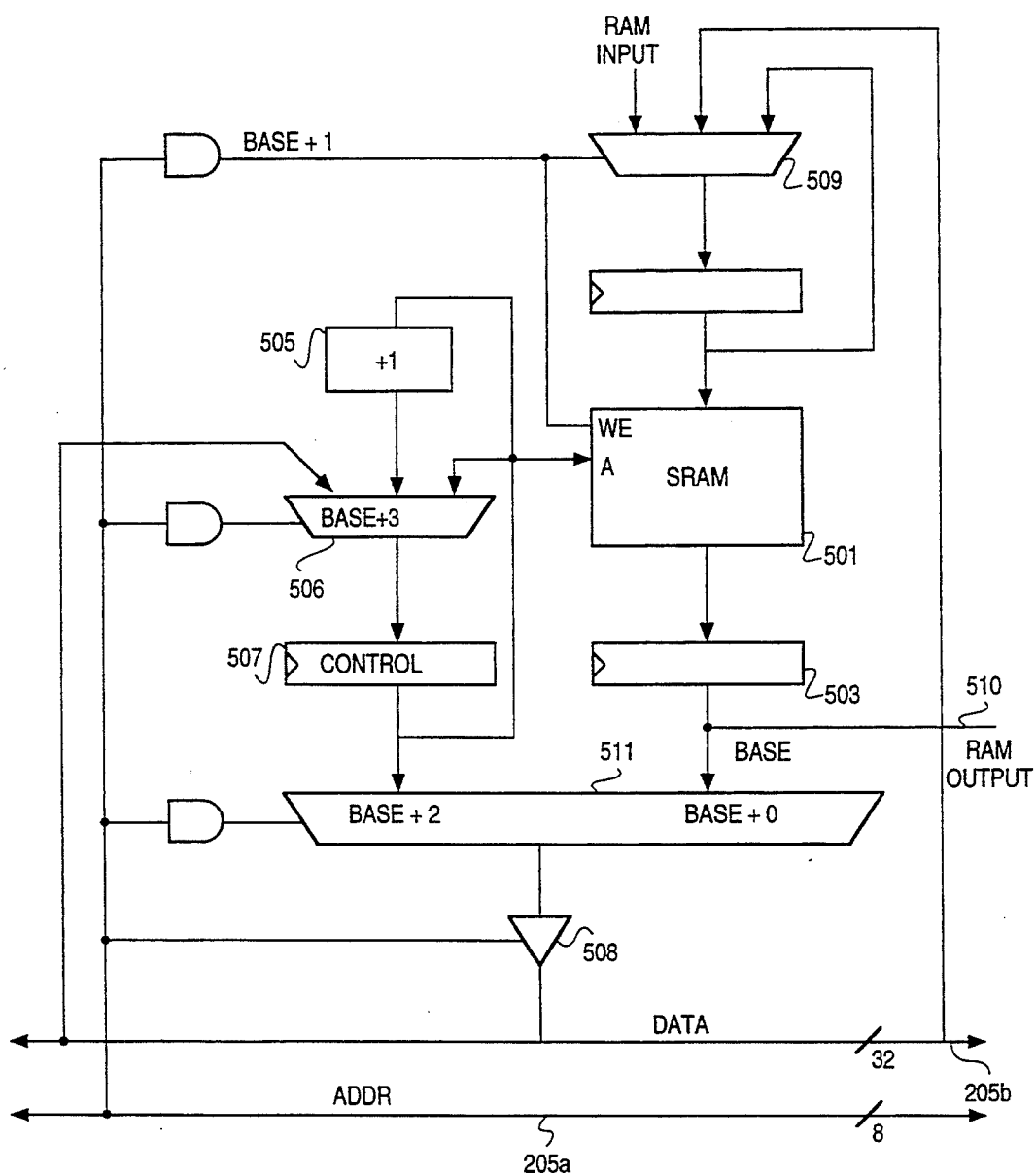
FIG. 5 illustrates movement of data in a coprocessor module having SRAM and a control register to and from external DRAM.

Processor 201 assists the host computers' or the modules' access to the external DRAM. For example, modules, such as decode memory 306 implements part of its first-in first-out memory (FIFO) in static random access memory (SRAM) on-chip, and overflows the FIFO into the external DRAM. The process of moving data into and out of the external DRAM is assisted by processor 201. FIG. 5 illustrates a scheme by which data in the external DRAM are loaded with the assistance of processor 201 into the SRAM 501 in a module having a control register 507. This scheme is illustrative generally of the manner in which processor 201 provides overall control for the coprocessors 202-204. As shown in FIG. 5, a module is assigned a base address, which is the "read data" address for reading data in a specified register in the module or at an SRAM location which address is specified in the control register 507 (placed by a previous "write control" access), a "write data" address (base+1) for writing into a specified data register or an SRAM location specified in the control register, a "write control" address (base+3) for writing into control register 507, and a "read control" address (base+2) for reading the control register 507. In this instance, the control register contains also a field for specifying an SRAM address. The data and control registers are readable and writable on the global bus 205, which comprises global address bus 205a and global data bus 205b. As an example of processor 201 assisting access to external DRAM memory by the module, when a predetermined level of "fullness" in the SRAM part of the FIFO is reached, an interrupt request by the module is sent to processor 201 by setting a bit in the module's control register 507. Processor 201 responds by clearing the module's "run flag" in control register 507. When responding to the interrupt, processor 201 reads and saves the current state of the module's control register. The amount of data to be transferred and the beginning address of the location in SRAM 501 from which data is to be transferred to the external DRAM are then written into control register 507. The memory controller 304 in processor 201 is set up for transferring data to the corresponding locations in the external DRAM. Data are read from SRAM 501 into data register 503, onto the global data bus 205, and then transferred into the external DRAM over memory bus 208 (64-bit wide). As each 32-bit datum is transferred, the data count in control register 507 is decremented and the SRAM address is correspondingly incremented by incrementor circuit 505 after every word transferred. Finally, when the data count reaches zero, processor 201 restores the state of the module's control register 507, with the run flag set.

Processor 201 also includes an arbitration unit (not shown) for allocation of the global bus 205. The global bus 205 can be allocated to one of four "clients": a) completion of load instruction (for storing data read from external DRAM into a destination register or SRAM location); b) the address stage of the instruction unit (for 64-bit "store double"), c) the host bus interface; and d) the execution phase of the instruction unit. Instruction execution is stalled for any host bus cycles and memory access conflict.

Processor 201 spends most of its time executing the task which controls decoding of a macroblock slice (i.e., a group of macroblocks, defined in the MPEG standard). The firmware "slice" which directs the decoding of the macroblock slice is included in Appendix D for reference. This macroblock slice firmware can fit at the same time in the instruction memory 301 with the interrupt firmware. In between the executions of the macroblock slice task, the macroblock slice firmware is swapped out to make room for execution of higher level routines, such as sequence initialization, picture initialization, error handling etc.

ALU 303 comprises input multiplexers, an input complementor, a 32-bit adder and logic unit, and a 32-bit barrel shifter. These circuits are generally known in the art and are therefore not repeated here.

DRAM Controller

DRAM Controller 304 supports both HDTV ("High Definition TV") and non-HDTV modes. Non-HDTV includes support for "enhanced definition TV" (EDTV). Under the non-HDTV mode, the memory controller 304 supports three banks of DRAM directly, providing the conventional DRAM control signals RAS (row address strobe), CAS (column address strobe) and WE (write enable). Under HDTV mode, the RAS signal is generated by an external circuit. DRAM controller 304 also provides refresh cycles. DRAM controller 304 comprises the functional units "dgms" (state machine), "dgma" (address block), "dgmr" (refresh block) and "dgmc" (control logic block). Models of these functional units are included in Appendix C for reference. These models are expressed in the VERILOG © language for which commercially available circuit generators exist in the art to automatically generate circuit implementations from such models. VERILOG © is a trademark of Cadence Design Systems, San Jose, Calif.

The external DRAM memory houses the rate buffer (also called the "code buffer"), reference frames and the current frame decoded. The code buffer is a FIFO ring that holds compressed data before decoding. An intra-coded frame typically uses 3 to 17 times more data than predicted or interpolated frames. Therefore, if compressed data are arriving at a constant rate, the rate buffer accumulates data when predicted or interpolated frames are decoded, and depletes data when intra coded frames are decoded.

To implement the MPEG standard, the present embodiment holds two reference frames in the external DRAM. The DRAM may also hold all or part of the frame currently being decoded. If each macroblock can be output after it is processed, such as when an external frame buffer exists, then the current frame need not be stored. In another instance, when a line of pixel is displayed as soon as it is decoded, and displayed only once, then the DRAM need only hold two rows of macroblocks. However, up to a full frame of storage is required when the input code is not interlaced and the output signal is interlaced. Non-HDTV Mode The present embodiment supports 256K×16-bit, 256K×4-bit or 64K×16-bit DRAM chips using different pin connections to the row and column address inputs of these chips. Table 1 shows the pin connections for these supported DRAM chips. Regardless of the particular chips used in the external DRAM, the external DRAM can be viewed as a byte-addressable memory having a 24-bit address space (E[23:0]). In the embodiment shown in FIG. 3, under non-HDTV mode, each memory word is 64-bit wide, allowing the memory to be organized as 256K×64-bit or 64K×64-bit. In the 256K×64-bit configuration, bits E[22:21] select one of the three memory banks, and bits E[20:3] are provided as row and column addresses in accordance with the chips used in the implementation of the external DRAM (see Table 1). In the 64K×64-bit configuration, bits E[22:19] select the memory bank, and bits E[18:3] selects the row and column addresses.

TABLE 1

| maddr outputs | 9 | 8 | 7 | 6 | 5 | 4 | 0L/0H | 3 | 2 | 1 |
|---|---|---|---|---|---|---|---|---|---|---|
| address bits output as column address | 10 | 11 | 10 | 9 | 8 | 7 | 6 | 5 | 4 | 3 |
| address bits output as row address | 11 | 20 | 19 | 18 | 17 | 16 | 15 | | 14 | 13 | 12 |
| bits used for 256K×4 column address | | C | C | C | C | C | C | | C | C | C |
| bits used for 256K×4 row address | | R | R | R | R | R | R | | R | R | R |
| bits used for 256K×16 column address | | | C | C | C | C | C | | C | C | C |
| bits used for 256K×16 row address | R | R | R | R | R | R | R | | R | R | R |
| bits used for 64K×16 column address | C | | C | C | C | C | | | C | C | C |
| bits used for 64K×16 row address | R | | R | R | R | R | | | R | R | R |

Figure 6:
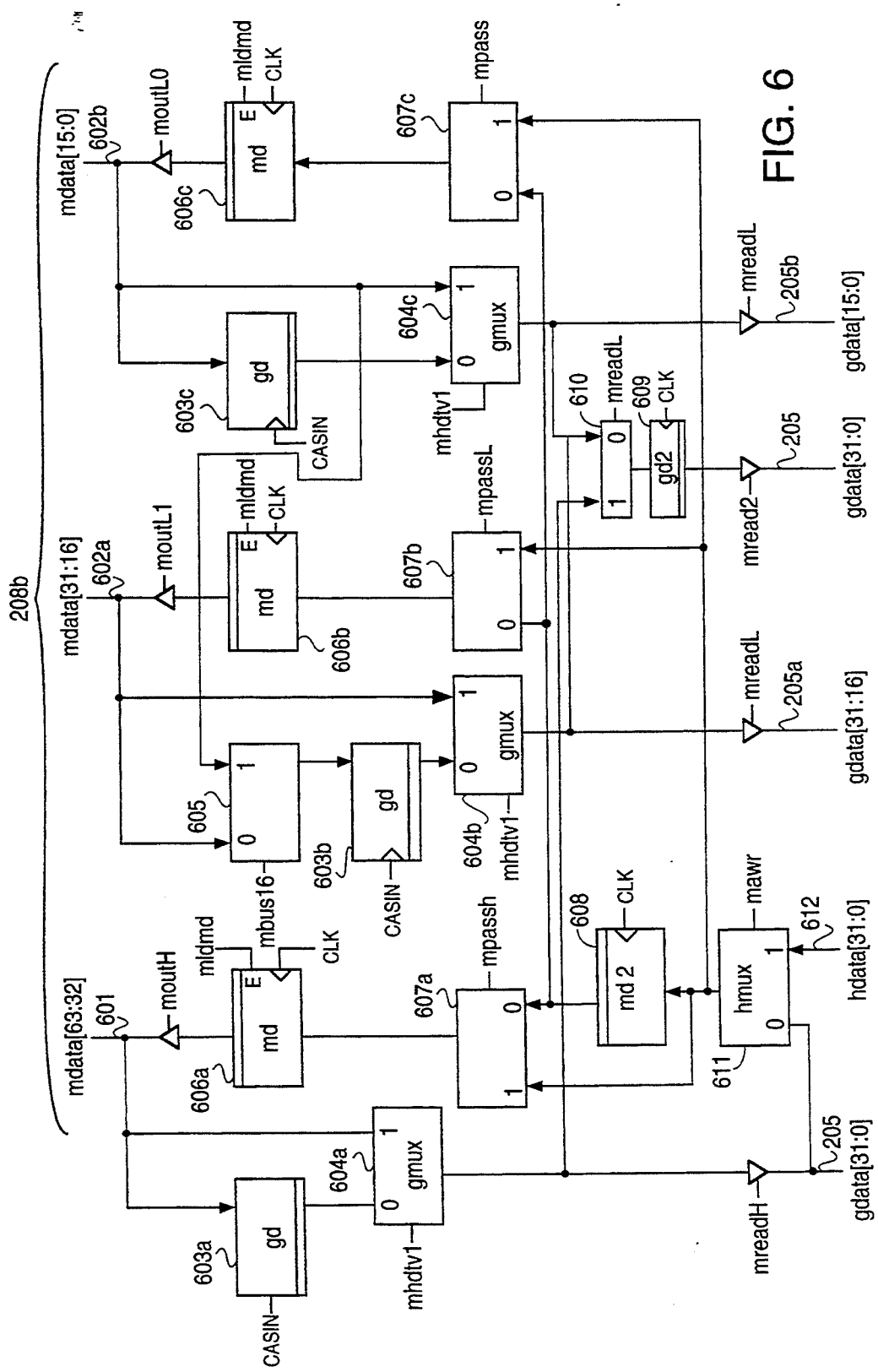
FIG. 6 shows the interface between the global bus 205 and the memory data bus 208b in the memory controller 304 of FIG. 3.

FIG. 6 is a schematic diagram of the global bus and memory bus interface unit 304b of the present embodiment. As shown in FIG. 6, the memory data bus 208b comprises two 32-bit busses mdata[63:32] (bus 601) and mdata[31:0] (bus 602, comprising busses 602a and 602b), respectively referred to as the "higher" and the "lower" 32-bit busses. The lower 32-bit bus can be further divided into two 16-bit busses for 16-bit operations. Registers 603a, 603b and 603c latch the 64-bit data from the external DRAM on bus 208b (busses 601 and 602) for loading onto the 32-bit global bus 205. In the other direction of data flow, registers 606a, 606b and 606c latch the 32-bit data from the global bus 205 to the 64-bit memory data bus 208b.

Because 64-bit data arrive from the global bus 205 over two clock periods, the first (higher) 32 bits are temporarily stored in register 608. These 32 bits are then written at the same time with the lower 32 bits into respectively the registers 606a, 606b and 606c for simultaneous output on memory bus 208b. Multiplexers 607a, 607b and 607c can be used to bypass register 608 and to channel a 32-bit datum from the host data bus 612 (through multiplexor 611) to either the high 32-bit or the low 32-bit of the memory data bus 208b. Since each datum from the external DRAM on bus 208b is 64-bit wide and the global bus 205 is 32-bit wide, the 64-bit datum is first loaded into the registers 603a, 603b and 603c, when the "data ready" signal MCASIN is received. The higher 32-bit datum in register 603a is sent to the global bus 205, while the 32-bit datum in registers 603b and 603c is temporarily stored in register 609 for output to global bus 205 in the next clock period. Storing the lower 32-bit datum in register 609 instead of letting it remain in registers 603b and 603c is necessary to avoid it being overwritten by the next datum arriving on busses 602a and 602b in the next clock period, in the event when the signal MCASIN is received during the same clock period as the corresponding "column address strobe" signal (MCAS) is sent, when operating in burst mode during which memory read requests are sent every other clock period.

Figure 7A:
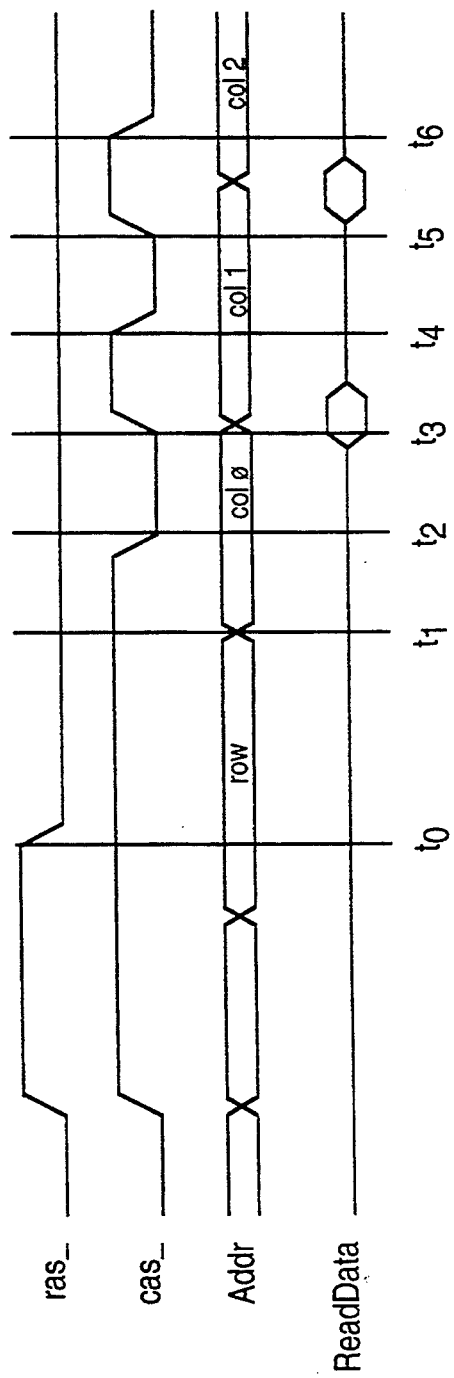
FIG. 7a shows the control and data signals of a page mode access to a conventional dynamic random access memory.

In order to initiate a memory request every other clock period, page access mode is used. FIG. 7a shows the data and control signals for the conventional page access mode. As shown in FIG. 7a, the RAS signal goes to logic low state at time t0, indicating that row address is ready. The CAS signal then goes to logic low state at time t2 indicating the column strobe address is ready. The initial read access is completed at time t3 when the data read (represented by the signal "ReadData") arrive from the DRAM. Under page mode, the second read after the initial access can begin at time t3 by bringing CAS high again and providing only the column address, while the RAS signal remains low. Thereafter, the second read access is completed at time t5, when the second datum arrives from the DRAM. The third read access can likewise be initiated by bring CAS to logic high state again at time t5.

Since most commercially available DRAM components require unequal hold times of "CAS low" and "CAS high" (e.g., for some 80 ns DRAMs with minimum page mode cycles of 55 ns, the minimum hold times for CAS low and CAS high are respectively 10 ns and 30 ns), a convenient timing scheme for implementing the page mode access of FIG. 7a is by synchronizing the rising and falling edges of the CAS signal with the global clock, so that, in the first clock period, the CAS signal is high during the time when the global clock is high, and changing state to CAS low when the clock changes to low state. In the next clock period, CAS remains low. For a 45-55 duty cycle clock, this timing scheme requires that 1.55 clock periods must be long enough to satisfy the CAS low hold time requirement, and 0.45 clock period must be long enough to satisfy the CAS high time requirement. Under this scheme, for CAS high hold time, the margin allowed for timing variation due to fluctuations in the manufacturing process is very small. For example, if the timing scheme described above is used in the present embodiment, which has a 45-55 duty cycle global clock of 36 MHz (27.8 ns per clock period), the CAS high time for the 80 ns DRAM above is not met. This is because the global clock has a logic high period for only 12.5 ns, and the transition times for the CAS signal can be greater than 2.5 ns, leaving less than 10 ns to satisfy the CAS high hold time requirement. One solution will be to extend the global clock period in order to meet the CAS high hold time requirement. This method is very wasteful.

Figure 7B:
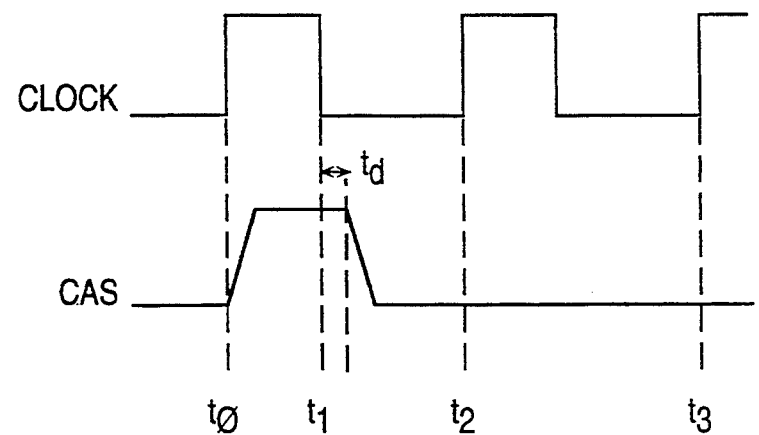
FIG. 7b shows the delayed CAS falling edge to meet CAS high requirement, in accordance with the present invention.
Figure 7C:
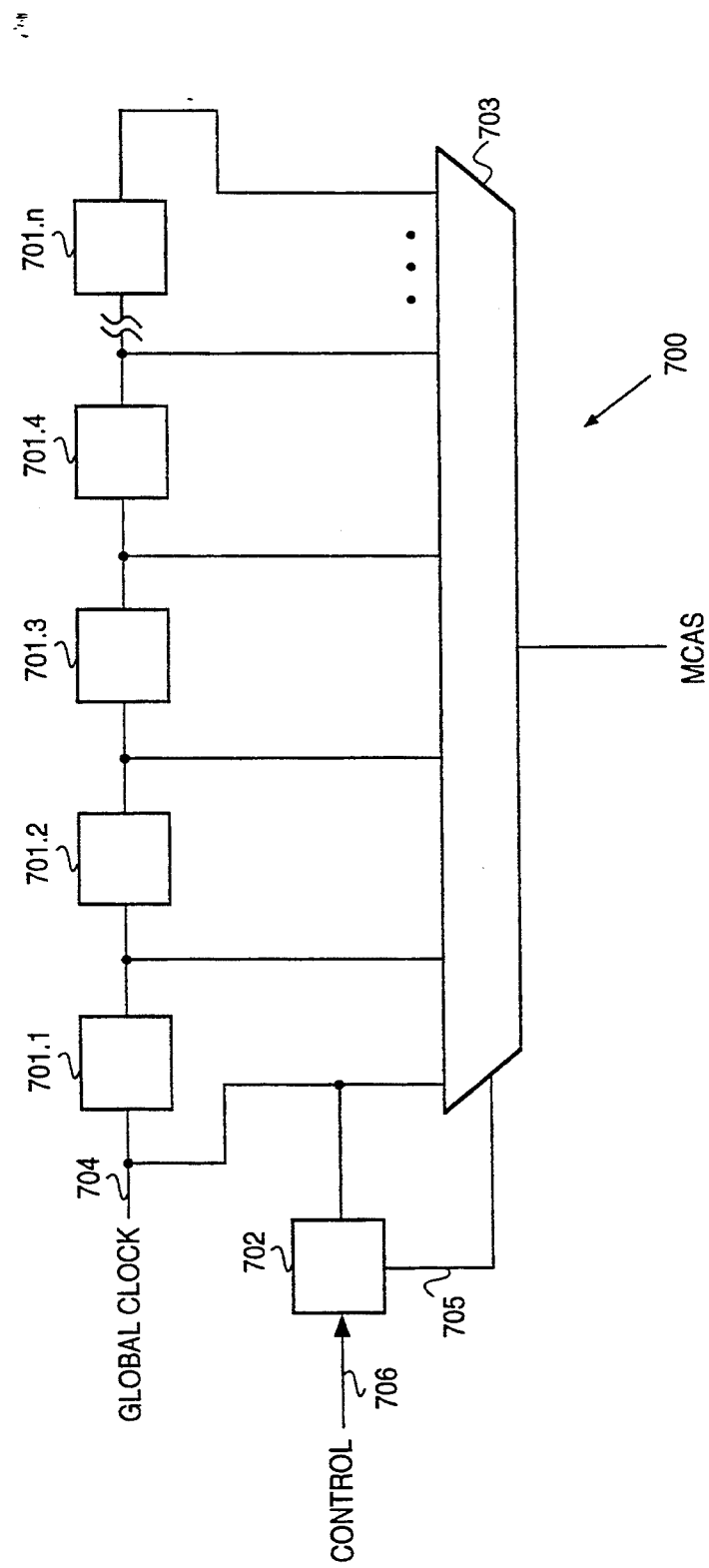
FIG. 7c is a schematic diagram of a circuit 700 to implement the delayed CAS signal in accordance with the present invention.

Noting that there is a margin in the CAS low time (e.g. in the 80ns DRAM discussed above, the minimum CAS high time is 30 ns, and 1.55 clock period is 40.3 ns), the above CAS high hold time problem can be overcome by delaying the high to low transition of the CAS signal without requiring a longer global clock period. FIG. 7b shows the CAS signal being delayed by a time period td after the global clock assumes a logic low state at t1 in the first Clock period (between t0 and t2). The delayed CAS signal can be generated by the circuit 700 shown in FIG. 7c. In FIG. 7c, the global clock signal is provided on lead 704, which is fed into a number of serially connected delay elements 701.1 to 701.n. Edge detector 702 detects, when the global clock transitions, whether the transition is a logic high to logic low or a logic low to logic high transition. When the edge detector 702 detects a logic low to logic high transition, a control signal is sent over lead(s) 705 to set multiplexer 703 to select the clock signal; otherwise, the control signal on lead(s) 705 sets multiplexer 703 to select one of the delayed output signals of delay elements 701.1 to 701.n. The control signal in lead 705 select the amount of delay according to a user parameter. The CAS signal is held to logic low during the next clock period. While other circuit elements can be used, in the present implementation, each delay element is a 3-input NOR gate.

Figure 8A:
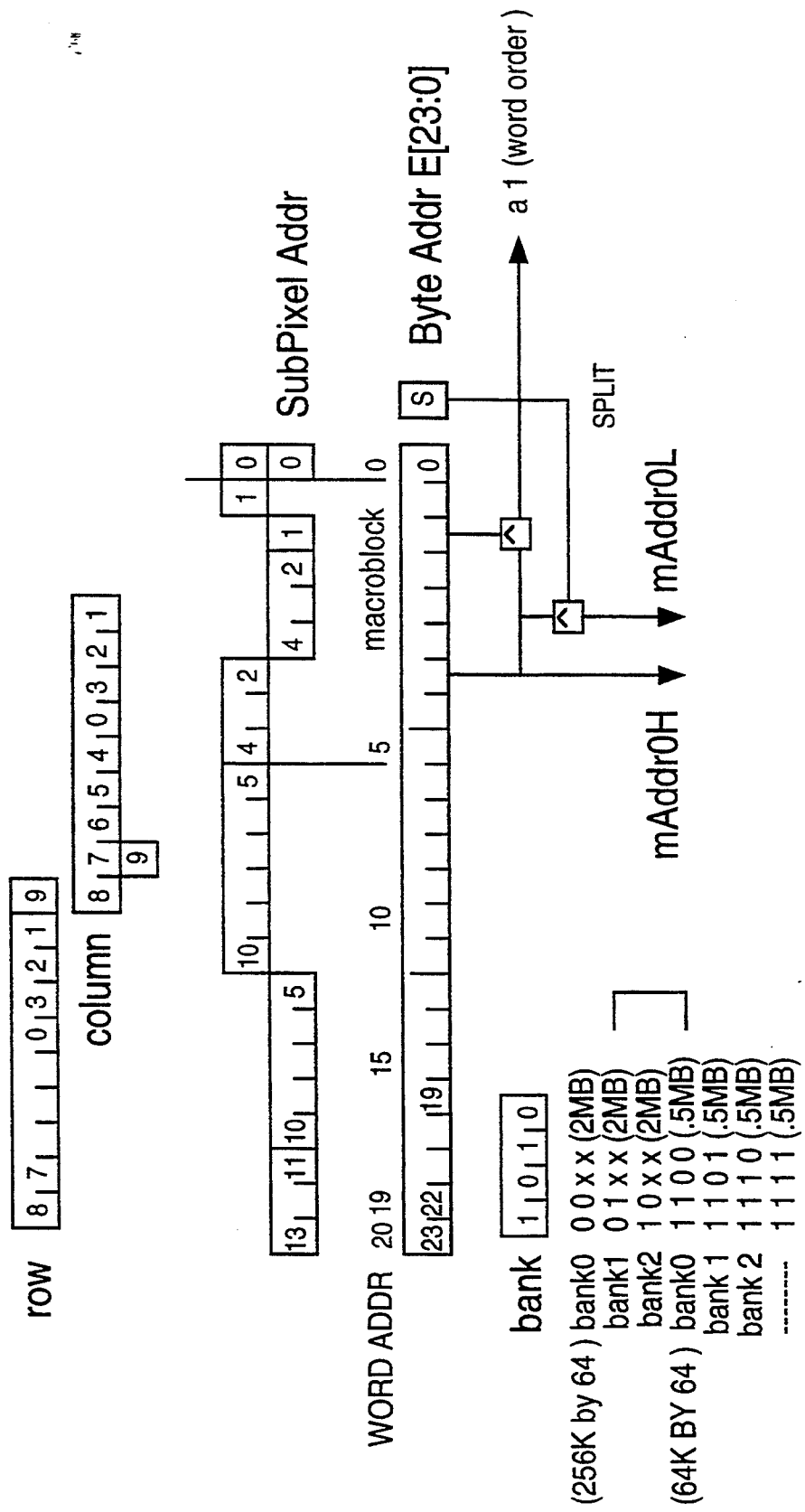
FIG. 8a show the mapping of the 2-dimensional display space to the 24-bit linear address space of the external DRAM.
Figure 8C:
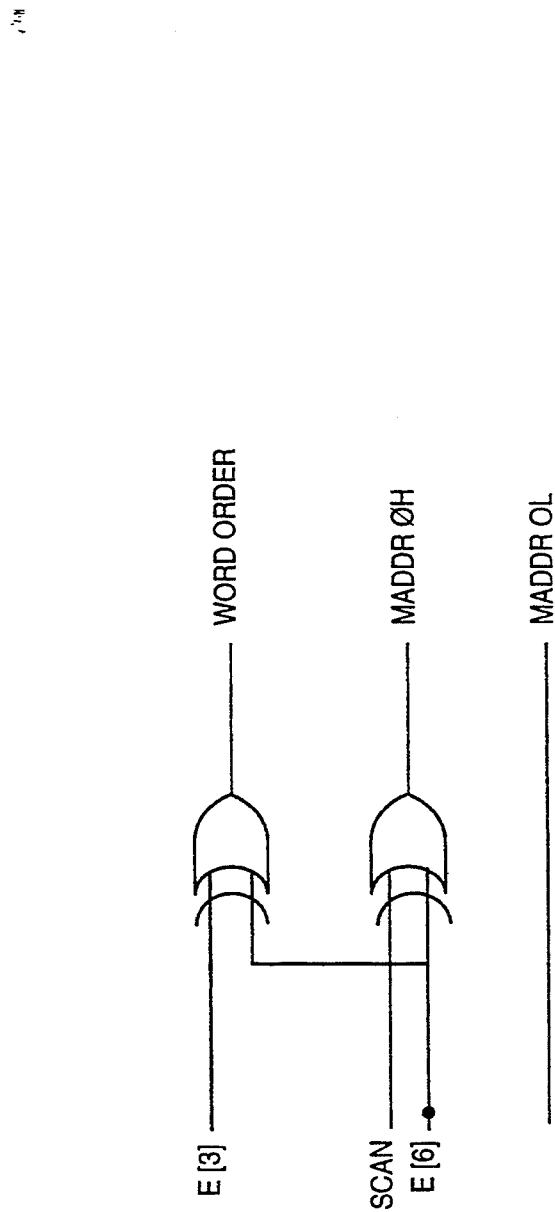
FIG. 8c is a logic circuit which implements the control logic for bit E[6] in the byte address, so as to allow accessing memory in the quad pixel mode or in scan mode.

The 2-dimensional space of a display is mapped into the 24-bit linear address space. One such mapping from screen space to the DRAM address space is shown in FIG. 8a. Since luminance and chrominance data of two pixels adjacent each other in the vertical direction can be represented in 32 bits (YYUV) for both the 4:2:2 and the 4:2:0 formats, two pixels can be stored in a 32-bit half-word in the present embodiment. In the present embodiment, the 24-bit address space is used to represent a 2-dimensional screen space of $2^{10}$ (X) by $2^{13}$ (Y)-pixel picture area. FIG. 8a shows a mapping of the 2-dimensional screen space to the byte address space E[23:0] of the DRAM. As shown in FIG. 8a, the Y vector Y[13:0] can be represented by E[23:15,5:2,0] and the X vector X[10:0] can be represented by E[14:6,1,0]. Bit E[0] can be used to represent sub-pixel space, if necessary. This representation allows the bits E[8:1] to represent the a 2-dimensional space inside the macroblock, with bits E[8:6,1] and bits E[5:2] as the x and y vectors respectively. In this macroblock space, the address (E[8:6], E[5:3]) specifies one of the 64 quad pels, with bits (E[1], E[2]) specifying one of the four pixels in the quad pel.

In this embodiment, the address generation unit 304a of the memory controller 304 receives from processor 201 the byte address E[23:0]. As shown in Table 1 above, the bits of the memory address bus 208b (maddr[9:1], maddr0H, maddr0L) are given by (E[11], E[20:16], E[14:12], E[15], E[15]) for providing the row address, and (E[10], E[11:7], E[6:3], E[6], E[6]) for providing the column address. The pixels are stored in the DRAM at byte addresses shown in FIG. 8b. When a "load double" (LDDA) instruction is executed, four pixels in a 64-bit word are fetched from the DRAM memory. In the present embodiment, two modes of pixel access are allowed. Depending on whether "quad pixel" or "scan" mode is selected, these four pixels correspond either to a quad pixel (2×2), or four pixels in the same horizontal scan line ("scan order"). To allow such access, quad pixels must be stored into the DRAM over the memory data bus 208b in accordance with the following rule:

| address(E[6:3]) | mdata[63:32] | mdata[31:0] |
| --- | --- | --- |
| 0XXX | UT VT YT YT | UB VB YB YB |
| 1XXX | UB VB YB YB | UT VT YT YT | where "T" denotes data corresponding to the top two pixels of the quad pixel, and "B" denote that the data corresponding to the bottom two pixels of the quad pixel. Storing top and bottom pixels alternately according to the parity of bit E[6] (i.e., changing the top and bottom pixel store order every 8 column addresses) allows fetching either four top or four bottom pixels (i.e., four pixels on the same horizontal line) simultaneously. This ability to fetch pixels in scan order is efficient in providing pixels to the video memory 318 for output. On the other hand, the ability to fetch pixel in quad pixel order facilitates the resampling step in motion compensation (see below).

To fetch a quad pixel, the maddr0H and maddr0L are each given the value of E[6], so that the word address (i.e., E[23:3]) of the higher 32-bit halfword fetched in mdata[63:31] is the same as the word address of the lower 32-bit halfword of fetched in mdata[31:0]. However, when fetching in the scan mode, the following rule is followed when providing the word column address to the external DRAM:

|  | maddr0H | maddr0L |
| --- | --- | --- |
| even scans (i.e., E[6]=0) | 0 | 1 |
| odd scans (i.e., E[6]=1) | 1 | 0 |

Recalling that the column word address for the higher 32-bit halfword fetched by mdata[63:32] is specified by (maddr[9:4], maddr0H, maddr[3:1]) and the column word address for the lower 32-bit halfword fetched in mdata[31:0] is specified by (maddr[9:4], maddr0L, maddr[3:1]), the column word addresses of the higher 32-bit and lower 32-bit of mdata[63:0] are offset by 8 column word addresses under scan mode access. Because there are eight quad pixels in each column, the pixels fetched under scan mode are in adjacent quad pixels. Since the pixels are stored accordance to parity of E[6], as specified above, the pixels fetched are either both the top pixels of each quad pixel, or both bottom pixels of each quad pixel.

In this embodiment, a separate logic circuit is provided to decode bit E[6] of the DRAM address. One implementation is provided in FIG. 8d. In FIG. 8d, the signal "scan" is at logic high for scan mode and at logic low for quad pixel mode, and the signal "word order" indicates in quad pixel mode whether the top pixels are found in the higher 32-bit halfword (word order=0) or the lower 32-bit halfword (word order=1) of the memory data bus mdata[63:0].

HDTV Mode

Figure 9A:
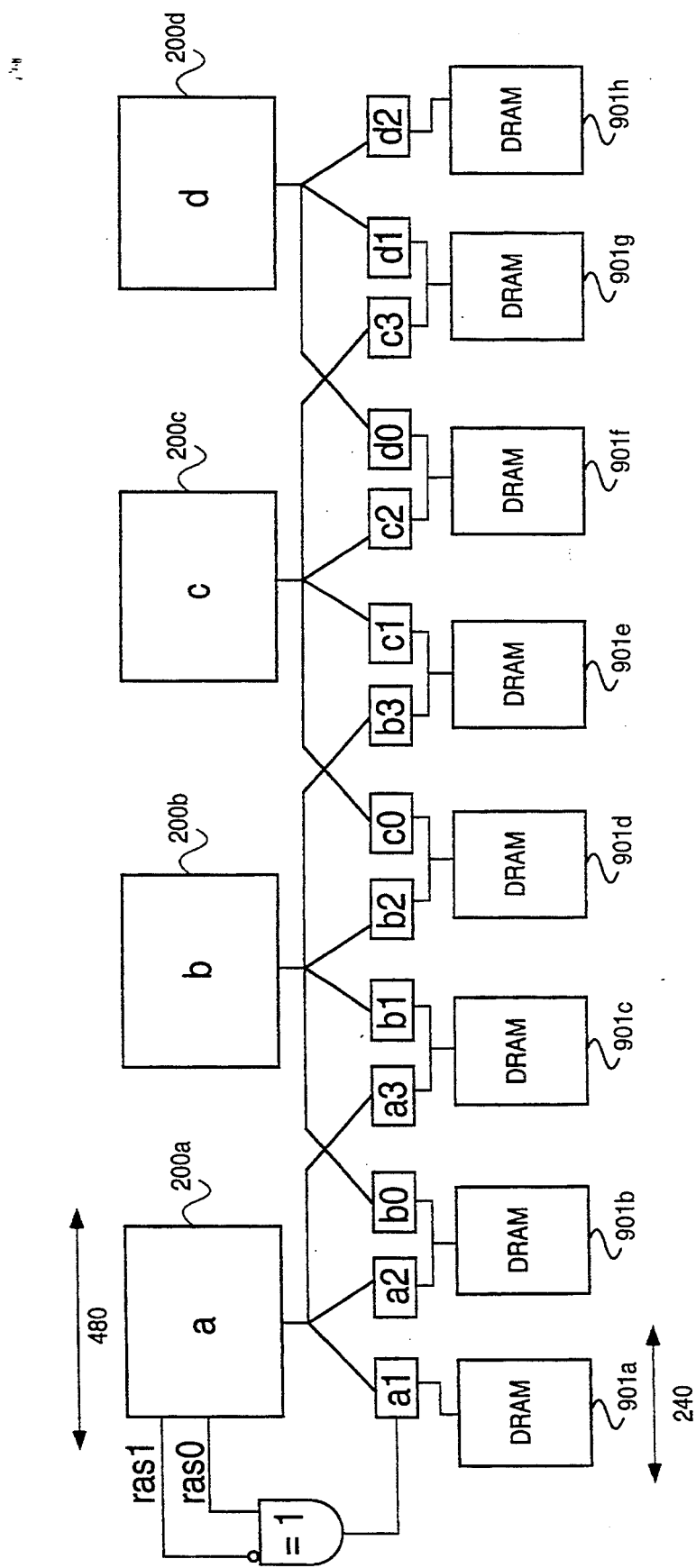
FIG. 9a shows the display space seen by one of four video decompression circuits under HDTV mode in accordance with the present invention.

HDTV applications are supported in accordance with the present invention by configuring, as shown in FIG. 9a, four of the video decompression circuit 200 of FIG. 2. In FIG. 9a, four of the video compression circuit 200, 200a–200d, are provided with eight memory banks 901a–901h. Video compression circuits 200a–200d each communicate with two banks of memory, in addition to one memory bank from each of its left and right neighbors, if any. In HDTV, the display space is 1920×1080 pixels.

Figures 1, 9B:
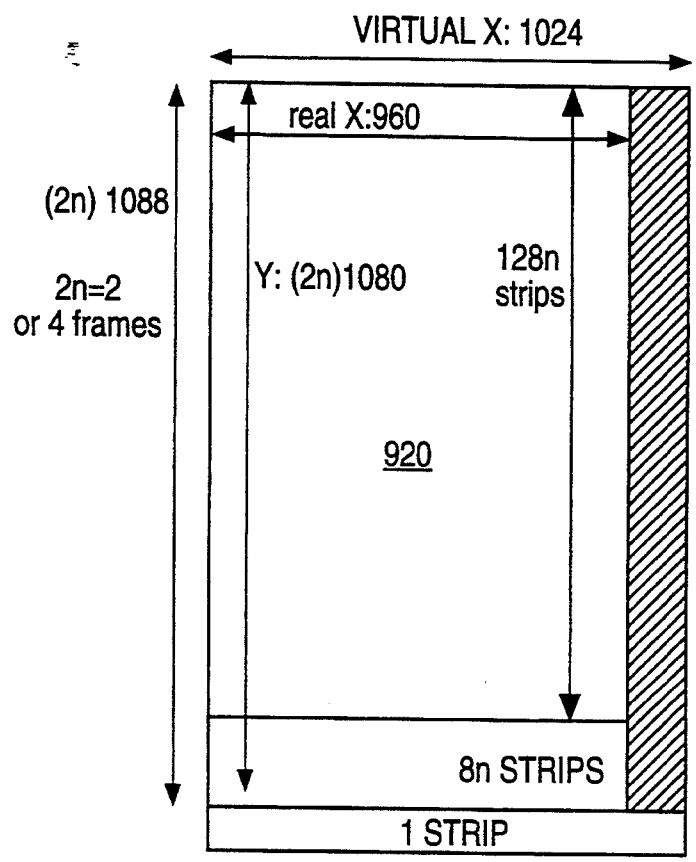
FIG. 9b shows both the display space and the linear physical address space under HDTV mode.
Figures 2, 9B:
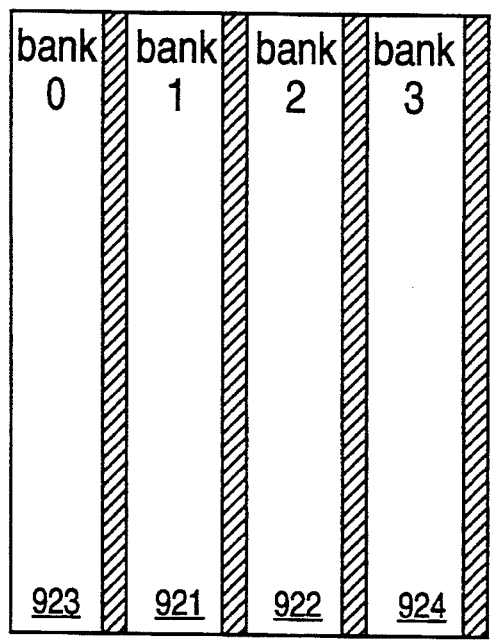

In the present embodiment, the HDTV display space is divided into four vertical sections of 480 by 1080 pixels, with each section contained in two banks of memory. FIG. 9b shows the display space 920 for one of the four video decompression circuit 200a–d. As shown in FIG. 9b, the display space seen by each of the four video decompression circuits 200a–d is a display area of 960×1080 pixels, in which the middle 480×960-pixel picture area is stored in the video decompression circuit's own memory banks 921 and 922, and the two 240×480-pixel picture areas on each side of the middle 480 by ×1080-pixel picture area are stored in the memory banks 923 and 924 of its neighbors to the left and to the right respectively. Video compression circuits 200a and 200d (FIG. 9a) each have a 240×1080-pixel picture area not mapped to the display space, since video compression circuit 200a and 200d each have only one neighbor. Access to a neighbor's memory bank is necessary only when motion compensation requires access across the boundaries of the vertical sections. Because motion vectors are of limited range, the problem arising from the same bank of memory being accessed by more than one video compression circuit can be avoided by requiring that the video decompression circuits 200a–d decode the vertical sections in lock-step. Such synchronization can be provided by tying the VSYNC pin of the video decompression circuits 200a–d together.

Figure 9C:
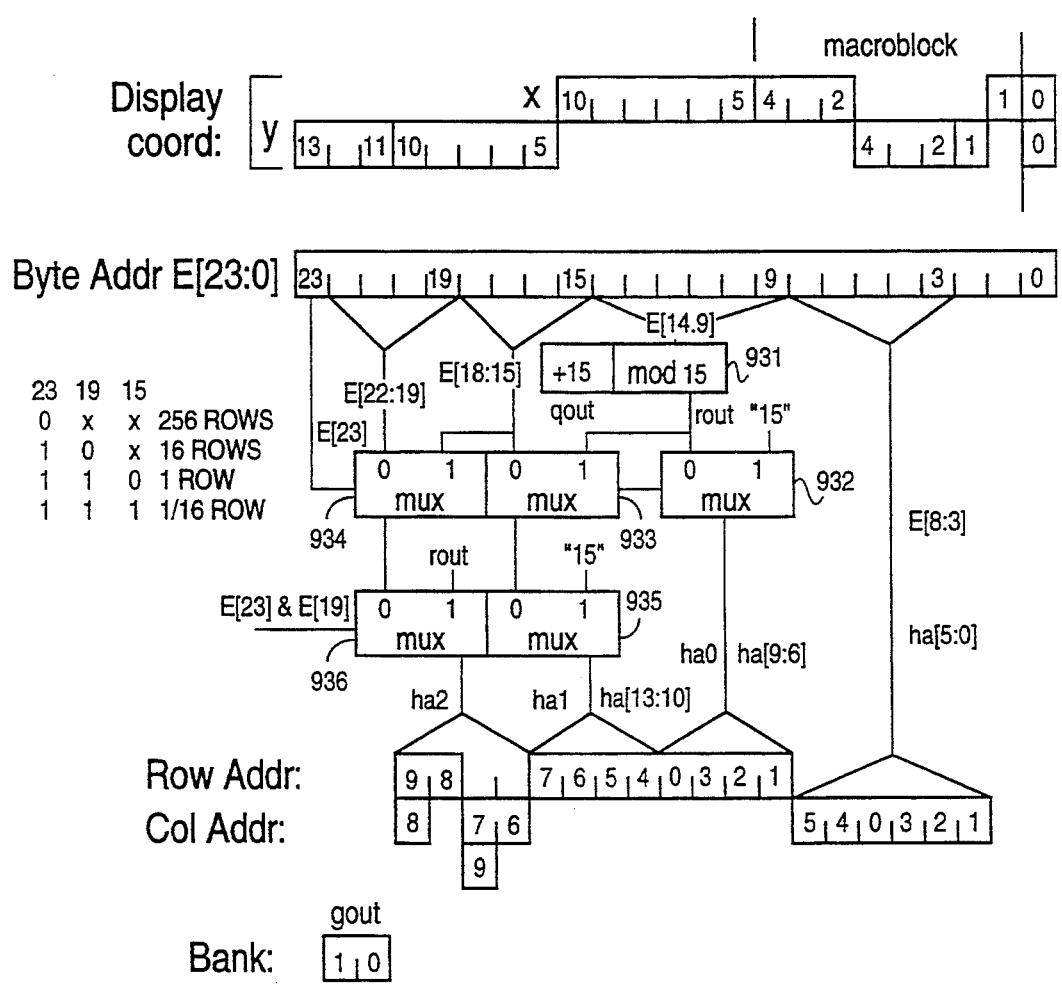
FIG. 9c is a functional block diagram of a circuit which implements the mapping of DRAM byte address to the linear physical address space.
Figure 9D:
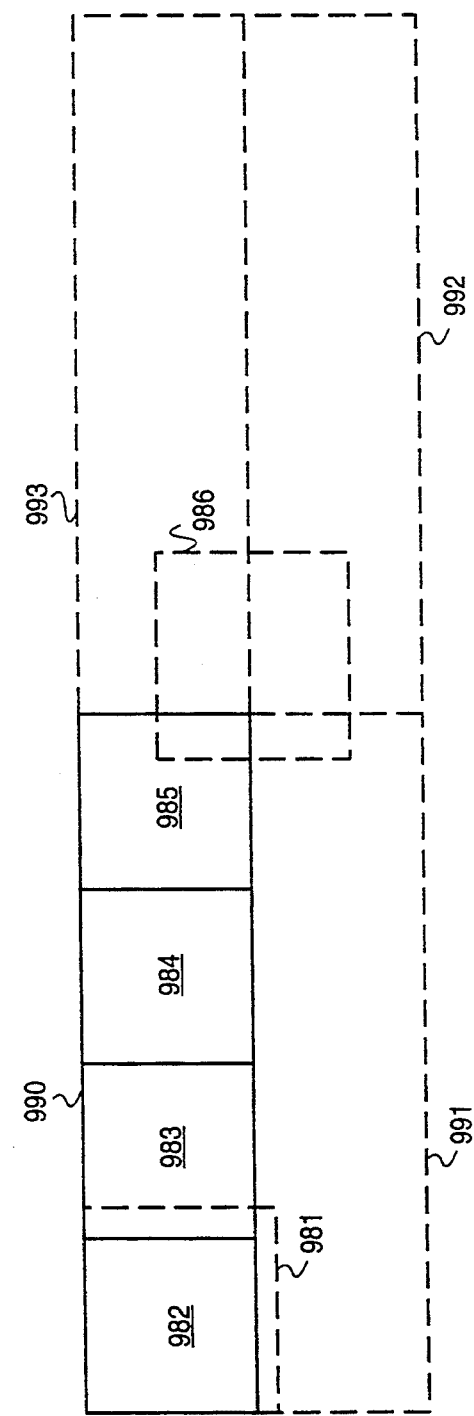
FIG. 9d shows that the operation of fetching reference macroblocks 981 and 986 requires crossing one and four DRAM page boundaries respectively.

Further, since a reference macroblock needs to fetch an 18×18-pixel picture area, and four 8×8-quad pixel macroblocks are typically stored in one page of DRAM memory, dependent upon the position of the reference macroblock, a macroblock fetch can cross 1-4 DRAM paper boundaries. FIG. 9d illustrates the number of DRAM page boundary crossings for two reference blocks 981 and 986. In FIG. 9d, the reference macroblock 981 spans two DRAM pages 990 and 991. DRAM page 990 stores four 8×8-quad pixel picture areas 982–985. Fetching this reference block 981 requires crossing the DRAM page boundary between DRAM pages 990 and 991. However, reference block 986 spans four DRAM pages 990, 991, 992 and 993 requiring four crossings of DRAM page boundaries to complete a fetch operation of the entire reference macroblock 986.

Therefore, in accordance with the present invention, in order to maintain the lock-step relationship amongst each video decompression circuits 200a–200d, each page mode access is limited to fetching only an 8×8 quad pixel picture area, so that regardless of the number of DRAM page boundaries required to be crossed, four page mode access cycles are required for each reference block fetched. In this manner, since the number of pixels processed by each video decompression circuit 200a–d are the same, the lock-step relationship is always maintained.

Under the HDTV mode, the mapping of DRAM byte addresses onto the linear physical address space is different from the mapping under non-HDTV mode described above. Since the size of the each vertical section is not a power of 2 in the x-dimension and each section is separately processed by up to three video compression circuits, a straightforward mapping of byte address space to the linear physical address space, such as that used in the non-HDTV mode (physical addresses obtained by rearranging the bit pattern of the DRAM byte address E[23:0]), will lead to inefficiency. For example, such allocation of the display space leads to video compression circuits 200a–c each processing a picture area of 256 pixels ×1080 pixels, and video compression circuit 200d processing a 192×1080-pixel picture area. Coupled with the requirement that video decompression circuits 200a–d decode in lockstep, the speed of decompression under HDTV mode will be degraded because the uneven distribution of load leads to frequent wait cycles. Therefore, a mapping is desired such that the load on each video compression circuit 200, and hence its associated memory banks also, are balanced.

In accordance with the present invention, a mapping scheme from the DRAM byte address space to the physical address space is adopted which equally divides the display space among the video decompression circuit 200a–d. In addition, the mapping leaves very few locations in the linear physical address space which do not correspond to a pixel in the display space. The present invention minimizes such gaps in the linear physical address space with some added complexity. Nevertheless, eliminating the waste due to having memory locations never accessed is desirable. FIG. 9c shows in block diagram form this mapping of the DRAM byte address space E[23:0] to the physical memory address space.

Under the scheme of the present invention, bits E[23:3] of the DRAM byte address E[23:0] are mapped into the row and column addresses of the linear physical address space. The display address space (X, Y vectors) are also provided in FIG. 9c for reference. The linear physical address space is assumed to be specified by the bank b[1:0], row[9:0] and column col[9:0] addresses. As in the non-HDTV mode, dependent upon the type of DRAM type chosen, not all of these bits are connected. Bits E[8:3], which correspond to the addresses of quad pixels within a macroblock, are provided directly to the column address bits Col[5:0]. Bits E[14:9], which specify the macroblock in the "strip" specified by the X vector (a "strip" is a one macroblock-high picture area spanning the horizontal extent of the display space), are mapped into one of the 60 macroblocks in the four memory banks accessible by the video decompression circuit. This mapping is performed by a divider represented by block 931, dividing the value of E[14:9] by 15, so that the remainder via a multiplexer 932 is provided as the row address bits row[3:0], and the quotient is provided as the bank address bits b[1:0]. This method allows the elements of the macroblock to be stored at the same row address in the same memory bank, thereby allowing page mode access to the elements of the macroblock. Also, the division result only affects the row and bank portions of the DRAM address and does not affect the column address. As a result, the extra computation time required to perform the division is not critical to affect fast page mode access.

Since the division scheme above generates a remainder between 0 and 14 inclusive, a value of 15 ('FH) in bits row[3:0] cannot be generated, and so leaving a gap in the physical address space. In accordance with the present invention, such gaps are filled by mapping into them the macroblock strips corresponding to higher Y vectors. In the 1024 lines (Y<=1024) counting from the top of the display space, the value of the bit E[23] is zero, the bits E[22:15] are respectively provided via multiplexers 933-936 as the value in bits (row[9:8], col[7:6], row[7:4]). However, if the bit E[23] equals 1 and E[19]=0, corresponding to a Y vector between 1024 and 1088, a value 15 is forced by multiplexer 932 into row[4:0] and the remainder rout provided by divider 931 is provided by multiplexers 933 and 935 as row address row[7:4], and bits E[18:15] are provided via multiplexers 934 and 936 respectively as the bits (row[9:8], col[7:6]). Hence, the bits E[22:19] are now mapped into the gap represented by value 15 in row[3:0] of the physical address space.

This approach is taken one step further when bits E[23] and E[19] are both 1. In that situation, values of 15 are forced by multiplexers 932 and 935 into both row address bits row[7:4] and row[3:0], and the value of DRAM byte address bits E[18:15] is provided via multiplexers 934 adn 936 respectively to the bits (row[9:8] and col[7:6]), mapping these DRAM byte addresses into the gap corresponding to a value 'FFH in row[7:0] of the physical address.

Figure 9E:
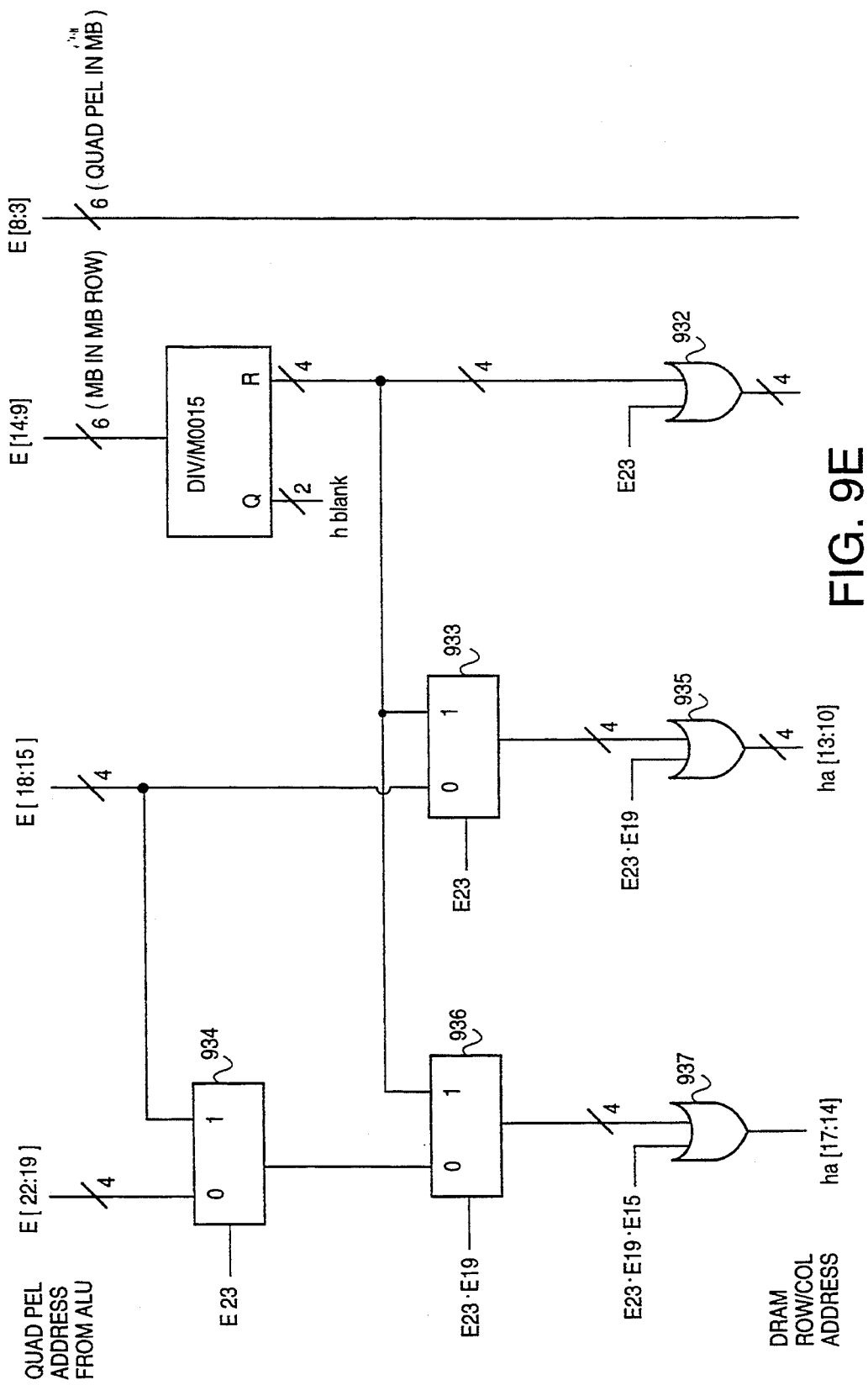
FIG. 9e shows a circuit implementation of the mapping scheme shown in FIG. 9c.

FIG. 9e is a circuit for implementing the mapping mechanism described above in conjunction with the block diagram of FIG. 9c. The corresponding structures in FIGS. 9c and 9e are given the same reference numerals. Note that multiplexers 932 and 935 are implemented by OR-gates in FIG. 9e. This is because when the control (e.g. bit E[23] in multiplexer/OR-gate 932) is 1, the output bits desired are all 1's. In addition, the concept illustrated by FIG. 9c is taken even one step further in OR-gate 937, corresponding to the situation when E[23], E[19] and E[18] are all 1's. OR-gate 937 provides mapping into a further 1/16 of a row of memory.

Figure 9F:
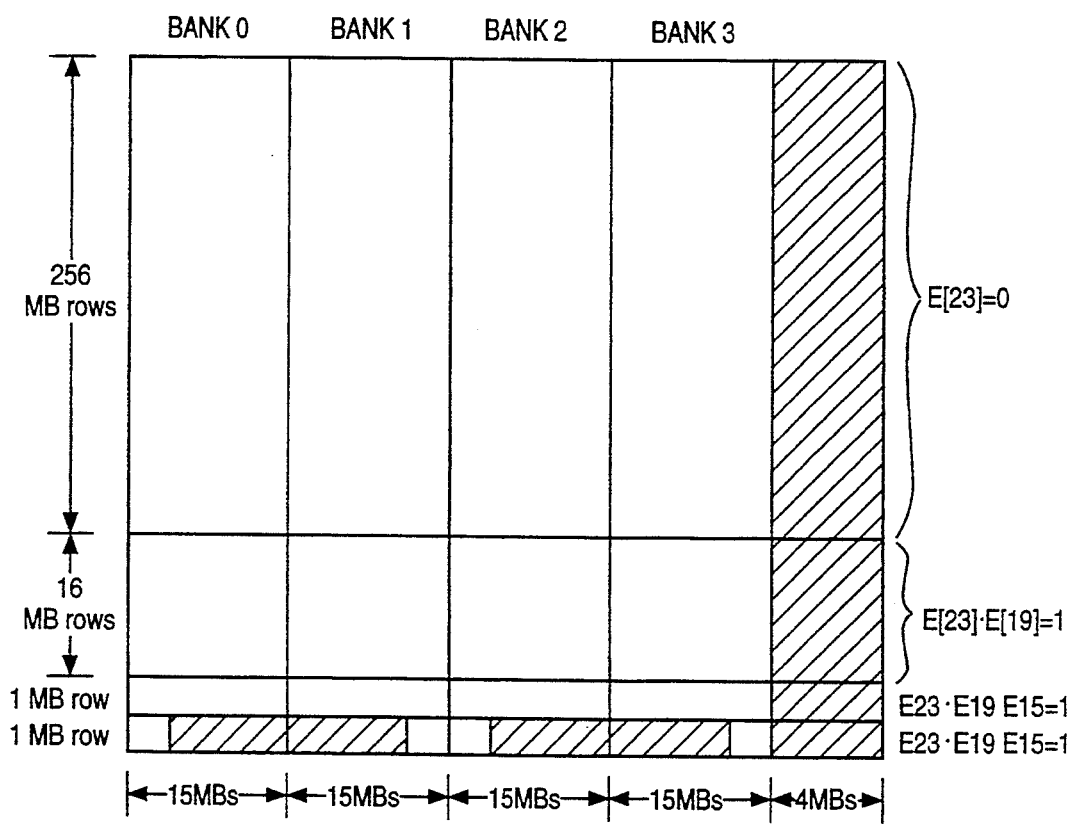
FIG. 9f shows the mapping of the DRAM byte address space into the physical DRAM address space under HDTV mode.

FIG. 9f shows in the shaded areas the mapping E[23:0] to the physical address space for Y vectors having a value at and above 1024, as described above.

Hence, the 1920 pixels × 1080 pixels address space is mapped into a 8 banks of 256K ×64 physical address space. Each processor maps 960×1080 pixels into 4 banks of 256K by 64-bit memory.

Decoder Coprocessor 202

Referring back to FIG. 3, the decoder 202 comprises the code memory 305, decode memory 306, decode logic 307, zigzag logic unit 308, zigzag memory 309, quantizer unit 311 and quantizer memory 310. The zig—zag logic unit 308, zig—zag memory 309, quantizer unit 311 and quantizer memory 310 can be implemented by the structures disclosed in either of the following copending applications: a) U.S. patent application entitled "System for Compression and Decompression of Video Data using Discrete Cosine Transform and Coding Techniques,"by A. Balkanski et al., Ser. No. 07/492,242, filed Mar. 14, 1990, and assigned to C-Cube Microsystems, which is also the assignee of the present application; and b) U.S. patent application entitled "System for Compression and Decompression of Video Data Using Discrete Cosine Transform and Coding Techniques, " by A. Balkanski et al., Ser. No. 07/572,198, filed Aug. 23, 1990, assigned to C-Cube Microsystems, which is also the assignee of the present application. The above copending Applications a) and b) are hereby incorporated by reference in its entirety.

The code memory 305 and the Decoder memory 306 implements FIFO memory which overflows into the external DRAM. As coded data arrive on the code bus 207, they are pushed on the FIFO. The coded data in code memory 305 are transferred 64 bytes at a time, assisted by processor 201 using an interrupt mechanism. The coded data are provided to decoder logic unit 307 for decoding. Decoder logic unit 307 generates a "pop" request when it is ready to receive the next coded datum. In one mode of the present embodiment, the code memory 305 and the decoder memory 306 are connected together. In this mode, no part of the FIFO memory reside in the external DRAM.

The low level coded data stream consists of variable length codes, having the syntax defined in the MPEG standard provided in Appendix A. The syntax of the coded data is of the type which parsing can be performed by a finite state machine. (In fact the syntax is defined in section 3 of Appendix A as a finite state machine in pseudo-code form).

Decode Logic Unit

Figure 10A:
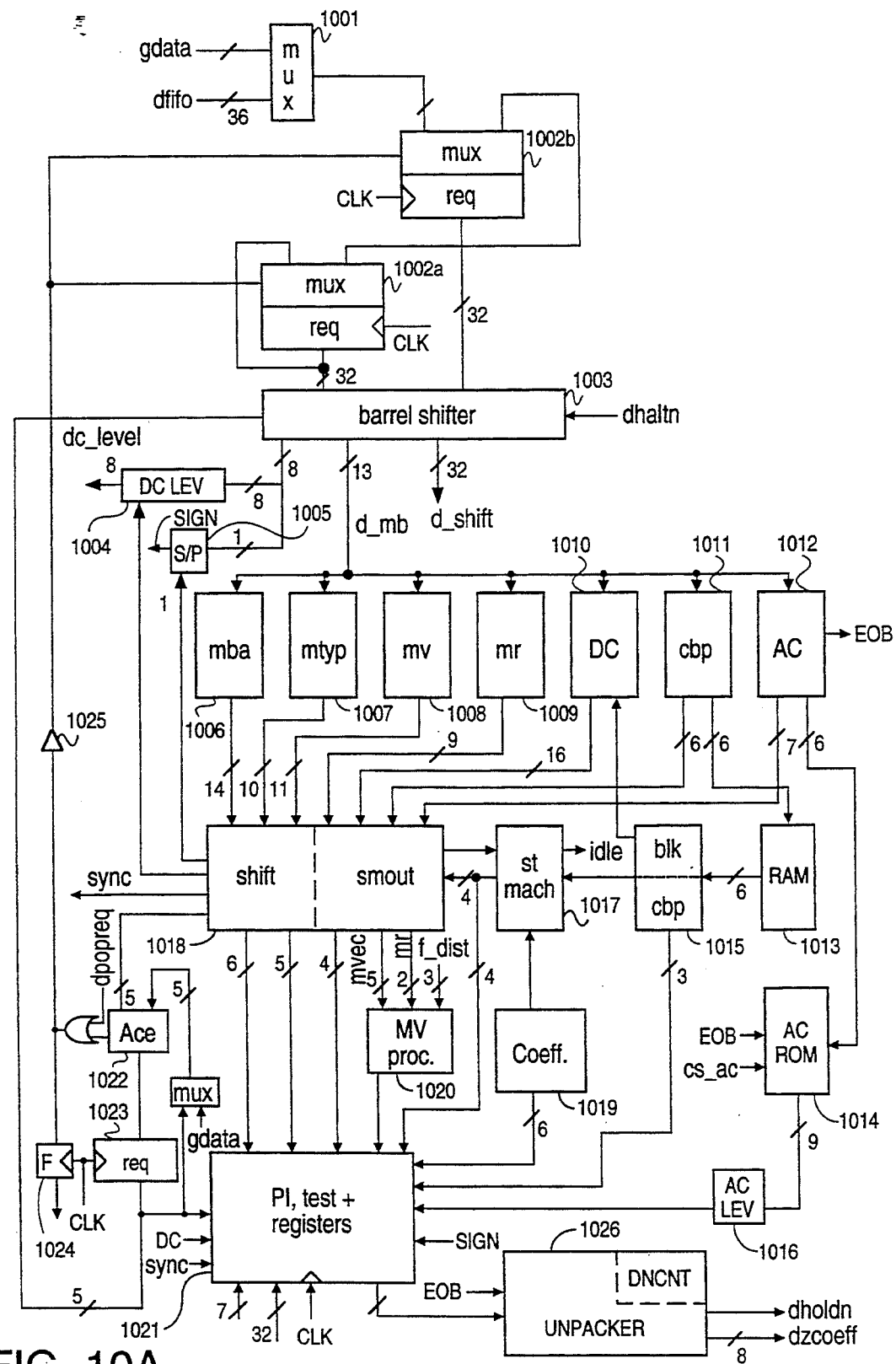
FIG. 10a is a schematic diagram of the decoder logic unit 307 of the video decompression circuit 200 shown in FIG. 2.

FIG. 10a is a schematic diagram showing the structure of decoder logic unit 307. As shown in FIG. 10a, a coded data stream is provided to register 1002b, which selectably receives as input data either the output data of multiplexer 1001 or register 1002b's own output data. Multiplexer 1001 selects between two 32-bit busses, respectively the global bus 205 and the output bus of decode memory 306. The output datum of register 1002b is provided to register 1002a as well as the lower 32-bit input bus of a barrel shifter 1003. Register 1002a receives as input data either the output data of register 1002b or register 1002a's own output data, which are provided as the higher 32-bit input data of barrel shifter 1003. The registers 1002b and 1002a respectively form the "front" and "back" registers for inputting data into barrel shifter 1003.

Figure 10B:
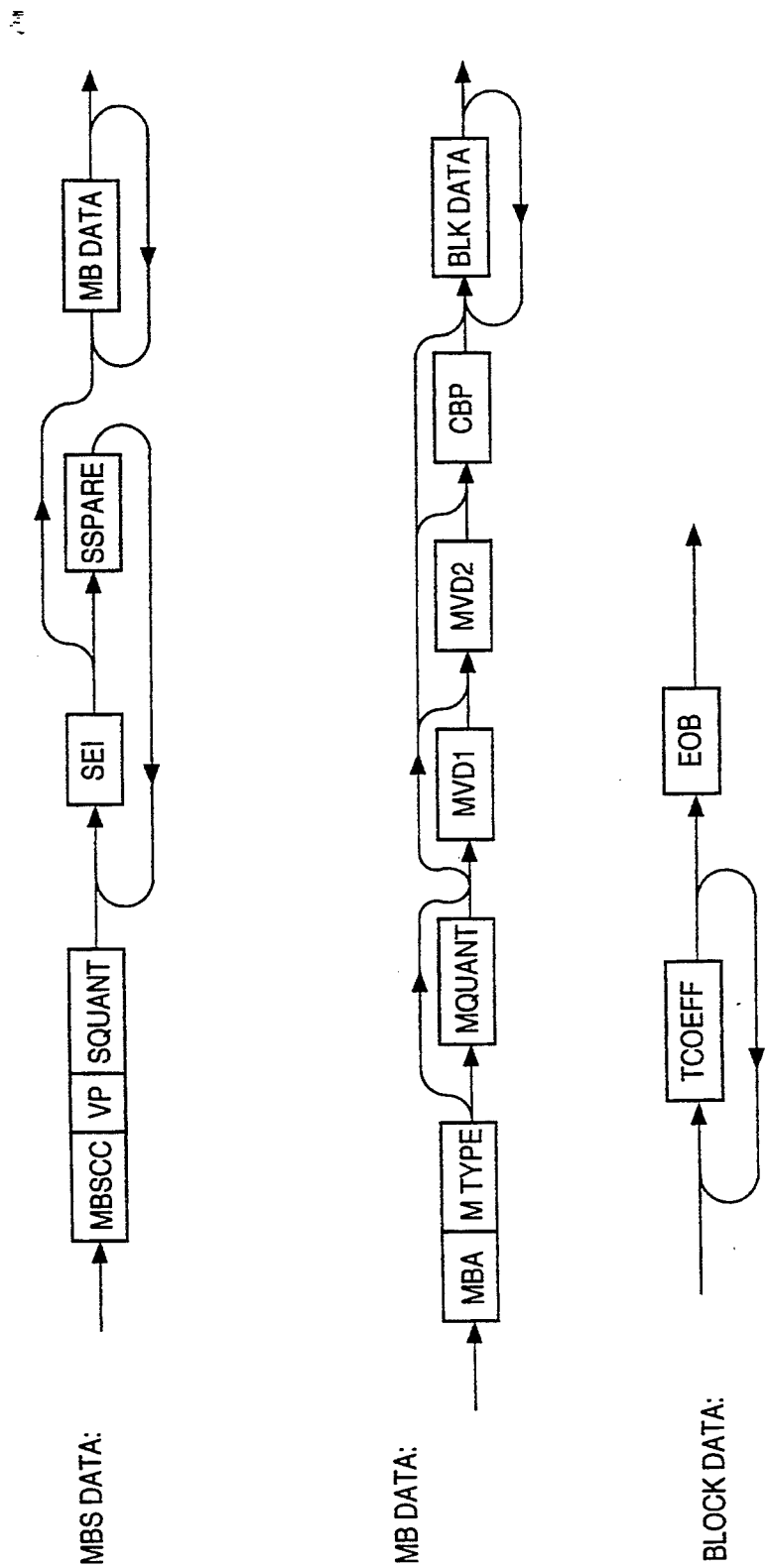
FIG. 10b is a syntax state machine showing the parsing of macroblock level variable length codes.

A parser of the coded data stream, represented by finite state machine 1017, is implemented in accordance with the MPEG standard to provide control to decoder logic unit 307. Decoder logic unit 307 decodes the macroblock level variable length code. The firmware in processor 201 decodes higher level coded data (e.g. picture level). FIG. 10b is a syntax state machine showing the parsing of macroblock level variable codes. Hence, data from the higher levels, such as frame distance and frame type are provided as input from processor 201 to decoder 307. As shown in FIG. 10a, seven types of variable codes are decoded in decoder logic unit 307 by the following decode table units: the mba (macroblock address) unit 1006, the mtype (macroblock type) unit 1007, the mv (motion vector V component) decode unit 1008, the mr (motion vector r component)

decode unit 1009, the cbp (coded block pattern) decode unit 1011, the DC decode unit 1010 and the AC decode unit 1012. The last two decode units (1010 and 1012) decode block level datum, i.e. DCT coefficients. Each decode table unit examines the 13-bit output bus d_mb of the barrel shifter 1003 and provides the value and the length of the variable code decoded. Because the sizes of the tables in cbp unit 1011 and AC decode unit 1012 are larger than the tables in the other decode table units, these two table decode units 1011 and 1012 each generate, as the first step of a two-step decoding process, instead 6-bit read-only memory addresses to respectively read-only memories cbp rom 1013 and AC rom 1014. The cbp rom 1013 then outputs the requisite cbp value and the length of the cbp variable length code decoded from the 13-bit output bus d_mb of the barrel shifter 1003. Likewise, the output datum of AC rom 1014 is used to derive the AC level value and the run length in AC level unit 1016. The DC_level signal is also provided to AC_level unit 1016 in order that the DC_level and the AC_level can be multiplexed in the same data stream for output. Although shown in FIG. 10a outside of AC decode unit 1012, when referring to the AC decode unit in the following discussion, AC rom 1014 and AC decode unit 1016 are considered to be included in the AC decode unit 1012. Likewise, cpb unit 1011 includes cpb rom 1013.

The finite state machine 1017 keeps track of the syntax state and provides control signals to a multiplexer unit 1018 to select from amongst the output data of the decode table units 1006–1012 and forward to the appropriate destinations one of the output data and the length of the variable length code decoded. For example, the DC_decode unit 1010 provides a value indicating a size and the sign of the DC value. The sign and the value are then used in the DC_level unit 1004 to extract the DC_level differential following the variable length code. The length of the variable length code decoded is provided to an accumulator 1022, which keeps track of the number of decoded bits in the front and back registers 1002a and 1002b. A pop request is generated to obtain the next 32-bit datum from the Decode memory 306 and to transfer a 32-bit datum from register 1002b to register 1002a, when necessary.

The decoded cbp value, which indicates the blocks for which transform coefficients are coded, is used for sequencing in decoding the rest of the macroblock. This sequencing is provided by block_count/cbp unit 1015. A "coeff-count" unit 1019 is provided for counting the sequence of 63 AC coefficients and 1 DC coefficient in the decoded block data stream. Thus decoder coprocessor 202 provides a bit stream in a form suitable for the IDCT unit 203. The unpacker unit 1026 expands run lengths into strings of zeroes.

The "V" and "r" components of each motion vector are decoded by the mv and mr units 1008 and 1009, and provided to the mv processing unit 1020, which is discussed next. The mv processing unit 1020 provides the motion vector in the differential motion vector format used in the motion compensation coprocessor 204.

Figure 10C:
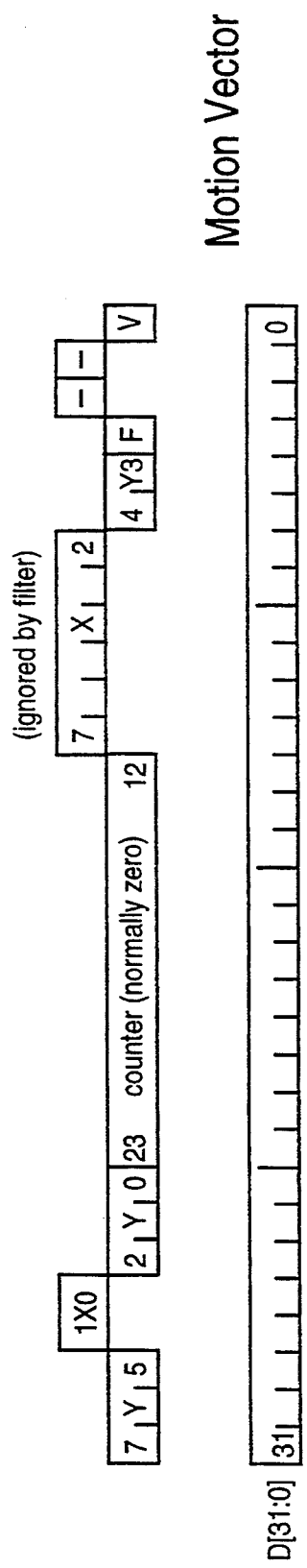
FIG. 10c shows the data representation of a differential motion vector in accordance with the present invention.

FIG. 10c shows the data representation of the motion vector in the present embodiment. As shown in FIG. 10c, a motion vector is stored in a 32-bit data word D[31:0] comprising a 8-bit horizontal component X[7:0] provided by (D[11:6],D[28:27]), an 8-bit vertical component Y[7:0] provided by (D[31:29],D[5:4],D[26:24]) if the image data is interlaced, and provided by (D[31:29],D[5:3],D[25:24]) if the image data is non-interlaced. D[3] is a parity bit indicating the field of the interlace. D[0] indicates a valid motion vector.

Motion vectors are coded differentially within a group of macroblocks, with every forward or backward motion vector coded relative to the previous motion vector of the same type. Each motion vector has a range between $-16f$ and $15f$, where $f$ is the "frame distance", which is provided in the header of the picture group according to the MPEG syntax. A motion vector is coded in two parts, the V and the r components (see below), respectively decoded by mv decode unit 1008 and mr decode unit 1009. The decoded motion vector is reconstructed by:

$$m = p + s*[f*(V-1)+1+r]$$

where s is the sign of the motion vector
  f is the frame distance
  p is the previous motion vector
  V and r are the two coded components of the motion vector
but if m $< -16f$ or m $> 15f$, $$m = p + s*[f*(V-1)+1+r] + s*(31f+1)$$

Figure 10D:
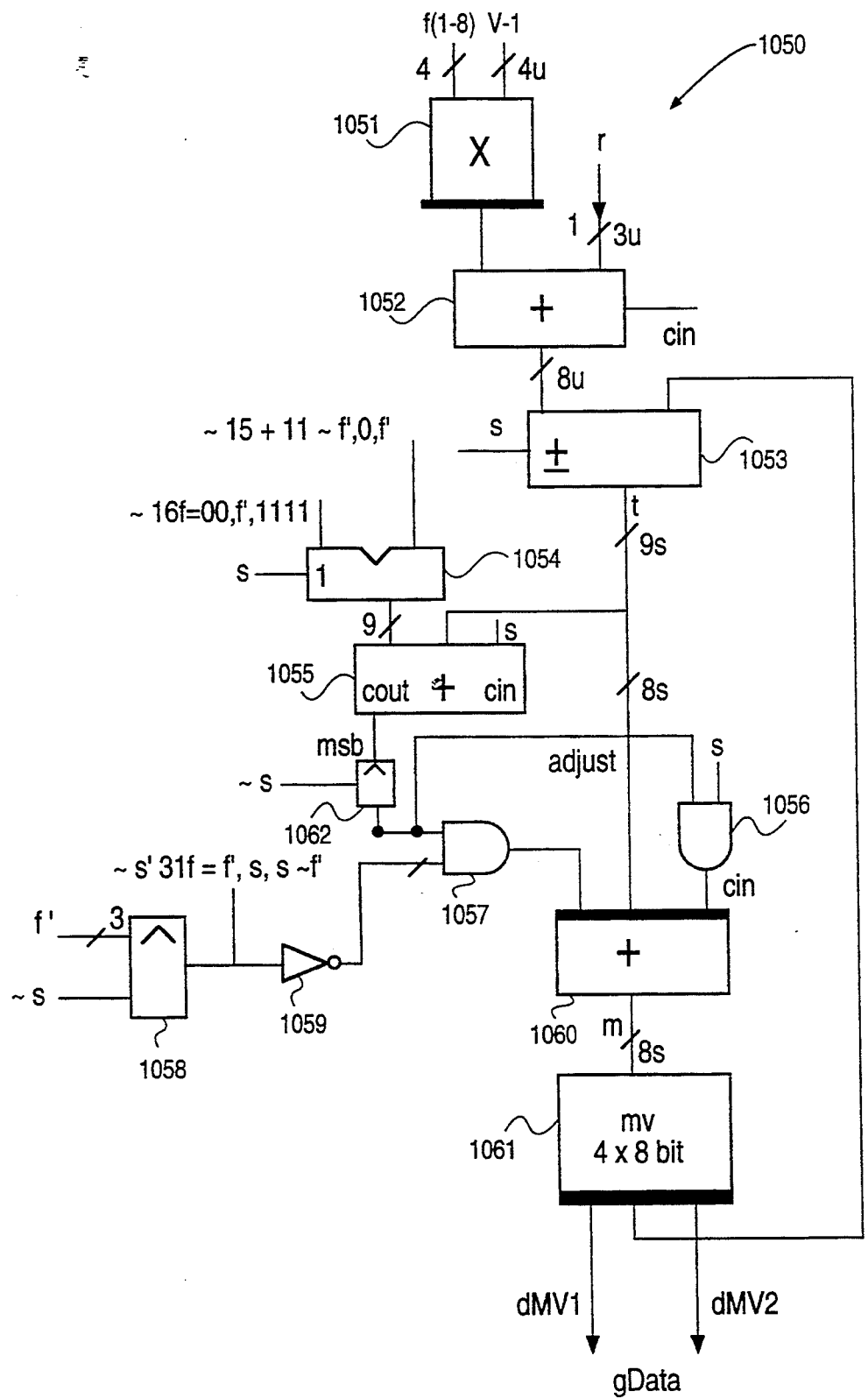
FIG. 10d is a schematic diagram of a circuit 1000 for reconstructing a motion vector from the decoded V and r components.

FIG. 10d is a schematic diagram of a circuit 1050 included in mv processing unit 1020, for reconstructing the motion vector from decoded V and r components. As shown in FIG. 10d, the frame distance f, provided as a 3-bit value, is multiplied in multiplier 1051 by the 4-bit decoded value (V-1) from the mv decode unit 1008. In this embodiment, the frame distance f used is between 1 to 8, inclusive. The 8-bit result in the multiplication of the frame distance f and the V component is then added by adder 1052 to the 3-bit r value from the mr decode unit 1009, with the carry-in bit of adder 1052 set. The 8-bit result of this addition in adder 1052 is then added to or subtracted from, according to whether the sign (provided by mv decode unit 1008) of the motion vector is positive or negative, from the previous motion vector p of the same type in adder 1053. The previous motion vector p is stored in a 4×8-bit motion vector register file 1061. Register 1061 contains the X and Y components (8 bits each) of the previous forward and backward motion vectors.

The 9-bit signed output datum t of adder 1053 is the resulting current motion vector, provided t is in the range [$-16f$, $15f$]. Otherwise, an adjustment is necessary. To test if t is within the requisite range, if t is positive, t is added in adder 1055 to $-15f$; otherwise, t is added in adder 1055 to $-16f$. The adjustment to t, if the value of t is not within the requisite range, is provided in adder 1060 by adding 8-bit value $31f+1$ to the t value. Adjustment is enabled by AND gates 1057 and 1056, when the requisite condition occurs, as indicated by the output of Exclusive-OR gate 1062. The new motion vector m is then stored in the motion vector register file 1061, replacing the last motion vector p.

IDCT

As mentioned above, the dequantized DCT coefficients from the quantizer 311 are provided in 8×8-pixel blocks in row or column order to the IDCT unit 203 and stored in the transform memory 313 (FIG. 3). A 2-dimensional inverse discrete cosine transform is performed on each 8×8-pixels block by first performing an 8-point IDCT on each row of eight coefficients, followed by an 8-point IDCT on each column of eight coefficients to complete the 2-dimensional IDCT on the block. After clipping, the IDCT coefficients are each represented in 9 bits, and range between −256 and 255.

Both copending Applications Ser. Nos. 07/492,242 and 07/572,198, incorporated by reference above, describe structures for performing IDCT also suitable for use, and in fact used, in IDCT coprocessor 203 of the present embodiment.

Motion Compensation Coprocessor 204

The motion compensation Coprocessor 204 reconstructs predicted and interpolated pictures using motion vectors and reference frames constructed from previous intra or predicted pictures. Motion compensation is directed by the firmware in processor 205 by a motion compensation task. The motion compensation task in processor 205 operates in five phases. The first and second phases respectively fetch from the external DRAM into the pixel memory 317 the upper and lower parts of a motion compensated reference macroblock in the previous predicted or intra frame (forward motion vector). Then, in the third and fourth phases, the upper and lower parts of a reference macroblock from the next predicted or intra frame (backward motion vector) are fetched from the external DRAM into the pixel memory 317 and interpolated with the macroblock of the previous frame fetched in the first and second phases. In the final phase, the current macroblock is fetched from block memory 314 and added to the macroblock in pixel memory.

In order to compute addresses of the motion compensated reference macroblocks, the higher order four bits (Y[7:4]) of the Y-component in the motion vector must be multiplied by the width of the screen. To facilitate this multiplication, as mentioned above, the decoding of the "jump target" field in processor 205's instruction set is modified when the "branch never" condition (i.e. no branch) is specified. The next section explains four instructions MV_LOAD, MV1, MV2 and MV3 in the jump target field designed to facilitate the multiplication of the width of the screen to the higher order four bits of the Y motion vector.

Special Instructions

In 2's complement representation, a multiplication by four bits, performed one bit at a time, requires four sum operations. However, if the one-bit multiplication is performed in ternary (base 3) arithmetic, only three sum operations are necessary. The four bits of the Y-component of the motion vector have a value which ranges from −8 to 7, and can be represented by three ternary digits (each ternary digit can take one of three values: −1, 0, 1). The ternary-digit multiplication of the motion vector can be seen by the following formulation (the 4-bit value Val represented by ternary digits $D_9,D_3,D_1$, where Val $=D_9*9+D_3*3+D_1$):

$$\begin{aligned}\text{base + width*Val} &= \text{Base + Width*}D_9\text{*9 + Width*}D_3\text{*3 +}\\ &\quad \text{Width*}D_1 \\ &= \text{Base + (Width*9)*}D_9 + \text{(Width*3)*}D_3 + \\ &\quad \text{Width*}D_1\end{aligned}$$

Since multiplying a value by −1, 0, or 1 is respectively negating the value, zeroing and or leaving the value unchanged, which are relatively trivial operations to implement. That is, the above computation can be implemented in three summing steps if the multiplication is achieved in the operand fetch phase, i.e. the fetching step either negates, zeroes or leaving unchanged the precomputed operands of (width*9), (width*3) or width. Therefore, the address computation above can be performed in the following code segment (specifically, by the ADD instructions):

| | | | |
|---|---|---|---|
| <any instruction> | BN MVLOAD | /* | specifying "branch never" and setting up the ternary digits of the Y_motion vector */ |
| NOOP | BN MV1 | /* | set up first phase of mv multiply */ |
| ADD ADDR,width,ADDR | BN MV2 | /* | add ternary-digit modified "width" to content of ADDR and set up second phase */ |
| ADD ADDR,width3,ADDR | BN MV3 | /* | add ternary-digit modified "width3" to content of ADDR and set up third phase */ |
| ADD ADDR,width9,ADDR | | | /* add ternary-digit modified "width9" and done! */ |

It will be appreciated that the special instructions MVLOAD, MV1, MV2 and MV3 modifies the execution of not the immediate instruction, but the instruction following. FIG. 11a shows a circuit for providing the control signals "0" "−" and "*" for implementing the three phases of the special motion vector computation using instructions MV1, MV2 and MV3. The control signal "0" indicates that the "width" ("width3," or "width9") operand should be zeroed, the control signal "−" indicates that the "width" operand should be negated. (Hence, "0" and "−" cannot both be asserted at the same time). The "*" control signal further specifies that, under certain conditions explained below, the value of the appropriate "width9," "width3" or "width" should be fetched from an alternative register.

As shown in FIG. 11a, a decode circuit 1101 detects in the current instruction both the "branch never" condition and one of the special instructions MVLOAD, MV1, MV2, or MV3 for modification of the next instruction. When MVLOAD is detected (control signal MVSEL=00), the higher order 4 bits (Y[7:4]) of the ALU 303's output bus is latched into the register MVYH. When either MV1, MV2 or MV3 (MVSEL=01, 10 or 11 respectively) is detected, the control signals MVSEL, together with the content of register MVYH indexes into a table 1103 containing 3-bit values. The 3 bits in each 3-bit value are respectively the values of the "0", "−", "*" control signals

In the present embodiment, if the computation of the motion vector yields an address beyond the current macroblock, as indicated by the overflow circuit 1104 and exclusive-OR gate 1106, the "*" control signal is propagated by AND gate 1107. The "*" control signal is explained below.

The "0", "−" and "*" control signals are propagated by register 1105 to effectuate the operand modification. The contents of table 1103 are tabulated in table 1150.

Figure 11B:
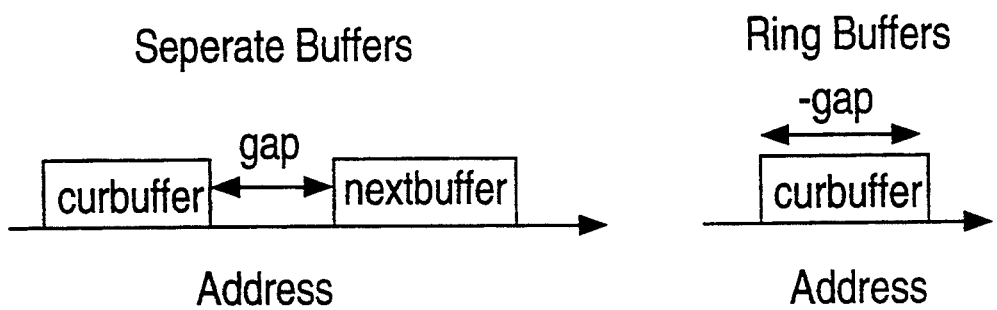
FIG. 11b shows non-contiguous buffer and ring buffer implementations of a video memory.

In the present embodiment, macroblocks in a field or frame may not be stored contiguously in memory. This condition arises if adjacent slices of macroblocks are stored in buffers separated by a "gap", or in a ring buffer (both conditions are shown in FIG. 11b). When the current motion vector reaches outside of the current macroblock slice, as detected by the overflow circuit 1104 and exclusive-OR gate 1106, the "*" control signal directs the operand fetch to an alternate register (physically, the alternate register is also a register in register file 302 of FIG. 3 but having an address one greater than the specified register). The content of the alternate register is the value of the width to be fetch augmented by the size of the gap.

Block Memory

The block memory unit 314 stores and reorders each macroblock of data. Data arrives in 8×8-pixel blocks of one luminance (Y) or Chrominance (U or V) type. However, for video output purpose, the pixels are provided in pixel pairs, consisting of two Y pixels and the U and V pixels in the same picture area. Data arrives from IDCT coprocessor 203 one byte per clock on the average, at four-clock bursts during which two bytes are transferred per clock period. In the present embodiment, three banks of SRAM are provided. Bank0, which is 128 × 16-bit, is designed to contain four blocks of Y data, and banks Bank1 and Bank2, each 64×8-bit, are designed for storing one block of U or V data.

In the present embodiment, as data of the current macroblock arrives and are written into the block memory 314, the data of the previous macroblock are read out. In accordance with the present invention, block memory unit 314 is written and read out in cycles of the four patterns described below. Under this four-pattern scheme, data in the current macroblock is always written into a location at which data of the last macroblock have already been read. Therefore, double-buffering to prevent writing into a memory location before the last datum is read out is not necessary under this scheme. As a result, a 50% reduction in memory requirement is achieved.

FIGS. 12a-d illustrate the memory access pattern in accordance with the present invention. In each of FIGS. 12a-d, each vertical column 00-17 (octal) represents one column of a 8×8-pixel block, each column being a picture area of 2 pixels × 8 pixels. The numbering of these vertical columns represents the order in which the pixels are received from the IDCT coprocessor 203 (2 bytes per clock period over 4-clock period bursts).

FIG. 12a shows the "pattern 0" access pattern. The columns 01-04 in the first quadrant represents the first 8×8-pixels block of Y data. Likewise, the other three Y blocks are represented by columns 04-07, 10-13, and 14-17. In pattern 0, the vertical columns are stored at sequential memory addresses (each column being offset by 8 16-bit words, hence sequential in the address bits specifying eighth words). However, the macroblock written under pattern 0 has to be read in the order 00, 10, 01, 11, . . . , 07, 17, in order that the 16×16-pixel macroblock can be read out in column order. Hence, as pattern 0 data are read out, the incoming data ("pattern 1") are directed to occupy the locations vacated by pattern 0. For example, the first four pattern 0 columns to be read out are 00, 10, 01, 11, which are replaced respectively by columns 00, 01, 02, and 03 of the next macroblock ("pattern 1").

The distribution of pattern 1 columns is shown in FIG. 12b. As in pattern 0 columns, after pattern 1 columns are completely written, pattern 1 columns are read in the order 00, 10, 01, 11, 02, 12, . . . , 07, 17 and respectively replaced by the next macroblock's ("pattern 2") columns 00, 01, 02, 03, . . . , 16, 17. Pattern 2 is shown in FIG. 12c. Likewise, the columns of pattern 2 gives way to the columns of the next macroblock ("pattern 3"), which is shown in FIG. 12d. The columns of pattern 3 are read in the order in which the columns of pattern 0 are written. Hence, such memory access patterns can continue indefinitely in cycles of patterns 0-3. Because, in each of the memory access patterns 0-3, every memory location is read before it is written, block memory unit 314 need only be the size of one macroblock, and reordering is accomplished without double buffering.

The memory addresses for memory access patterns 0-3 can be generated by a counter which counts in sequential order during pattern 0 access, in the order (0,8,1,9,2,10,3,11,4,12,5,13,6,14, 7,15) during pattern 1 access, in the order (0,4,8,12,1,5,9,13, 2,6,10,14, 3,7,13,17) during pattern 2 access, and in the order (0,2,4,6,8,10,12,14,1,5,3,7,11,15) during pattern 3 access. The counts in patterns 0, 1, 2, and 3 can be generated by a 4-bit counter which counts by: 1) rotating to the left the four count bits in a wrap-around fashion 0, 1, 2 or 3 bits, in accordance with whether memory access pattern 0, 1, 2 or 3 is desired; 2) incrementing by 1 the 4-bit counter in its rotated position; and 3) rotating to the right the number of bits rotated in step 1) (i.e. returning to original bit positions).

Figure 12F:
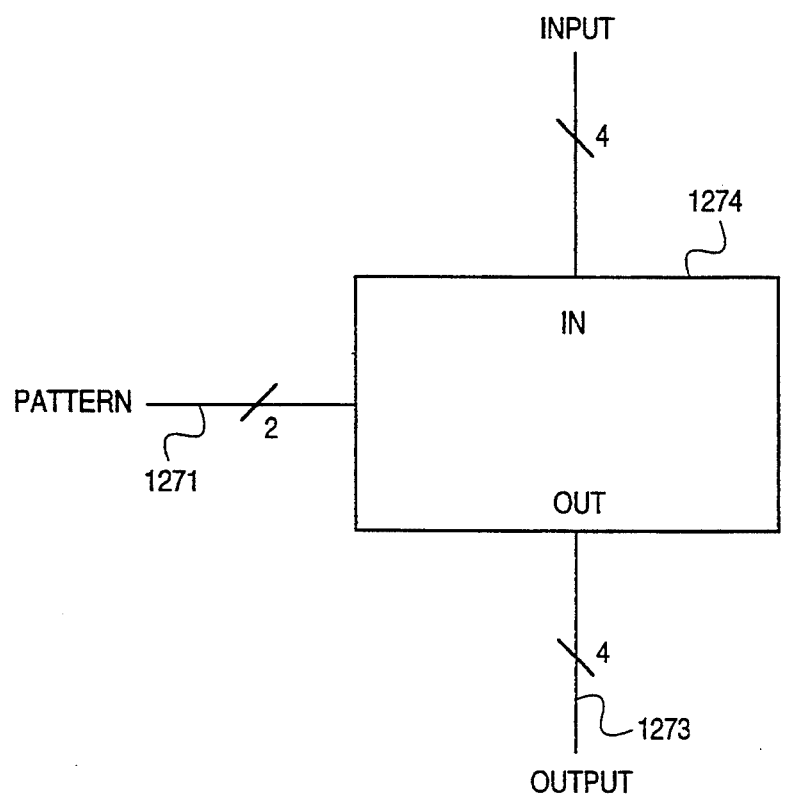
FIG. 12f shows a counter for generating the addresses for implementing the memory access patterns 0–3 of the present invention.

FIG. 12f shows a counter 1274 for implementing the bit rotation function. As shown in FIG. 12f, four bits of the pixel address or pixel count are provided in a 4-bit bus 1272 as an input datum to counter 1274. A 2-bit control directs counter 1274 to generate the count for each of the patterns 0-3. The 4-bit output bus 1273 provides the rotated 4-bit bit patterns. The bit patterns of the counts corresponding to memory access patterns 0, 1, and 2 are shown in FIG. 12e.

Motion Compensation

Figure 13A:
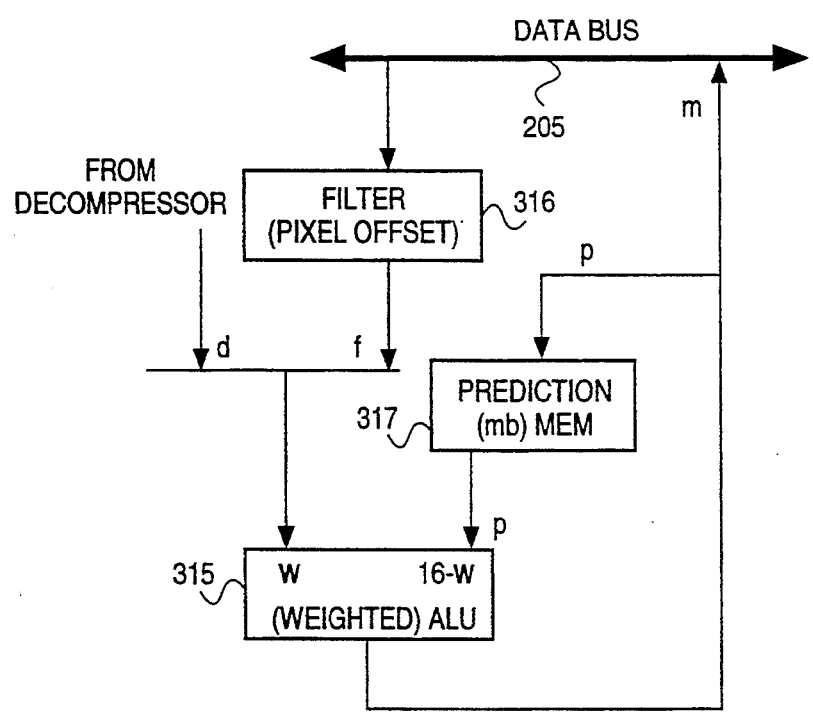
FIG. 13a shows the data flow path through the motion compensation units 315–317.

The motion compensation function is implemented in the present embodiment in the pixel filter unit 316, the prediction or pixel memory unit 317 and the weighted adder or ALU unit 315. The data flow path through the motion compensation units 315-317 is shown in FIG. 13a.

As mentioned above, in the first and second phases of the motion compensation operation, first and second parts of a macroblock of the forward reference frame are fetched from DRAM, provided over the global bus 205 at a rate of two Y pixels and two chrominance pixel per clock period, and placed in the pixel memory 317. In the non-interlaced 4:2:0 mode, since the chrominance data are subsampled in the Y direction, new chrominance data arrive every other clock period (the two chrominance values arriving at a clock period when no new chrominance data are provided are duplicates of the previous two chrominance values). In fetching this macroblock from the external DRAM, processor 205 provides the first order motion compensation in the computation of the macroblock address, which is computed in the manner discussed in conjunction with the special instructions MVLOAD, MV1, MV2 and MV3 discussed above. Pixel Filter 316 provides the resampling of the pixels fetched to half-pixel or quarter-pixel locations, using the lower order bits X[1:0] and Y[1:0] of the X and Y components of the motion vector.

Figure 13B:
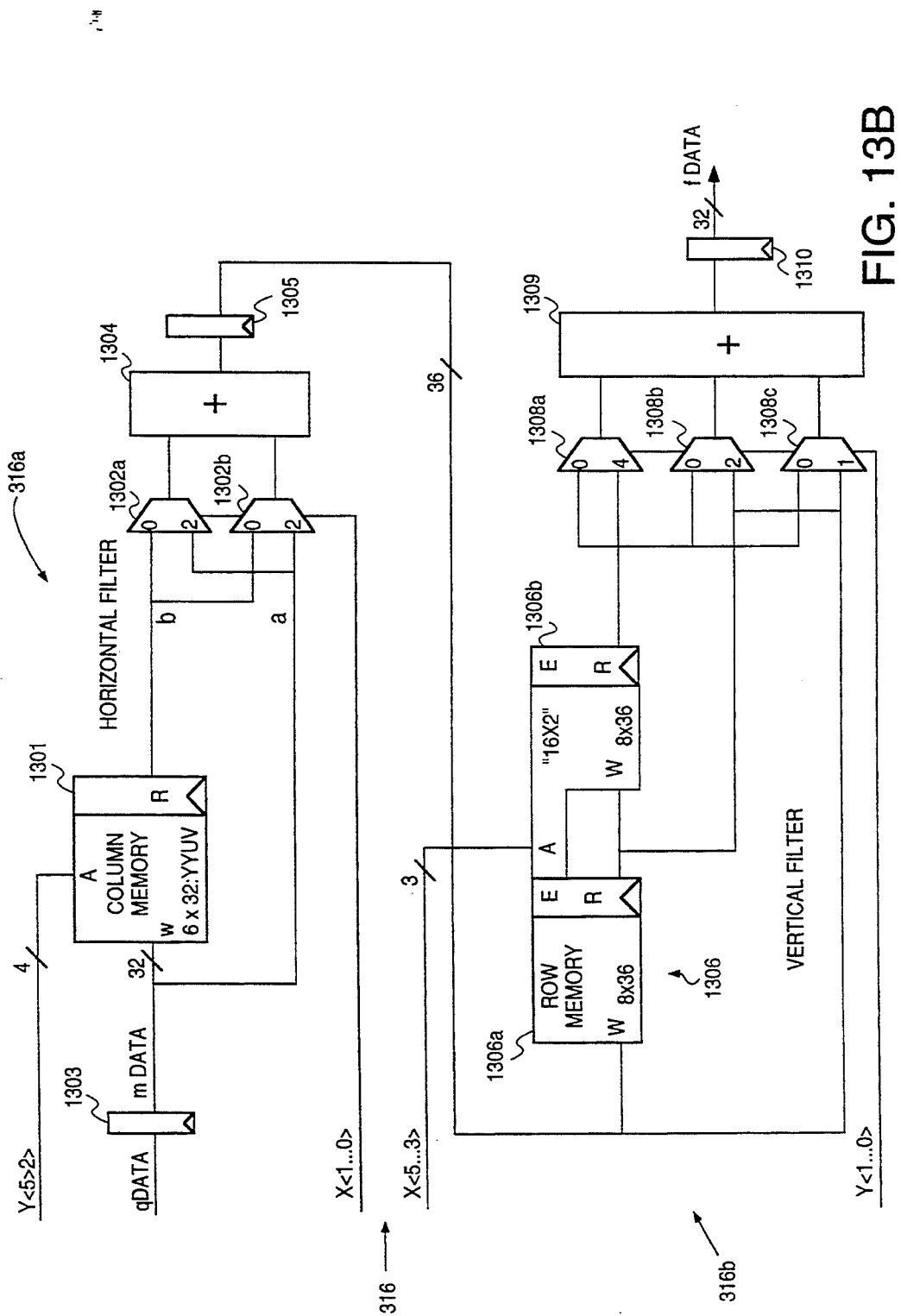
FIG. 13b is a schematic diagram of pixel filter unit 316.

In the third and fourth phases of motion compensation, a macroblock in the backward reference frame is fetched in a similar manner as the macroblock from the forward reference frame, and likewise resampled in the Pixel Filter 316. As the pixels of the macroblock from the backward reference frame are resampled, they are forwarded to the weighted adder to linearly combine with corresponding pixels in the macroblock from the forward reference frame fetched in the first and second phases to form the pixels of an interpolated prediction of the current macroblock. The pixels of the interpolated prediction are then stored back to the Pixel Memory 317. In the final phase, a macroblock of decompressed data is received from the block memory unit 314 and summed with the interpolated prediction macroblock to form the final values of the current macroblock. This current macroblock is then written back into the external DRAM for video output. The Pixel Filter unit 316 is a 2×2 resampler. FIG. 13b is a schematic diagram of the circuit implementing the 2×2 resampler of the Pixel Filter unit 316. As shown in FIG. 13b, the Pixel Filter unit 316 comprises a horizontal filter 316a and a vertical filter 316b. The horizontal filter 316a comprises a 16×32-bit column memory 1301, the input latch 1303, multiplexers 1302a and 1302b, an output latch 1305 and an adder 1304. Multiplexers 1302a and 1302b, together with adder 1304 forms a weighted adder (hereinafter, collectively referred to as weighted adder 1304). The weighted adder 1304 can provide in the resulting sum 1:0, $\frac{1}{2}:\frac{1}{2}$ or 0:1 weighting of its two input data a and b. The vertical filter unit 316b comprises a 2×8×36-bit row memory unit 1306, multiplexers 1308a, 1308b and 1308c, and adder 1309, and an output register 1310. The row memory unit 1306 can be further divided into two planes 1306a and 1306b, each organized as 8×36-bit. Again, multiplexers 1308a–c and adder 1309 forms a weighted adder (hereinafter, collectively referred to as weighted adder 1309). The weighted adder 1309 can provide 1:0, $\frac{1}{4}:\frac{3}{4}$, $\frac{3}{4}:\frac{1}{4}$, $\frac{1}{2}:\frac{1}{2}$ or 0:1 weights of its two input data a and b, which are selected from the current pixel pair and either the pixel pair in the previous row, or the pixel pair in the row above the immediately previous row.

Every clock period, a pixel pair arrives in column order (each column is a 2×18 group of pixels, since a reference macro block needs a 18×18-pixel picture area in other to provide a complete context for the resampling in the pixel filter 316) on the global bus 205 and is latched into the input latch 1303. Each pair of pixels are stored in one of 16 locations of the 16×32-bit column memory 1301 specified by the bits Y[5:2] in the Y component of the motion vector. As a pixel pair of a new column arrive at the column memory 1301, a pixel pair in the corresponding position in the previous column is read out. The current pixel pair and the corresponding pixel pair from the previous column are then combined at the weighted adder 1304, the weights accorded each pixel pair is determined by the lower order two bits (i.e. X[1:0]) of the X component of the motion vector. The result of this weighted addition is a new pixel pair positioned between the input pixel pairs (i.e. horizontally resampled). The new pixel pair (9-bit precision) is then latched into register 1305 to be forwarded to the vertical filter unit 316b. Hence, the column memory 1301 acts as the delay element of a 2-tap filter. The output data of the horizontal filter 316a are discarded during the time period when the data of the first column in each macroblock are input at the Pixel Filter 316.

The row memory 1306 provides vertical resampling of the macroblock. The row memory 1306 is organized as two planes 130a and 130b each holding eight 36-bit words. The first plane 1306a contains one pixel pair per column, being the most recent pixel pair in the column prior to the current pixel pair. The second plane 1306b also contains one pixel pair per column, being the second most recent pixel pair in the column prior to the current pixel pair. As the current pixel pair arrives, memory planes 1306a and 1306b are each read for the pixel pair in the same column. A new pixel pair is provided by weighted adder 1309 as a weighted sum of the current pixel pair and either the most recent pixel pair in the same column (delayed one clock period) or the second most recent pixel pair in the same column (delayed two clock periods). The weights to accord the current pixel pair and the selected previous pixel pair are specified by the lower two bits (Y[1:0]) of Y-component in the motion vector. In the interlaced mode, resampling of the current pixel pair is performed with respect to the pixel pair delayed two clock periods. The new pair of pixels are then latched into the register 1310, for transfer into the Pixel Memory unit 317, via weighted adder 315.

Figure 13C:
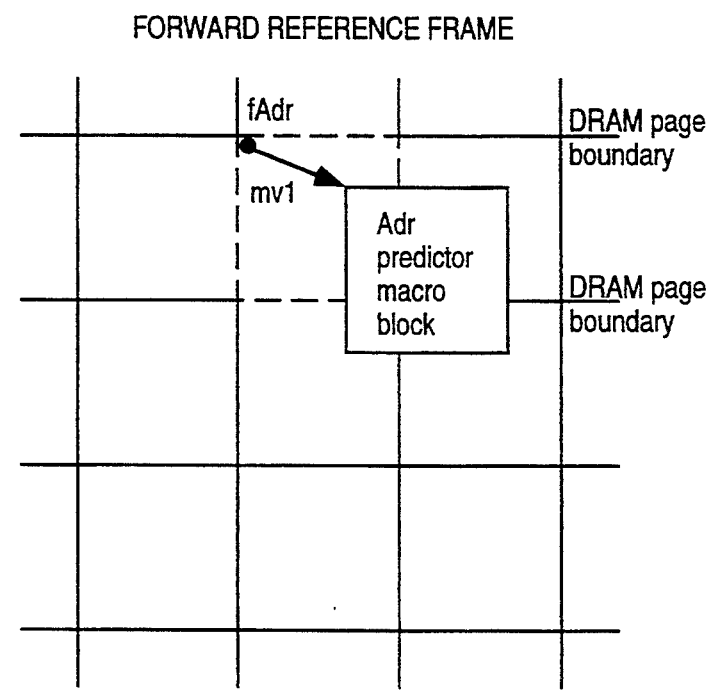
FIG. 13c shows a motion vector mv1 yielding a predictor macroblock which maps into an area in the external DRAM spanning DRAM page boundaries.

A motion vector can provide a predicted macroblock not aligned to the page boundaries of the external DRAM. Since the pixels are fetched in column order and there are 16 pixels in a row of pixels of a macroblock, fetching a macroblock potentially requires crossing a DRAM page boundary sixteen times. FIG. 13c shows a motion vector mv1 yielding a predicted macroblock which is not aligned to the DRAM page boundaries. Recalling that the initial access to a DRAM page requires six to seven clock periods, and subsequence accesses to the same page can be achieved in page mode every other clock period, much efficiency can be achieved if the sixteen DRAM page crossings can be reduced. Such efficiency is achieved, in accordance with the present invention, by fetching the macroblock in two parts. This method is illustrated by FIG. 13d.

Figure 13D:
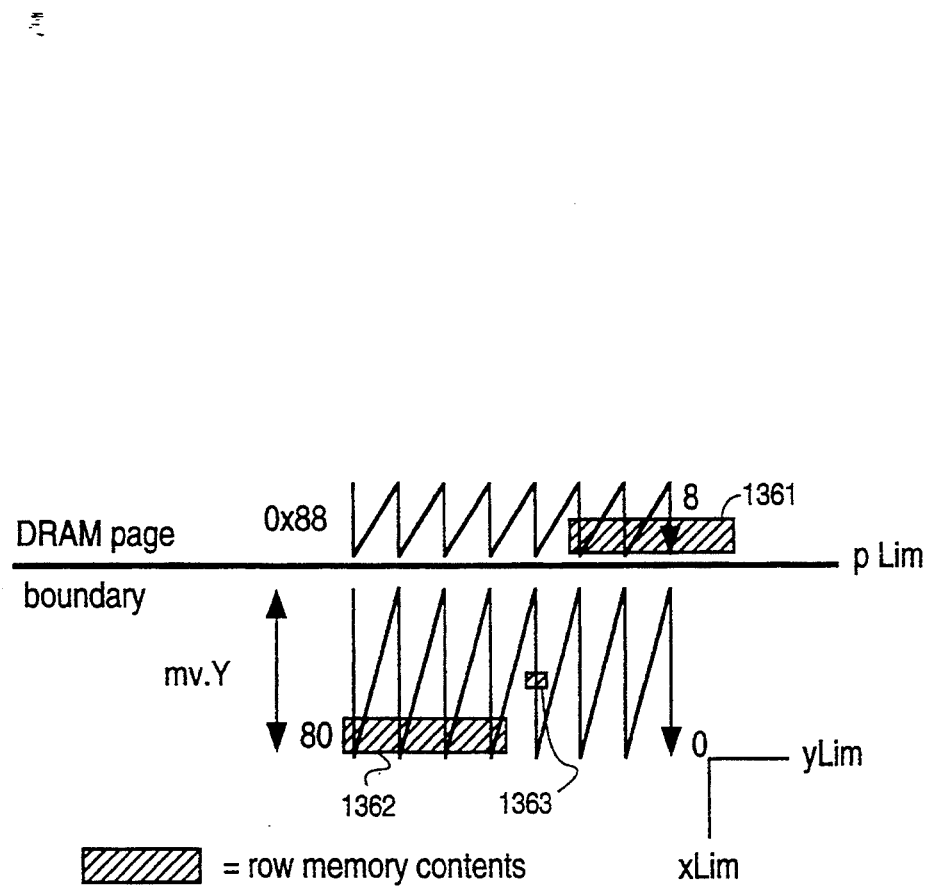
FIG. 13d shows the content of the row memory 1306 and the two-part memory access pattern in which the pixels of a macroblock are fetched.

Under the method illustrated in FIG. 13d, the macroblock is fetched in two parts. In the first phase (the third phase, if the macroblock is coded with respect to a backward reference frame) of motion compensation, the part of the macroblock above the horizontal DRAM boundary is fetched in column order. However, when the DRAM boundary is reached in each column, instead of crossing the DRAM boundary to fetch the next pixel pair of the column, the first pixel pair of the next column is fetched. The last two pixel pairs above the DRAM boundary are allowed to remain in row memory of the Pixel Filter unit 316 until the next phase of motion compensation. The first phase is completed when the part of the macroblock above the horizontal boundary in all columns is fetched.

In the second phase (the fourth phase, if the macroblock is coded with respect to a backward reference frame), the second part (i.e. the part of the macroblock below the horizontal DRAM page boundary) of the macroblock is fetched, beginning with the first pixel pair below the DRAM page boundary in the first column. After the remaining pixel pairs in the first column are fetched, the remaining pixel pairs of the second column are fetched, and so forth. The second phase is completed when all remaining pixel pairs below the DRAM page boundary in all columns are fetched. FIG. 13d shows the memory access patterns for the first (above the horizontal DRAM page boundary) and the second (below the horizontal DRAM page boundary) parts of the macroblock access, and in particular at the instance during the second phase at which just over one half of the pixel pairs in the second part of the macroblock are fetched. As shown in FIG. 13d, the row memory unit 1306 contains, for each of the last three columns of the macroblock, the last two pixel pairs (indicated by the shaded box 1361) above the horizontal DRAM page boundary in the columns fetched during the first phase. FIG. 13d also shows that the row memory unit 1306 contains, for the first four columns, the last two pixel pairs (indicated by shaded box 1362) below the horizontal DRAM page boundary in each column. In FIG. 13d, the current content of the row memory unit 1306, for the fifth column of the macroblock, are the two most recent pixel pairs received prior to the current pixel pair. Hence, by fetching the macroblock in two parts, with respect to horizontal page boundaries, only two initial access time costs are incurred, thereby resulting in a substantial saving of memory access time per macroblock fetched.

Figure 14:
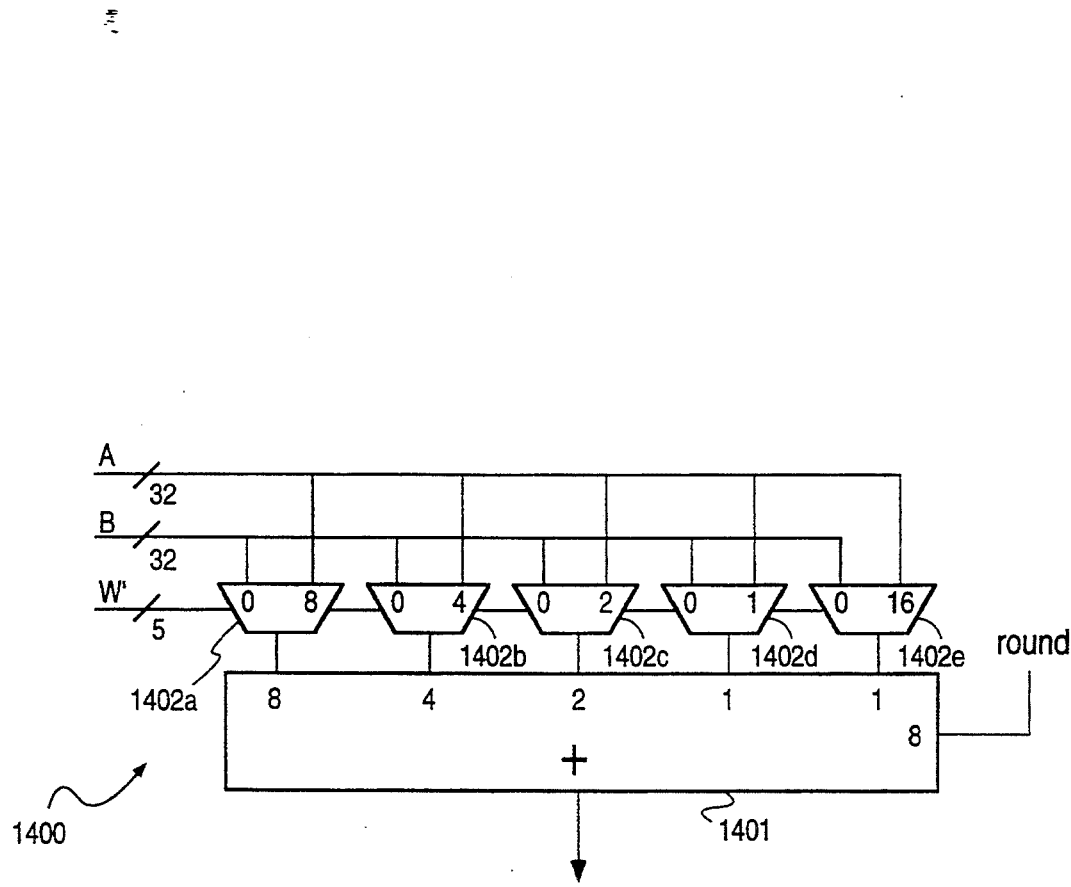
FIG. 14 shows a circuit 1400 for implementing the bilinear interpolator in the weighted adder 316 of the present embodiment.

The weighted adder 316 is a bilinear interpolator of two pairs of pixels (a,b), providing an output datum having a value $(w*a+(16-w)*b+8)/16$. The third operand "8" is provided for rounding purpose. A circuit 1400 is shown in FIG. 14 to implement this bilinear interpolator. As shown in FIG. 14, circuit 1400 comprises 5-input adder 1401, and five multiplexers 1402a–e. Each multiplexer 1402a–e, in addition to selecting one of the two input data A and B at its input terminals, provides to the output datum the weight indicated on the multiplexer, by shifting to the left the input datum a number of bits equal to the base 2 logarithm ($\log_2 w$) of the weight. For example, multiplexer 1402a selects and shifts to the left three bits ($\log_2 8$) the 32-bit A input datum, if bit 3 of the 5-bit control value w'[4:0] is 1. (Control value w' equals w for $0 \leq w < 16$ and equals 31 when w=16.) By so shifting, multiplexer 1402a provides a weight of 8 to the A-input datum during the summing operation of adder 1401, and a weight of 0 to the B-input datum. Conversely, if bit 4 of the control value w' is 0, the 32-bit B-input datum is given a weight of 8, and the A-input datum of multiplexer 1402a is provided a weight of 0.

The operations of multiplexers 1402b–e are similar, with the weights accorded to the selected input data, respectively, 4, 2, 1 and 1, controlled by the bits 2, 1, 0 and 4 of the control value w'. Since multiplexers 1402a–e each accord a designated weight to either the A-input datum or the B-input datum, the total weight accorded by all the multiplexers 1402a–e to the A-input datum must equal to the total available weights (i.e. 16) minus the total weight accorded the B datum. Therefore, the resulted weighted sum, before rounding, must equal $w*a+(16-w)*b/16$. The final division by 16 is accomplished by shifting the resulting sum to the right 4 bits.

There is a special case when all the weights are assigned to the A-input datum. In that situation, where w=16, 5-bit control value w' is given the value 31, which enables each multiplexer 14a–e select the A-input datum.

Video Output

The video output unit comprises a 64×32-bit video memory 319 (FIG. 3), for storing video output. The video data are output in the order of the horizontal lines in a display. Hence, pixel data are fetched from the video memory of the external DRAM in scan format as discussed above. The data format follows the CCIR 601 standard ($C_b Y C_r Y$, i.e. UYVY). A horizontal resampler 318 is provided to interpolate horizontally by a factor of 2, using a bilinear filter.

The above detailed description is intended to illustrate the specific embodiments provided herein and not intended to limit the present invention. One skilled in the art will be able to provide numerous variations and modifications within the scope of the present invention upon consideration of the above detailed description and the accompanying drawings. The present invention is defined by the following claims.

Appendix A

CODING OF MOVING PICTURES AND ASSOCIATED AUDIO --

FOR DIGITAL STORAGE MEDIA AT UP TO ABOUT 1.5 Mbit/s --

VIDEO CODING

```
GENERAL......................................................................2
        Scope and Purpose....................................................2
        References...........................................................2
        Mathematical Notations...............................................2
                Arithmetic Operators.........................................2
                Logical Operators............................................2
                Relational Operators.........................................2
                Bitwise Operators............................................3
        Method of Describing Bit Stream Syntax...............................3
        Definitions..........................................................4
                Video Sequence...............................................4
                Group of Pictures............................................4
                Pictures.....................................................5
                Slice........................................................5
                Macroblock...................................................5
                Block........................................................5
        Organization of the Document.........................................5
```

```
BACKGROUND..........................................................5
    Overview........................................................5
        Pre-processing..............................................5
        Encoding....................................................6
        Storage.....................................................6
        Decoding....................................................6
        Post-processing.............................................6
    Description of Operational Features.............................6
        Forward Play................................................6
        Reverse Play................................................7
        Fast Play, Forward and Reverse..............................7
        Random Access...............................................7
        Pause and Freeze Picture....................................7
SPECIFICATION OF THE CODED BIT STREAM................................7
    Application Dependent Parameters................................7
    Bit Stream Syntax Specification.................................8
        Start Codes.................................................8
        Definition of next_start_code Function......................8
        Video Sequence Layer........................................8
        Group of Pictures Layer.....................................9
        Picture Layer...............................................9
        Slice Layer................................................10
        Macroblock Layer...........................................11
        Block Layer................................................11
    Semantic Meaning and Use of Retrieved Data Elements
    Specification..................................................11
        Video Sequence Layer.......................................11
        Group of Pictures Layer....................................13
        Picture Layer..............................................13
        Slice Layer................................................15
        Macroblock Layer...........................................15
        Block Data.................................................16
    Macroblock Decoding............................................17
        Intra-coded Macroblocks....................................17
        Predictive-coded Macroblocks...............................19
        Bidirectionally Predictive-coded Macroblocks...............20
        Skipped Macroblocks........................................21
    Specifications Regarding Operational Features..................22
        Forward Play...............................................22
        Reverse Play...............................................22
        Fast Play, Forward and Reverse.............................22
        Skip Forward and Reverse...................................22
        Pause and Freeze Picture...................................22
        High-resolution Still......................................23
ANNEX A - 8x8 INVERSE DISCRETE COSINE TRANSFORM.....................23
ANNEX B -- VARIABLE LENGTH CODE TABLES..............................23
Introduction........................................................23
B1.  Macroblock Addressing..........................................23
B2.  Macroblock Type................................................24
B.3. Macroblock Pattern.............................................24
B4.  Motion Vectors.................................................25
B5.  DCT Coefficients...............................................32
ANNEX C -- POST-PROCESSING AND DISPLAY..............................36
     C1.  Pictures for 525 and 625-line Television.................36
     C2.  Picture to Field Conversion..............................36
     C3.  Consideration of Variable Resolution, Aspect Ratio, Pel
     Aspect Ratio, and Color Systems..............................37
```

Draft:  Subject to further change
Month/Day/Year  9/14/90

Editors notes: The syntax diagrams from the July 2, 1990 version will be made consistent with the syntax specification of clause 3.2 and included as an appendix. The specification of frequence of intra-coded blocks is contained in the referenced IEEE standard, and attention is drawn to the fact in Annex A..

1. GENERAL

1.1. Scope and Purpose

This standard specifies the coded representation of video for digital storage media and the method for decoding. The representation supports normal speed forward playback, as well as special functions such as random access, fast play, fast reverse play, normal speed reverse playback, pause, and still pictures. This standard is compatible with standard 525 and 625-line television formats, and it provides flexibility for use with personal computer and workstation displays.

This standard is intended for application to digital storage media supporting a continuous transfer rate up to about 1.5 Mbit/s, such as CD, DAT, and magnetic hard disks. The storage media may be directly connected to the decoder, or via communications means such as buses, LANs, or telecommunications links. This standard is intended for non-interlaced video formats having approximately 288 lines of 352 pels and picture rates around 24Hz to 30Hz.

1.2. References

CCIR 601

CCITT Recommendation H.261

IEEE Draft Standard "Specification for the Implementatioons of 8x8 Inverse Discrete Cosine Transform", P1180/D2, July 18, 1990 or the succeeding IEEE draft or approved standard.

1.3. Mathematical Notations

The mathematical operators used to describe this standard are similar to those used in the C programming language. However, integer division with truncation and rounding are specifically defined. The shift operator is defined assuming two's complement representation of integers. Numbering and counting loops will generally begin from 0.

1.3.1. Arithmetic Operators

+     Addition.

-     Subtraction (as a binary operator) or negation (as a unary     operation).

*     Multiplication.

/     Integer division with truncation of the result toward zero. For example, 7/4 and -7/-4 are truncated to 1, and -7/4 and 7/-4 are truncated to -1.

//     Integer division with rounding to the nearest integer. Half- integer values are rounded away from zero unless otherwise specified. For example 3//2 is rounded to 2, and -3//2 is rounded to -2.

++     Increment.

--     Decrement.

%     Modulus operation. Defined only for positive numbers.

Sign( )     Sign multiplied by 1 except for 0. It is equal to +1 if the value in brackets is positive, -1 if the value is negative, and 0 if the value in brackets is zero.

1.3.2. Logical Operators

||     Logical OR.

&&     Logical AND.

!     Logical NOT

1.3.3. Relational Operators

>     Greater than.

>=     Greater than or equal to.

<     Less than.

<=     Less than or equal to.

==     Equal.

!=     Not equal.

1.3.4. Bitwise Operators

&     AND

|     OR

-     Exclusive OR (XOR).

-     The one's complement (NOT). In two's complement arithmetic, -A == ~A+1 is true.

>> Shift right with sign extension. In two's complement arithmetic, A//16 == ((A>>3)+1)>>1 is true. However, A/16 == A>>4 is true only for positive As.

<< Shift left with zero fill.

1.4. Method of Describing Bit Stream Syntax

The bit stream retrieved by the decoder is described in Section 3.2. Each data item in the bit stream is in bold type. It is described by its name, its length in bits, and a code describing its type and order of transmission. The codes are:

bslbf  Bit string, left bit first, where "left" is the order in which bit strings are written in the standard. Bit strings are written as a string of 1s and 0s within single quote marks, e.g. '1000 0001'.
  Blanks within a bit string are for ease of reading and have no significance.

uimsbf Unsigned integer, most significant bit first.

vlclbf Variable length code, left bit first, where "left" refers to the order in which the VLC codes are written in Annex B.

The action caused by a decoded data element in a bit stream depends on the value of that data element and on data elements previously decoded. The decoding of the data elements and definition of the state variables used in their decoding are described in Section 3.3. A function, nextbits(), permits comparison of a bit string with the next bits in the retrieved bit stream for the purpose of defining the syntax. Actual decoders may not need to look ahead of bits currently being decoded. The function, bytealigned(), returns 1 if the current position is on a byte boundary, i.e. the next bit in the bit steam is the first bit in a byte. The following constructs are used to express the conditions when data elements are present, and are in normal type:

```
while ( condition ) {         If the condition is true, then the group
                              of data elements occurs next
    data_element              in the data stream. This repeats until
    ...                       the condition is not true.
} do {
    data_element
    ...                       data element occurs at least once.
} while ( condition )         If the condition is true, then the
                              data element is repeated until the
                              condition is not true.

if ( condition) {             If the condition is true, then the
                              first group of data elements occurs
    data_element              next in the data stream.
    ...
}
else {                        If the condition is not true, then the
                              second group of data elements
    data_element              occurs next in the data stream.
    ...
} for ( i = 0; i < 6; i++) {    The group of data elements occurs 6 times. Conditional
                              constructs
    data_element              within the group of data elements may depend on the value
                              of the
    ...                       loop control variable i, which is set to zero for the
                              first occurrence,
}                             incremented to one for the second occurrence, and so
                              forth.
```

As noted, the group of data elements may contain nested conditional constructs. For compactness, the {} are omitted when only one data element follows.

While the syntax is expressed in procedural terms, it should not be assumed that clause 3.2 implements a satisfactory decoding procedure. In particular, it defines a correct and error-free input. Actual decoders must include a means to look for start codes in order to begin decoding correctly, and to identify errors, erasures or insertions while decoding. The methods to identify these situations, and the actions to be taken, are not standardized.

1.5. Definitions

1.5.1. Video Sequence

A video sequence is one or more groups of pictures over which the parameters sent in the video sequence layer do not change. Following one or more video sequences, the sequence_end_code will cause the decoder to stop decoding and signal the system.

1.5.2. Group of Pictures

A group of pictures is a series of one or more pictures that are accessible directly without reference to previous pictures in the coded sequence. In the stored stream, the first coded picture in a group of pictures is an I-picture (see section 2.2.3). Any B-pictures in the coded sequence have an earlier display time than the I-picture because pictures in the coded sequence are shuffled from their natural display order (see section ??). As an example, the following is the beginning
of a video having a group of pictures of length 9, with two B-pictures between each P-picture:

At the encoder input,

| X | 1I | 2B | 3B | 4P | 5B | 6B | 7P | X | 8B | 9B | 10I | 11B |
|---|----|----|----|----|----|----|----|---|----|----|----|----|
|   | 12B | 13P | 14B | 15B | 16P | X | 17B | 18B | 19I | 20B | 21B | 22P |
|   | 23B | 24B | 25P | X | 26B | 27B | 28I | ... | | | | |

At the encoder output, in the stored stream, and at the decoder input,

| | | X | 1I | 4P | 2B | 3B | 7P | 5B | 6B | X | 10I | 8B |
|---|---|---|----|----|----|----|----|----|----|---|----|----|
| 9B | 13P | 11B | 12B | 16P | 14B | 15B | X | 19I | 17B | 18B | 22P | |
| 20B | 21B | 25P | 23B | 24B | X | 28I | 26B | 27B | ... | | | | where the Xs mark the group of picture boundaries. Note that in this example, the first group of
pictures is two pictures shorter, since at the beginning of video coding there are no B-pictures
preceeding the first I-picture. However, there may be B-pictures preceding the first I-picture,
even for the first video sequence.

At the decoder output,

| | | | 1 | 2 | 3 | 4 | 5 | 6 | 7 | 8 |
|---|---|---|---|---|---|---|---|---|---|---|
| 9 | 10 | 11 | 12 | 13 | 14 | 15 | 16 | 17 | 18 | 19 |
| 20 | 21 | 22 | 23 | 24 | 25 | 26 | 27 | ... | | |

A sequence of a group of pictures input to the decoder may be different from the one at the encoder
output due to editing. A group of pictures may be of any length. Applications requiring random
access, fast forward play, or fast and normal reverse play must use relatively short group of
pictures. Group of pictures may also be started at scene cuts or other cases where motion
compensation is ineffective.

1.5.3. Pictures

Each picture is classified as one of three types, depending on the coding method used. Each picture
is divided into one or more slices.

An Intra-coded (I) picture is a picture which is coded using only information from a single picture.
It may be decoded individually without reference to information in past or future pictures. I-
pictures are inserted periodically to allow random access to the coded bit stream, or to provide
recovery from medium errors or numerical error accumulation.

A Predictive-coded (P) picture is a picture which is coded using motion compensated prediction from
a past I or P-picture.

A Bidirectionally predictive-coded (B) picture is a picture which is coded using motion compensated
prediction from a past and/or future I or P-picture.

A dc coded (D) picture is an intra-coded picture which contains only the DCT dc coefficient
information. The D-pictures shall be in a video sequence containing only D-pictures.

1.5.4. Slice

A slice is a series of any number of macroblocks with the order of macroblocks starting from the
upper-left of a picture and proceeding by a raster-scan order from left to right and top to bottom.
The first macroblock of the first slice must be the upper left macroblock of the picture. The first
macroblock of a slice shall not be a skipped macroblock (see clause 3.4.4). Subsequent slices can
start and end at any macroblock following the last macroblock of the previous slice, but shall not
overlap another slice. Every slice must contain one or more macroblocks. The position of slices
may change from picture to picture. The minimum number of slices in a picture is 1.

1.5.5. Macroblock

A macroblock contains a 16-pel by 16-line section of luminance component and the spatially
corresponding 8-pel by 8-line section of each chrominance component. A macroblock has 4 luminance
blocks and 2 chrominance blocks. A skipped macroblock is one for which no information is stored
(see clause 3.4.4).

1.5.6. Block

A block is 8-pel by 8-line section of a luminance or chrominance component. The order of blocks in
a macroblock is top-left, top-right, bottom-left, bottom-right block for Y, followed by Cb and Cr.
Editors note: insert a figure.

1.6. Organization of the Document

Clause 2 provides background to aid in understanding the application of the standard. Concepts and
terminology important to understanding clause 3 are also provided. Clause 3 specifies the decoder
input syntax and data element semantics, and defines the algorithm necessary to decode the data
elements and reconstruct the moving pictures. Annex A specifies the inverse discrete cosine
transform funtion by reference to the IEEE standard. Annex B contains the variable length code
tables. Annex C is not normative and contains post-processing and display considerations.

2. BACKGROUND

Editors note: The normative and non-normative information in this section needs to be more clearly
delineated.

2.1. Overview

To aid in the understanding of the specification of the stored compressed bit stream and its decoding, a sequence of pre-processing, encoding, storage, decoding and post-processing steps is described.

2.1.1. Pre-processing

The input to pre-processing is the output of an analog or uncompressed digital video storage device, or the output of an imaging device. The pre-processing function produces a series of pictures for input to the encoder. Each picture consists of three matrices of numbers: a luminance matrix (Y) and two chrominance matrices (Cr and Cb). The Y matrix must have an even number of rows and columns, and the Cr and Cb matrixes are one half the size of Y. The chromaticity of components Y, Cr and Cb is as defined in CCIR 601. Each picture represents a still image separated in time by the reciprocal of the picture rate. The picture rates may be 23.976, 24, 25, 29.97, 30, 50, 59.94 or 60 pictures per second.

2.1.2. Encoding

The encoder processes the series of pictures and produces the compressed bit stream for storage. The encoder algorithm is not standardized, and may use various means for performing operations such as motion vector estimation, quantizer scale factor control, and so forth. However, the encoder output must be such that a decoder conforming to the specifications of Section 3 will produce video suitable for the intended application. It must also regulate the number of bits produced per picture such that the decoder input buffer capacity is not exceeded for decoders with constant input rates.

2.1.3. Storage

Various streams of encoded video, encoded audio, and other data may be stored together on a storage medium. The encoded video and associated information may be edited in compressed form. The first picture in the coded stream following an editpoint is intra-coded and the last picture in an edit unit that can be displayed is not a bidirectionally predicted picture (see section XX.XX for definitions of picture type).

Access to the storage may involve remote access over a communication system. Access is assumed to be controlled by a functional unit other than the video decoder itself. This control unit accepts user commands, reads and interprets data base structure information, reads the stored information from the media, demultiplexes non-video information and passes the stored video bit stream to the video decoder. It also implements re-ordering of the video bit stream for reverse play modes.

2.1.4. Decoding

The decoder, subject to the application-dependent parameters of Section 3.1, accepts the compressed video bit stream in the syntax defined in Section 3.2, decodes the data elements according to Section 3.3, and uses the information to produce output pictures according to 3.4. Header information is also used to control the picture display order and post-processing.

2.1.5. Post-processing

The result of decoding is a series of pictures, i.e. a series of matrices in the same format as at the input to the encoder. Post-processing includes functions to convert the picture rate to the frame or field rate of the output device, to convert from the pel aspect ratio of the decoded picture to the pel aspect ratio of the output device, to interpolate lines and columns in order to size the picture to the format of the output device, and to crop or add borders to fit the shape of the output device. The output device may for example be an analog or uncompressed digital storage device, or it may be a standard 525 or 625 line television set, a high resolution personal computer or workstation display.

2.2. Description of Operational Features

Editors note: Make consistent with systems and audio parts. Informative section.

Forward play shall be provided by all systems. The other modes described in this section are medium, storage and decoder system dependent.

2.2.1. Forward Play

Intra-coded pictures are interspersed through the sequence to allow random access and to support the operational features. The positioning of these I-pictures or entry points is at the discretion of the encoder. Most of the operational features require an ability to find the I-pictures in a sequence. This can be provided either by a table of indices stored on the medium and read by the control unit, or by some other mechanism as specified in the Systems Part of the standard.

Forward play can be provided by decoding the sequence of pictures in the normal sequence as described in sub-clause 3.5.1.

B-pictures stored immediately following the first I-picture should be discarded if the group of pictures has been edited and the preceding pictures required for proper motion estimation are not available. During forward play, the decoder should examine the broken-link data element in the group of pictures header, and should also discard the B-pictures immediately following the I-picture if the linkbit is set to 1. The I-picture may be repeated to maintain synchronism with audio, or the audio may be adjusted to the display time of the video.

2.2.2. Reverse Play

It may be possible to play the sequence in reverse in a number of ways. One method is to decode each group of pictures in a forward direction and store the decoded pictures. Then the decoded pictures are displayed in reverse order. If this method is used, it is essential that the length of group of pictures be short so that the decoder picture store limitations are not exceeded. The speed that can be achieved will depend on the access time and the peak transfer rate of the medium.

2.2.3. Fast Play, Forward and Reverse

Fast play in forward and reverse directions for visual search of the sequence can be supported by the coding structure. It can be achieved by reading and decoding some or all of the I-pictures and displaying each picture for a given length of time. The speed-up factor will depend on the spacing of I-pictures, the peak transfer rate of the medium and the access time to the next I-picture.

For example, in a typical case on a 25 Hz system, I-pictures may be spaced regularly every 12 pictures. If the peak bit rate from the medium is 900 kbit/s, fast forward play at 8 times nominal speed is possible by displaying alternate I-pictures for 3 picture periods. It is only possible to retrieve alternate I-pictures in this sequence because of the limited data rate from the medium. The speed up factor is calculated as follows -- the normal duration of the material is 24 * 40 = 960 msec.; fast forward duration is 3 * 40 = 120 msec.; therefore the speed up ratio is 960 / 120 = 8.

Fast reverse play is achieved in exactly the same manner, except that the control unit reads I-pictures in the reverse order.

2.2.4. Random Access

Random Access to any image in the coded sequence is supported. Access to a given image is either a one or two stage process depending on whether the target is an I-picture or not. If the target picture is an I-picture, the decoding can begin with that picture. If the target is a P-picture or a B-picture, then decoding must begin with the I-picture beginning the group of pictures containing the target picture.

A practical limit on the time for random access to inter-coded images is set by the interval between I-pictures and the access time of the medium.

2.2.5. Pause and Freeze Picture

The capability of freezing an image is supported by the virtue of having a picture store in the decoder. Normal play can be restarted from this state.

3. SPECIFICATION OF THE CODED BIT STREAM

3.1. Application Dependent Parameters

Flexibility in parameters specifying picture rate, format, bit rate, decoder buffer size is allowed so that this video coding standard can be used for a variety of applications. However, a constrained bit stream is also defined which limits the values of these parameters to less than the maximums allowed by the syntax.

PICTURE_RATES -- The list of picture rates that the decoder will display. The list for a constrained bit steam is 23.976, 24, 25 and 30 pictures per second.

VIDEO-HEIGHT -- The maximum number of lines in a video picture. The value for a constained bit stream is 576.

VIDEO_PELS -- The maximum number of luminance pels which can be present in each video picture. The value for a constrained bit stream is 288 x 352 or 101 376.

VIDEO_PEL_RATE -- The maximum number of pels decoded per second. The value for a constrained bit stream is 101 376 x 25 or 2 534 400.

VIDEO_WIDTH -- The maximum number of pels per line in a video picture. The value for a constrained bit stream is 720.

BIT_RATE -- The bit rate R defined in Annex D in constant bit rate operation. The maximum value for a constrained bit stream is 1 856 kilobits/s.

3.2. Bit Stream Syntax Specification
3.2.1. Start Codes

Start codes are reserved bit patterns which do not otherwise occur in the video stream. All start codes are byte aligned.

| name | hexadecimal value |
|---|---|
| picture_start_code | 00000100 |
| slice_start_codes (including slice_vertical_positions) | 00000101 |
| | through |
| | 000001AF |
| reserved | 00000180 |
| reserved | 00000181 |
| user_data_start_code | 00000182 |
| sequence_start_code | 00000183 |
| sequence_error_code | 00000184 |
| extension_start_code | 00000185 |
| sequence_end_code | 00000187 |
| group_start_code | 00000188 |
| system start codes | 00000189 |
| | through |
| | 000001FF |

The use of the start codes is defined in the following syntax description with the exception of the sequence_error_code. The digital storage media interface may overwrite the bit stream with the sequence_error_code to indicate that an uncorrectable error has been detected. The decoder shall detect the sequence_error_code, and it may take some action to conceal or mitigate the effect of the error.

3.2.2. Definition of next_start_code Function

The next_start_code function removes any zero bit and zero byte stuffing and locates the next start code.

```
next_start_code() {                    ← If (nextbits() == '0000 0000 0000 0000 0')
    while ( !bytealigned() )
        zero_bit                                            1      "0"
    while ( nextbit() != 0x000001 )
        zero_byte      ← ?                                  8      "00000000"
}
```

3.2.3. Video Sequence Layer

```
video_sequence() {
do {
    next_start_code()
    sequence_start_code                                     32     bslbf
    horizontal_size                                         12     uimsbf
    vertical_size                                           12     uimsbf
    pel_aspect_ratio                                        4      uimsbf
    picture_rate         / bit Rate                         4  10  uimsbf
    constrained_parameters_flag                             1      uimsbf
    load_intra_quantizer_matrix                             1
    if ( load_intra_quantizer_matrix )
        intra_quantizer_matrix[63]                          8*63   uimsbf
    load_non_intra_quantizer_matrix                         1
    if ( load_non_intra_quantizer_matrix )
        non_intra_quantizer_matrix[64]                      8*64   uimsbf
    next_start_code()
    if (nextbit() == extension_start_code ) {
        extension_start_code                                32     bslbf
        while ( nextbits () != '0000 0000 0000 0000 0000 000' )
{
            sequence_extension_byte                         8
        }
        next_start_code()
    }
    if (nextbits() == user_data_start_code ) {
        user_data_start_code                                32     bslbf
        while ( nextbits() != '0000 0000 0000 0000 0000 000' ) {
            user_data                                       8
        }
        next_start_code()
    }
    do {
        group_of_pictures()
    } while ( nextbits() == group_start_code )

} while ( nextbits() == sequence_start_code )
sequence_end_code                                           32     bslbf
}
```

3.2.4. Group of Pictures Layer

```
group_of_pictures() { group_start_code                                        32 bits   bslbf
    time_code                                               24
    closed_gop                                              1
    broken_link                                             1
    spare                                                   5
    next_start_code()
    if ( nextbits() == extension_start_code ) {
        extension_start_code                                32        bslbf
        while ( nextbits() != '0000 0000 0000 0000 0000 000'
) {
            group_extension_byte                            8
        }
        next_start_code()
    }
    if ( nextbits() == user_data_start_code ) {
        user_data_start_code                                32        bslbf
        while ( nextbits() != '0000 0000 0000 0000 0000
0001" ) {
            user_data                                       8
        }
        next_start_code()
    }
```

```
do {
    pictures()
    } while ( nextbits() == picture_start_code )
}
```

3.2.5. Picture Layer

```
pictures() {
    picture_start_code                                      32 bits     bslbf
    temporal_reference                                      10          uimsbf
    picture_coding_type                                     3           uimsbf
    buffer_fullness                                         16          uimsbf
    time_stamp_flag                                         1
    if ( time_stamp_flag )
        time_stamp                                          36          bslbf
        if ( picture_coding_type == 2 || picture_coding_type ==
3) {
            full_pel_forward_vector                         1
            forward_f                                       3           uimsbf
        }
        if ( picture_coding_type == 3 ) {
            full_pel_backward_vector                        1
            backward_f                                      3
        }
        while ( nextbits() == "1" ) {
            extra_bit_picture                               1
            extra_information_picture                       8
        }
        extra_bit_picture                                   1           "0"
        next_start_code()

if (nextbits() == extension_start_code){
            extension_start_code                            32          bslbf
            while ( nextbits() != '0000 0000 0000 0000 0000 000'
) {
                picture_extension_byte                      8
            }
            next_start_code()
        }
        if ( nextbits() == user_data_start_code ) {
            user_data_start_code                            32          bslbf
            while ( nextbits() != '0000 0000 0000 0000 0000
0001" ) {
                user_data                                   8
            }
            next_start_code()
        }
        do {
            slices()
        } while ( nextbits() == slice_start_code )
}
```

3.2.6. Slice Layer

```
slices() { slice_start_code                                        32 bit      bslbf
    quantizer_scale                                         5           uimsbf
    while ( nextbits() == "1" ) {
        extra_bit_slice                                     1
        extra_information_slice                             8
    }
    extra_bit_slice                                         1           "0"
    do {
        macroblocks()
    } while ( nextbits() != '0000 0000 0000 0000 0000 000'
}
    next_start_code()
}
```

3.2.7. Macroblock Layer

```
macroblocks() {
        while ( nextbits() == '0000 0001 111' )
            macroblock_stuffing                              11 bits         vlclbf
        while ( nextbits() == '0000 0001 000' )
            macroblock_escape                                11              vlclbf
        macroblock_address_increment                         1-11            vlclbf
        macroblock_type                                      1-8             vlclbf
        if ( macroblock_quant )
            quantizer_scale                                  5               uimsb
        if ( macroblock_motion_forward ) {
            motion_horizontal_forward                        1-14            vlclbf
            motion_vertical_forward                          1-14            vlclbf
        }
        if ( macroblock_motion_backward ) {
            motion_horizontal_backward                       1-14            vlclbf
            motion_vertical_backward                         1-14            vlclbf
        }
        if ( macroblock_pattern)
            coded_block_pattern                              3-9             vlclbf
        for ( i=0; i<6; i++ )
            blocks( i )
        if ( picture_coding_type = 4 )
            end_of_macroblock                                1               "1"
}
```

3.2.8. Block Layer

```
blocks( i ) {
    if ( pattern_code[i] ) {
        if ( macroblock_intra ) {
            if ( i<4 ) {
                dct_dc_size_luminance                        2-6             vlclbf
                if(dct_dc_size_luminance != 0)
                    dct_dc_differential                      1-8             uimsbf
                }
            else {
                dct_dc_size_chrominance                      2-7             vlclbf
                if(dct_dc_size_chrominance !=0)
                    dct_dc_differential                      1-8             uimsbf
                }
            }
        }
        else {
            dct_coeff_first                                  2-28            vlclbf
        }
        if ( picture_coding_type != 4 ) {
            while ( nextbits() != "10")
                dct_coeff_next                               2-28            vlclbf
            end_of_block                                     2               "10"
        }
    }
}
```

3.3. Semantic Meaning and Use of Retrieved Data Elements Specification

3.3.1. Video Sequence Layer sequence_start_code -- The sequence_start_code is the bit string 0000 01B3 in hexadecimal. It identifies the beginning of sequence data.

horizontal_size -- The horizontal_size is the width of the displayable part of each luminance picture in pels. The width of the encoded luminance picture in macroblocks, mb_width, is (horizontal_size+15)/16. The displayable part of the picture is left-aligned in the encoded picture.

vertical_size -- The vertical_size is the height of the displayable part of each luminance picture in pels.
The height of the encoded luminance picture in macroblocks, mb_height, is (vertical_size+15)/16. The displayable part of the picture is top-aligned in the encoded picture.

pel_aspect_ratio -- This is an index to the following table of pel aspect ratios.

| pel aspect ratio | height/width |
|---|---|
| 0000 | forbidden |
| 0001 | 1 |
| 0010 | CCIR 601, 525 line |
| 0011 | CCIR 601, 625 line |
| 0100 | compromise 525/625 aspect ratio |
| ... | reserved |
| 1111 | reserved | picture_rate -- This is an index to the following table of picture rates. The reciprocal of the picture rate is the real time interval between the first and each successive picture in the video sequence. The interval between receiving the sequence_start_code and the actual display of the next picture is decoder implementation dependent. Also, the interval between receiving the group_start_code and the actual display of the next picture is decoder implementation dependent.

| picture rate | pictures per second |
|---|---|
| 0000 | forbidden |
| 0001 | 23.976 |
| 0010 | 24 |
| 0011 | 25 |
| 0100 | 29.97 |
| 0101 | 30 |
| 0110 | 50 |
| 0111 | 59.94 |
| 1000 | 60 |
| ... | reserved |
| 1111 | reserved | bit_rate -- this is an integer giving the value of R for the BV of annex D in units of 100x bits/s. The zero is not allowed. 1023 identifies Variable bit rate operations.

constrained_parameters_flag -- This is a one-bit flag which is set to "1" if the sequence parameters meet a fixed set of constraints through the next sequence_end_code. The constraints are as follows:
horizontal_size <= 720 pels,
vertical_size <= 576 pels,
horizontal_size * vertical_size <= 288 * 352,
video_pel_rate <= 2 534 400, and
picture_rate <= 30 frames per second.
Moreover, if constrained_parameters_flag is set, then the bit stream satisfies the buffer verifier of Annex D for some bitrate R obeying R <= 1 856 kilobits/s. D-pictures (dc intra-coded) shall not be present if the constrained_parameter_flag is set.

load_intra_quantizer_matrix -- This is a one-bit flag which is set to "1" if a quantizer_matrix for use in intra-coded macroblocks follows in the group of pictures header.

intra_quantizer_matrix -- This is a list of 63 8-bit unsigned integers stored most significant bit first. The new values, stored in the zigzag scanning order shown in the clause on macroblock decoding, replace the default values shown in the same clause for decoding of intra-coded macroblocks. The value for intra_quant[0][0] is not sent, since intra_quant[0][0] is not used. For 8-bit unsigned integer, "0000 0000" shall not be used. The new values shall be in effect until the beginning of the next picture sequence.

load_non_intra_quantizer_matrix -- This is a one-bit flag which is set to "1" if a quantizer_matrix for use in non-intra macroblocks follows in the group of pictures header.

non_intra_quantizer_matrix -- This is a list of 64 8-bit unsigned integers stored most significant bit first. The new values, stored in the zigzag scanning order shown in the clause on macroblock decoding, replace the default values shown in the same clause for decoding of non-intra-macroblocks. For 8-bit unsigned integer, "0000 0000" shall not be used. The new values shall be in effect until the beginning of the next picture sequence.

extension_start_code -- The extension_start_code is the bit string 000001B5. It identifies the beginning of extension data. The extension data continue until receipt of another start code.

sequence_extension_byte -- To permit ISO to specify future backward compatible extensions. The sequence extension data shall not contain a string of 23 or more zeros.

sequence_end_code -- The sequence_end_code is the bit string 000001B7 in hexadecimal. It terminates one or more video sequences. The decoder shall leave the last decoded picture on the display.

user_data_start_code -- The user_data_start_code is the bit string 000001B2 in hexadecimal. It identifies the beginning of user data. The user data coninues until receipt of another start code.

user_data -- The user_data is defined by the users for their specific applications. The user data shall not contain a string of 23 or more zeros.

3.3.2. Group of Pictures Layer group_start_code -- The group_start_code is the bit string 000001B8 in hexadecimal. It identifies the beginning of a group of pictures.

time_code -- This is a 24 bit flag which is a consecutive data consisting of time_code_hours, time_code_minutes, spare, time_code_seconds, and time_code_pictures. A unit of time_code_pictures is a number of pictures in a second given by picture_rate. The time_code shows the elapsed time between the picture in the group of pictures which has the temporal reference 0 and the first picture of a earlier reference group of pictures, which also has the temporal_reference 0. The time codes may be recalculated during editing. The fields of the time code can be used as specified for SMPTE time codes.

| time code | range of value | bits | |
|---|---|---|---|
| drop_frame_flag | | 1 | |
| time_code_hours | 0 - 23 | 5 | |
| | | uimsbf | |
| time_code_minutes | 0 - 59 | 6 | |
| spare | 1 | 1 | "1" |
| time_code_seconds | 0 - 59 | 6 | |
| time_code_pictures | 0 - 63 | 6 | | closed_gop -- This is a one-bit flag which is set to "1" if the group of pictures has been encoded without prediction links to the previous group of pictures. The decoder shall not display all B-pictures stored immediately following the I-picture if forward play starts with a group of pictures in which closed_gop is "0". In this case, the P-picture in the previous group of pictures is not available in the decoder's memory, so any frames predicted from it shall ~~be discarded~~ not be displayed.

broken_link -- This is a one-bit flag which is initially set to '0' after encoding. The editor will set the broken_link flag to "1", if the closed_gop flag is "0" and if the original previous group of pictures has been replaced by other data after editing. The editor shall never set the broken_link flag if the closed_gop flag is "1". In this case, prediction links to other group of pictures do not exist, so they cannot be broken. The decoder shall ~~discard~~ not display all B-pictures stored immediately following the I-picture if the broken_link flag is "1".

extension_start_code -- See 3.3.1.

group_extension_byte -- To be defined.

3.3.3. Picture Layer picture_start_code -- The picture_start_code is the bit string '0000 0000 0000 0000 0000 0001 0000 0000'.

temporal_reference -- The temporal_reference is an unsigned integer. The temporal_reference indicates the order of the pictures at the encoder input. It is formed from the last stored temporal_reference by adding the difference between the time sequence position of the last picture stored and the time sequence position of the current picture, modulo 1024. The temporal_reference is reset to 0 for the first encoded picture in a group of pictures. For a group of pictures, the temporal references of the pictures shall be from 0 to N (modulo 1024) without omissions. Pictures shall be received at the decoder in the correct decoding order, e.g. adjacent B-pictures shall be in display order. As an example, the sequence of 2I, 0B, 1B, 5P, 3B, 4B, 8P, 6B, 7B, 11P, 9B, 10B, 14P, 12B, 13B is a legitimate group of pictures of length 15. Note that since the pictures are transmitted in the order encoded, which also corresponds to the order of decoding (but not of display), the pictures stored following the I-picture are the B-pictures occurring prior to the I-picture. For the first group of pictures in a video sequence, B-pictures immediately following an I-picture may or may not exist. As an example, the sequence of 0I, 3P, 1B, 2B, 6P, 4B, 5B, ... is a legitimate first group of pictures in a video sequence. When a group of pictures is removed from a video sequence by editing, the B-pictures associated with the previous group shall be not displayed by the decoder unless the closed_gop is 1, since the preceding P-picture is no longer available for their decoding. This situation is indicated by the broken_link and closed_gop in the group of pictures header.

picture_coding_type -- The picture_coding_type identifies whether a picture is an intra-coded picture(I), predictive-coded picture(P), bidirectionally predictive-coded picture(B), or intra-coded with only dc coefficients (D) according to the following table. D-pictures shall never be included in the same video sequence as the other picture coding types.

| picture_coding_type | coding method |
|---|---|
| 000 | reserved |
| 001 | intra-coded (I) |
| 010 | predictive-coded (P) |
| 011 | bidirectionally-predictive (B) |
| 100 | dc intra-coded (D) |
| 101 | reserved |
| ... | ... |
| 111 | reserved | buffer_fullness -- For constant bit rate operation, the buffer fullness is needed to set the initial decoder buffer occupancy at the beginning of play so that the decoder buffer does not over or underflow. The buffer fullness reflects the state of the encoder's buffer verifier (see Annex D) at the time it is written into the video stream by the encoder. Buffer fullness for the Nth picture is defined as:
   buffer_fullness(N) = (T + bN / R) * 90000.
where:
   T = 1 / frame rate
   bN = buffer occupancy immediately before frame N is removed from the buffer verifier buffer
   R = target bit rate (as defined in Annex D)

time_stamp_flag -- A one bit flag which is set to "1" if the time stamp follows in the bit stream.

time_stamp -- A thirty six bit field consisting of a one bit initialization flag, 17 bits of the most significant part of the time value, a "1" bit, 16 bits of the least significant part of the time value, and a "1" bit. When the initialization flag is 0, the difference between it's time value and the time value of the previous time stamp is equal to the time difference (measured in units of 1/90000 seconds) between the time of digitazation of the associated samples. When the initalization flag is 1, there is no relationship between the value of the time stamp and the previous time stamp in the stream. See system part of the standard.

full_pel_forward_vector -- If set to "1", then the motion vector values decoded from the tables 84a through 84f are multiplied by 2 before they are used in the equations of clause 3.4.

forward_f -- An unsigned integer indicating which of tables 84a through 84f shall be used for decoding the forward motion vectors in this picture.

full_pel_backward_vector -- If set to "1", then the motion vector values decoded from the tables 84a through 84f are multiplied by 2 before they are used in the equations of clause 3.4.

backward_f -- An unsigned integer indicating which of tables 84a through 84f shall be used for decoding the backward motion vectors in this picture.

extra_bit_picture -- A bit indicates the presence of the following extra information. If extra_bit_picture is set to "1", extra_information_picture will follow it. If it is set to "0", there is no data following it.

extra_information_picture -- A byte which will be specified for future application by ISO.

extension_start_code -- See 3.3.1.

picture_extension_byte -- To be defined.

3.3.4. Slice Layer slice_start_code -- The slice_start_code is the bit string 000001 in hexadecimal followed by a slice_vertical_position in the range 01 through AF hexadecimal.

slice_vertical_position -- This is the last 8 bits of the slice_start_code. It is an unsigned integer giving the vertical position in macroblock units of the first non-skipped macroblock in the slice (See 3.3.5, macroblock_address_increment, for definition of non-skipped macroblock). Slice_vertical_position begins at 1 if there is a non-skipped macroblock in the first macroblock row. Some slices may have the same slice_vertical_position, since slices may start or finish anywhere. The maximum value of slice_vertical_position is 248.

quantizer_scale -- An unsigned integer in the range 1 to 31 used to scale the reconstruction level of the decoded DCT coefficient levels.

extra_bit_slice -- A bit indicates the presence of the following extra information. If extra_bit_slice is set to "1", extra_information_slice will follow it. If it is set to "0", there is no data following it.

extra_information_slice -- A byte which will be specified for future application by ISO.

3.3.5. Macroblock Layer macroblock_stuffing -- This is a fixed bit string "0000 0001 111" which can be inserted by the encoder to increase the bit rate to that required of the storage or transmission medium. It is discarded by the decoder.

macroblock_escape -- This is a fixed bit string "0000 0001 000" which is used when the difference between the macroblock_address of two coded macroblocks exceeds 33, the largest macroblock_address_increment. It causes the macroblock_address to be incremented by 33 and the next bits to be interpreted as another macroblock_escape or macroblock_address_increment. Since skipped macroblocks are not permitted in I-pictures, macroblock_escape can only be used for the first macroblock of a slice.

macroblock_address_increment -- Under some conditions (See 3.4.4 for details), no information appears in the bit stream concerning one or more consecutive macroblocks in a slice. Such macroblocks are referred to as skipped macroblocks. Macroblock_address_increment is a variable length coded integer as per Annex B, Table B1, which indicates the position of the current macroblock with respect to the last non-skipped macroblock. The absolute position of the current macroblock in the picture, macroblock_address, is found by adding macroblock_address_increment to the position of the last non-skipped macroblock, previous_macroblock_address. The value of the macroblock_address of first macroblock in a picture is 0.

When a slice begins, the previous_macroblock_address is reset to point to the right hand macroblock in the row preceeding the start of the slice, as follows:

previous_macroblock_address = (slice_vertical_position - 1) * mb_width - 1;

The position of the first macroblock in the slice, macroblock_address, is then computed by adding to previous_macroblock_address 33 for each optional macroblock_escape plus the decoded value of the macroblock_address_increment contained in the first macroblock layer received.

The spatial position in macroblock units of a macroblock in the picture (mb_row, mb_col) can be computed from macroblock_address as follows:

mb_row = macroblock_address / mb_width ;
mb_column = macroblock_address % mb_width ;

where mb_width is the number of macroblocks in one row of the picture. Note that the upper-most row in the picture corresponds to mb_row = 0, and the left edge corresponds to mb_col = 0. Macroblock_address_increment is used for all three types of pictures, intra-coded (I), predictive-coded (P), and bidirectionally predictive-coded (B).

macroblock_type -- Variable length coded indicator which indicates the method of coding and content of the macroblock according to the tables B2a through B2c.

macroblock_quant -- Derived from macroblock_type.

macroblock_motion_forward -- Derived from macroblock_type.

macroblock_motion_backward -- Derived from macroblock_type.

macroblock_pattern -- Derived from macroblock_type.

macroblock_intra -- For intra-coded pictures macroblock_intra = 1. For bidirectionally predictive-coded and predictive coded pictures it is derived from macroblock_type.

quantizer_scale -- An unsigned integer in the range 1 to 31 used to scale the reconstruction level of the retrieved DCT coefficient levels. The presence of quantizer_scale is determined from macro_block type.

motion_horizontal_forward -- Horizontal motion vector data coded in half pel units according to table B4 in Annex B. A positive value indicates that the referenced area of the past picture is to the right of the macroblock in the coded picture.

motion_vertical_forward -- Vertical motion vector data coded in half pel units according to table B4 in Annex B. A positive value indicates that the referenced area of the past picture is below the macroblock in the coded picture.

motion_horizontal_backward -- Horizontal motion vector data coded in half pel units according to table B4 in Annex B. A positive value indicates that the referenced area of the future picture is to the right of the macroblock in the coded picture.

motion_vertical_backward -- Vertical motion vector data coded in half pel units according to table B4 in Annex B. A positive value indicates that the referenced area of the future picture is below the macroblock in the coded picture.

coded_block_pattern -- The variable cbp is derived from the coded_block_pattern using the variable length code table B3 in Annex B. Then the pattern_code[i] for i=0 to 5 is derived from cbp using the following:

```
pattern_code[i] = 0;
if ( cbp & (1<<(5-i)) ) pattern_code[i] = 1;
if ( block_type_intra ) pattern_code[i] = 1 ;
``` pattern_code[0] -- If 1, then the upper left luminance block is to be received in this macroblock.

pattern_code[1] -- If 1, then the upper right luminance block is to be received in this macroblock.

pattern_code[2] -- If 1, then the lower left luminance block is to be received in this macroblock.

pattern_code[3] -- If 1, then the lower right luminance block is to be received in this macroblock..

pattern_code[4] -- If 1, then the chrominance difference block Cb is to be received in this macroblock.

pattern_code[5] -- If 1, then the chrominance difference block Cr is to be received in this macroblock.

3.3.6. Block Data dct_dc_size_luminance -- The number of bits in the following dct_dc_differential code, dct_dc_size, is derived according to the VLC table B5a.

dct_dc_size_chrominance -- The number of bits in the following dct_dc_differential code, dct_dc_size, is derived according to the VLC table B5b.

dct_dc_differential -- A variable length unsigned integer. If dct_dc_size is zero, then dct_dc_differential is not present in the bit stream, and the first element of the zigzag-scanned quantized dct coefficient list, dct_zz[0], is equal to 0. If dct_dc_size is greater than zero, then dct_zz[0] is computed as follows from dct_dc_differential as follows:

```
if ( dct_dc_differential & ( 1 << size-1 ) ) dct_zz[0] = dct_dc_differential ;
else dct_zz[0] = ( -1 << (size) ) | (dct_dc_differential+1) ;
```

| example for dct_dc_size=3 ||
| dct_dc_differential | dct_zz[0] |
| --- | --- |
| 000 | -7 |
| 001 | -6 |
| 010 | -5 |
| 011 | -4 |
| 100 | 4 |
| 101 | 5 |
| 110 | 6 |
| 111 | 7 | dct_coeff_first -- A variable length code according to Table B5c in Annex B for the first coefficient. The zigzag-scanned quantized dct coefficient list is updated as follows.

```
i = run ;
if ( s == 0 ) dct_zz[i] = level ;
if ( s == 1 ) dct_zz[i] = - level ;
``` dct_coeff_next -- A variable length code according to Table B5c in Annex B for coefficients following the first retrieved. The zigzag-scanned quantized dct coefficient list is updated as follows.

```
i = i + run +1 ;
if ( s == 0 ) dct_zz[i] = level ;
if ( s == 1 ) dct_zz[i] = - level ;
```

3.4. Macroblock Decoding
3.4.1. Intra-coded Macroblocks

In I-pictures all blocks are intra-coded and transmitted. In P-pictures and B-pictures, some macroblocks may be intra-coded as identified by macroblock_type. Thus, macroblock_intra identifies the intra_coded macroblocks.

The discussion of semantics has defined mb_row and mb_column, which locate the macroblock in the picture. The definitions of dct_dc_differential, dct_coeff_first, and dct_coeff_next have also defined the zigzag-scanned quantized dct coefficient list, dct_zz[]. Each dct_zz[] is located in the macroblock as defined by pattern_code[].

Define dct_recon[8][8] to be the matrix of reconstructed dct coefficients, where the first index identifies the row and the second the column of the matrix. Define dct_dc_past to be the dct_recon[0][0] of the most recently decoded intra-coded block.

Define intra_quant[8][8] to be the quantizer matrix, with the following values unless overwritten by intra_quantizer_matrix:

|   8*  |  16  |  19  |  22  |  26  |  27  |  29  |  34  |
|-------|------|------|------|------|------|------|------|
|  16   |  16  |  22  |  24  |  27  |  29  |  34  |  37  |
|  19   |  22  |  26  |  27  |  29  |  34  |  34  |  38  |
|  22   |  22  |  26  |  27  |  29  |  34  |  37  |  40  |
|  22   |  26  |  27  |  29  |  32  |  35  |  40  |  48  |
|  26   |  27  |  29  |  32  |  35  |  40  |  48  |  58  |
|  26   |  27  |  29  |  34  |  38  |  46  |  56  |  69  |
|  27   |  29  |  35  |  38  |  46  |  56  |  69  |  83  |

\* intra_quantizer_matrix[0][0] is used in the inverse quantizer calculations for simplicity of description, but the result is overwritten by the subsequent calculation for the dc coefficient.

Define non_intra_quant[8][8] to be the quantizer matrix, with the following values unless overwritten by non_intra_quantizer_matrix:

|  16  |  16  |  16  |  16  |  16  |  16  |  16  |  16  |
|------|------|------|------|------|------|------|------|
|  16  |  16  |  16  |  16  |  16  |  16  |  16  |  16  |
|  16  |  16  |  16  |  16  |  16  |  16  |  16  |  16  |
|  16  |  16  |  16  |  16  |  16  |  16  |  16  |  16  |
|  16  |  16  |  16  |  16  |  16  |  16  |  16  |  16  |
|  16  |  16  |  16  |  16  |  16  |  16  |  16  |  16  |
|  16  |  16  |  16  |  16  |  16  |  16  |  16  |  16  |
|  16  |  16  |  16  |  16  |  16  |  16  |  16  |  16  |

Define scan[8][8] to be the matrix defining the zigzag scanning sequence as follows:

|  0  |  1  |  5  |  6  | 14  | 15  | 27  | 28  |
|-----|-----|-----|-----|-----|-----|-----|-----|
|  2  |  4  |  7  | 13  | 16  | 26  | 29  | 42  |
|  3  |  8  | 12  | 17  | 25  | 30  | 41  | 43  |
|  9  | 11  | 18  | 24  | 31  | 40  | 44  | 53  |
| 10  | 19  | 23  | 32  | 39  | 45  | 52  | 54  |
| 20  | 22  | 33  | 38  | 46  | 51  | 55  | 60  |
| 21  | 34  | 37  | 47  | 50  | 56  | 59  | 61  |
| 35  | 36  | 48  | 49  | 57  | 58  | 62  | 63  |

Define past_intra_address as the macroblock_address of the last intra-coded macroblock within the slice. It is reset to -2 at the beginning of each slice.

Then dct_recon[8][8] is computed by any means equivalent to the following procedure for the first luminance block:

```
for (m=0; m<8; m++) {
        for (n=0; n<8; n++) {
                i = scan[m][n] ;
                        dct_recon[m][n] = ( 2 * dct_zz[i] * quantizer_scale *
intra_quant[m][n] ) /16 ;
                if ( ( dct_recon[m][n] & 1 ) == 0 )
                        dct_recon[m][n] = dct_recon[m][n] - Sign(dct_recon[m][n]) ;
                if (dct_recon[m][n] > 2047) dct_recon[m][n] = 2047 ;
                if (dct_recon[m][n] < -2048) dct_recon[m][n] = -2048 ;
                if ( dct_zz[i] == 0 )
                        dct_recon[m][n] = 0 ;
                }
        }
        dct_recon[0][0] = dct_zz[0] * 8 ;
        if ( ( macroblock_address - past_intra_address > 1) )
                dct_recon[0][0] = 128 * 8 + dct_recon[0][0] ;
        else
                dct_recon[0][0] = dct_dc_y_past + dct_recon[0][0] ;
        dct_dc_y_past = dct_recon[0][0] ;
```

For the following luminance blocks in the macroblock, in the order of the pattern_code list::

```
for (m=0; m<8; m++) {
        for (n=0; n<8; n++) {
                i = scan[m][n] ;
                        dct_recon[m][n] = ( 2 * dct_zz[i] * quantizer_scale *
```

```
                         intra_quant[m][n] ) /16 ;
                                      if ( ( dct_recon[m][n] & 1 ) == 0 )
                                              dct_recon[m][n] = dct_recon[m][n] - Sign(dct_recon[m][n]) ;
                                      if (dct_recon[m][n] > 2047)  dct_recon[m][n] = 2047 ;
                                      if (dct_recon[m][n] < -2048) dct_recon[m][n] = -2048 ;
                                      if ( dct_zz[i] == 0 )
                                              dct_recon[m][n] = 0 ;
                                      }
                      }
              dct_recon[0][0] = dct_dc_y_past + dct_zz[0] * 8 ;
              dct_dc_y_past = dct_recon[0][0] ;

For the chrominance Cb block, if present in the macroblock:

for (m=0; m<8; m++) {
              for (n=0; n<8: n++) {
                     i = scan[m][n] ;
                     dct_recon[m][n] = ( 2 * dct_zz[i] * quantizer_scale * intra_quant[m][n] )
/16 ;
                     if ( ( dct_recon[m][n] & 1 ) == 0 )
                             dct_recon[m][n] = dct_recon[m][n] - Sign(dct_recon[m][n]) ;
                     if (dct_recon[m][n] > 2047)  dct_recon[m][n] = 2047 ;
                     if (dct_recon[m][n] < -2048) dct_recon[m][n] = -2048 ;
                     if ( dct_zz[i] == 0 )
                             dct_recon[m][n] = 0 ;
                     }
              }
       dct_recon[0][0] = dct_zz[0] * 8 ;
       if ( ( macroblock_address - past_intra_address > 1 ) )
              dct_recon[0][0] = 128 * 8 + dct_recon[0][0] ;
       else
              dct_recon[0][0] = dct_dc_cb_past + dct_recon[0][0] ;
       dct_dc_cb_past = dct_recon[0][0] ;

For the chrominance Cr block, if present in the macroblock:
       for (m=0; m<8; m++) {
              for (n=0; n<8: n++) {
                     i = scan[m][n] ;
                     dct_recon[m][n] = ( 2 * dct_zz[i] * quantizer_scale * intra_quant[m][n] )
/16 ;
                     if ( ( dct_recon[m][n] & 1 ) == 0 )
                             dct_recon[m][n] = dct_recon[m][n] - Sign(dct_recon[m][n]) ;
                     if (dct_recon[m][n] > 2047)  dct_recon[m][n] = 2047 ;
                     if (dct_recon[m][n] < -2048) dct_recon[m][n] = -2048 ;
                     if ( dct_zz[i] == 0 )
                             dct_recon[m][n] = 0 ;
                     }
              }
       dct_recon[0][0] = dct_zz[0] * 8 ;
       if ( ( macroblock_address - past_intra_address > 1 ) )
              dct_recon[0][0] = 128 * 8 + dct_recon[0][0] ;
       else
              dct_recon[0][0] = dct_dc_cr_past + dct_recon[0][0] ;
       dct_dc_cr_past = dct_recon[0][0] ;

After all the blocks in the macroblock are processed:

past_intra_address = macroblock_address ;
```

Once the dct coefficients are reconstructed, the inverse DCT transform defined in Annex A is applied to obtain the inverse transformed pel values in the range [0, 255]. The pel values are placed in the luminance and chrominance matrices in the positions defined by mb_row , mb_column, and the pattern_code list.

3.4.2. Predictive-coded Macroblocks

Predictive-coded macroblocks are decoded in two steps. First, the value of the forward motion vector for the macroblock is reconstructed and a prediction macroblock is formed, as detailed below. Second, the DCT coefficient information stored for some or all of the blocks is decoded, inverse DCT transformed, and added to the prediction macroblock.

Let recon_right_for and recon_down_for be the reconstructed horizontal and vertical components of the motion vector for the current macroblock, and recon_right_for_prev and recon_down_for_prev be the reconstructed motion vector for the previous predictive-coded macroblock. If this is the first macroblock in the slice, or if the last macroblock decoded contained no motion vector information, then recon_right_for_prev and recon_down_for_prev shall be set to zero.

If forward motion vector data exists for the current macroblock, the following procedure is used to reconstruct the motion vector. Decoded values right_little, right_big, down_little, and down_big are found from the appropriate Table B4(a)-(f) in Annex B. Then the motion vector in half-pel units is reconstructed as follows:

```
       max = ( 16 * forward_f ) - 1 ;
       min = ( -16 * forward_f ) ;

new_vector = recon_right_for_prev + right_little ;
       if ( new_vector <= max && new_vector >= min )
                     recon_right_for = recon_right_for_prev + right_little ;
       else
```

```
        recon_right_for = recon_right_for_prev + right_big ;
if ( full_pel_forward_vector )  recon_right_for = recon_right_for << 1 ;
recon_right_for_prev = recon_right_for ;

new_vector = recon_down_for_prev + down_little ;
if ( new_vector <= max && new_vector >= min )
```

Draft: Subject to further change.
Month/Day/Year 9/14/90            20

```
                recon_down_for = recon_down_for_prev + down_little ;
        else
                recon_down_for = recon_down_for_prev + down_big ;
        if ( full_pel_forward_vector )  recon_down_for = recon_down_for << 1 ;
        recon_down_for_prev = recon_down_for ;
```

The motion vectors in whole pel units for the macroblock, right_for and down_for, and the half pel unit flags, right_half_for and down_half_for, are computed as follows:

| for luminance | for chrominance |
|---|---|
| right_for = recon_right_for >> 1 ; <br> down_for = recon_down_for >> 1 ; <br> right_half_for = recon_right_for - 2*right_for ; <br> down_half_for = recon_down_for - 2*down_for ; | right_for = ( recon_right_for / 2 ) >> 1 ; <br> down_for = ( recon_down_for / 2 ) >> 1 ; <br> right_half_for = recon_right_for/2 - 2*right_for ; <br> down_half_for = recon_down_for/2 - 2*down_for; |

Motion vectors leading to references outside a reference picture's boundaries are not allowed.

Defining pel_past[][] as the pels of the past picture referenced by the forward motion vector, and pel[][] as the pels of the picture being decoded, then:

```
        if ( ! right_half_for && ! down_half_for )   pel[i][j] = pel_past[i+down_for][j+right_for]
;

if ( ! right_half_for &&   down_half_for )   pel[i][j] =
                ( pel_past[i+down_for][j+right_for] + pel_past[i+down_for+1][j+right_for] ) // 2 ;

if (   right_half_for && ! down_half_for )   pel[i][j] =
                ( pel_past[i+down_for][j+right_for] + pel_past[i+down_for][j+right_for+1] ) // 2 ;

if (   right_half_for &&   down_half_for )   pel[i][j] =
                ( pel_past[i+down_for][j+right_for]    +  pel_past[i+down_for+1][j+right_for]   +
                  pel_past[i+down_for][j+right_for+1]  +  pel_past[i+down_for+1][j+right_for+1] ) // 4
;
```

The DCT coefficients for each block present in the macroblock are reconstructed by:
```
        for ( m=0; m<8; m++ ) {
                for ( n=0; n<8; n++ ) {
                        i = scan[m][n] ;
                        dct_recon[m][n] = ( ( (2 * dct_zz[i]) + Sign(dct_zz[i]) ) *
                                        quantizer_scale * non_intra_quant[m][n] ) / 16 ;
                        if ( ( dct_recon[m][n] & 1 ) == 0 )
                                dct_recon[m][n] = dct_recon[m][n] - Sign(dct_recon[m][n]) ;
                                if (dct_recon[m][n] > 2047)  dct_recon[m][n] = 2047 ;
                        if (dct_recon[m][n] < -2048)  dct_recon[m][n] = -2048 ;
                        if ( dct_zz[i] == 0 )
                                dct_recon[m][n] = 0 ;
                }
        }
```

Once the dct coefficients are reconstructed, the inverse DCT transform defined in Annex A is applied to obtain the inverse transformed pel values in the interval [-256, 255]. The inverse DCT pel values are added to the pel[i][j] which were computed above using the motion vectors, with the result of the addition being limited to the interval [0,255]. The location of the pels is determined from mb_row, mb_column and the pattern_code list.

3.4.3. Bidirectionally Predictive-coded Macroblocks

Bidirectionally predictive-coded macroblocks are decoded in four steps.

First, the value of the forward motion vector for the macroblock is reconstructed from the retrieved forward motion vector information, and the forward motion vector reconstructed for the previous macroblock. However, for B-coded pictures the previous reconstructed motion vectors are reset only for the first macroblock in a slice and when the last decoded macroblock was an intra-coded macroblock. If no forward motion vector data exists for the current macroblock, the motion vectors are obtained by

```
recon_right_for = recon_right_for_prev,
recon_down_for = recon_down_for_prev.
```

Second, the value of the backward motion vector for the macroblock is reconstructed from the retrieved backward motion vector information and the backward motion vector reconstructed for the previous macroblock using the same procedure as for calculating the forward motion vector in B-pictures.

The following variables result from applying the algorithm in clause 3.4.2, modified as described in the previous two paragraphs:

```
right_for, right_half_for, down_for, down_half_for
right_back, right_half_back, down_back, down_half_back
``` which define the integral and half pel value of the rightward and downward components of the forward motion vector (which references the past picture) and the backward motion vector (which references the future picture.

Third, the pels of the decoded picture are calculated. If only forward motion vector information was retrieved for the macroblock, then pel[][] of the decoded picture is calculated according to the formulas in the predictive-coded macroblock section. If only backward motion vector information was retrieived for the macroblock, then pel[][] of the decoded picture is calculated according to the formulas in the predictive-coded macroblock section, with back replacing for, and pel_future[][] replacing pel_past[][]. If both forward and backward motion vectors information are retrieved, then let pel_for[][] be the value calculated from the past picture by use of the reconstructed forward motion vector, and let pel_back[][] be the value calculated from the future picture by use of the reconstructed backward motion vector. Then the value of pel[][] is calculated by:

```
pel[][] = ( pel_for[][] + pel_back[][] ) // 2 ;
```

Fourth, the DCT coefficients for each block present in the macroblock are reconstructed by:

```
for ( m=0; m<8; m++ ) {
    for ( n=0; n<8; n++ ) {
        i = scan[m][n] ;
        dct_recon[m][n] = ( ( (2 * dct_zz[i]) + Sign(dct_zz[i]) ) *
                         quantizer_scale * non_intra_quant[m][n] ) / 16 ;
        if ( ( dct_recon[m][n] & 1 ) == 0 )
            dct_recon[m][n] = dct_recon[m][n] - Sign(dct_recon[m][n]) ;
        if (dct_recon[m][n] > 2047)  dct_recon[m][n] = 2047 ;
        if (dct_recon[m][n] < -2048) dct_recon[m][n] = -2048 ;
        if ( dct_zz[i] == 0 )
            dct_recon[m][n] = 0 ;
    }
}
```

Once the dct coefficients are reconstructed, the inverse DCT transform defined in Annex A is applied to obtain the inverse transformed pel values in the range [-256, 255]. The inverse DCT pel values are added to pel[][], which were computed above from the motion vectors, with the result of the addition being limited to the interval [0,255]. The location of the pels is determined from mb_row, mb_column and the pattern_code list.

3.4.4. Skipped Macroblocks

Some macroblocks are not stored, i.e. neither motion vector information nor DCT information is available to the decoder. These macroblocks occur when the macroblock_address_increment is greater than 1, or when there is a gap between the last macroblock of one slice and the first macroblock of the next slice. The macroblocks for which no data is stored are called "skipped macroblocks".

In I-picture, all macroblocks are coded and there is no skipped macroblock.

In P-picture, the skipped macroblock is defined to be a macroblock with a reconstructed motion vector equal to zero and no DCT coefficients.

In B-picture, the skipped macroblock is defined to have the same macroblock_type (forward, backward, or both motion vectors) as the prior macroblock, differential motion vectors equal to zero, and no DCT coefficients. In a B-picture, a skipped macroblock shall not follow an intra-coded macroblock.

3.5. Specifications Regarding Operational Features
3.5.1. Forward Play

Groups of pictures are of two types as will be illustrated for the case of two B-pictures between I or P-pictures (the numbers are the temporal_reference giving the order of display).

The first group of pictures in a sequence may be I0, P3, B1, B2, P7, B4, B5, ....

The succeeding group of pictures in a sequence may be I2, B0, B1, P5, B3, B4, ....

If the input to the decoder buffer is at a constant rate, then the decoder must delay the decoding and display of the I-picture until it is certain that the succeeding B picture can be decoded and displayed one picture interval later.

A process of decoding for forward play is as follows:

1. The retrieved data is discarded until a group of pictures header is detected.

2. The retrieved bitstream is buffered until the required input buffer occupancy is achieved.

3. The group of pictures header is processed, and the decoder is set up. This includes setting up the horizontal and vertical size, and loading the optional quantizing matrices if they are present. The closed_gop and broken_link are read and the controls are set up to discard B-pictures retrieved prior to the next P-picture, as appropriate.

4. The picture header is processed. The processing of the individual data elements is described in section 3.3.

5. Macroblocks contained in the picture are decoded as described in section 3.4. The resulting pictures are displayed in the order indicated by the temporal reference. The decoder controls post-processing according to the parameters contained in the headers.

6. The next group of pictures header or picture header are detected, and decoding continues from step 3 or step 4 respectively. Otherwise, if an end of sequence is detected, the decoder freezes the picture, and notifies the control unit.

3.5.2. Reverse Play

To perform reverse play, the group of pictures must be decoded in the forward direction, the decoded pictures stored, and then displayed in reverse order. The amount of picture storage required may be minimized by reordering the pictures, either by having the control unit read them from the media in the new order, or by reordering the pictures in the decoder's input buffer. Consider the following sequence of pictures:

Pn-3, Bn-5, Bn-4, In, Bn-2, Bn-1, Pn+3, Bn+1, Bn+2, Pn+6, Bn+4, Bn+5, Pn+9, Bn+7, Bn+8,

The pictures would be accessed and decoded in the order:

In, Pn+3, Pn+6, Pn+9, Bn+8, Bn+7, Bn+5, Bn+4, Bn+2, Bn+1,

The pictures would be displayed in the order:

Pn+9, Bn+8, Bn+7, Pn+6, Bn+5, Bn+4, Pn+3, Bn+2, Bn+1, In.

Since the B-pictures are not decoded until they are ready to be displayed, the picture storage is minimized. The pictures Bn-2, and Bn-1, would remain stored in the input buffer until the previous group of pictures up to the picture Pn-3 is decoded.

3.5.3. Fast Play, Forward and Reverse

Fast play in either direction can be achieved by accessing and decoding the group of picture header and I-pictures, possibly skipping some I-pictures.

It is also possible to support fast play by encoding a series of I-pictures specifically for that purpose. The pictures may be encoded at lower resolution, smaller size or greater distortion and at any desired speed up factor. They may be recorded in a separate file in order to simplify access to the media, and to provide a compatible audio program.

3.5.4. Skip Forward and Reverse
3.5.5. Pause and Freeze Picture
3.5.6. High-resolution Still

ANNEX A - 8x8 INVERSE DISCRETE COSINE TRANSFORM

The 8x8 inverse discrete transform shall conform to IEEE Draft Standard Specification for the Implementations of 8x8 Inverse Discrete Cosine Transform, P1180/D2, July 18, 1990, or to the succeeding IEEE draft or approved standard. Note that the use of this IDCT standard requires that intra-coded macroblocks be received periodically to control IDCT mismatch errors.

ANNEX B -- VARIABLE LENGTH CODE TABLES

Introduction
This annex contains the variable length code tables for macroblock addressing, macroblock type, macroblock pattern, motion vectors, and DCT coefficients.

B1. Macroblock Addressing

Table B1. Variable length code for macroblock_address_increment.

| macroblock_address_increment VLC code | increment value | macroblock_address_increment VLC code | increment value |
|---|---|---|---|
| 1 | 1 | 0000 0101 10 | 17 |
| 011 | 2 | 0000 0101 01 | 18 |
| 010 | 3 | 0000 0101 00 | 19 |
| 0011 | 4 | 0000 0100 11 | 20 |
| 0010 | 5 | 0000 0100 10 | 21 |
| 0001 1 | 6 | 0000 0100 011 | 22 |
| 0001 0 | 7 | 0000 0100 010 | 23 |
| 0000 111 | 8 | 0000 0100 001 | 24 |
| 0000 110 | 9 | 0000 0100 000 | 25 |
| 0000 1011 | 10 | 0000 0011 111 | 26 |
| 0000 1010 | 11 | 0000 0011 110 | 27 |
| 0000 1001 | 12 | 0000 0011 101 | 28 |
| 0000 1000 | 13 | 0000 0011 100 | 29 |
| 0000 0111 | 14 | 0000 0011 011 | 30 |
| 0000 0110 | 15 | 0000 0011 010 | 31 |
| 0000 0101 11 | 16 | 0000 0011 001 | 32 |
|  |  | 0000 0011 000 | 33 |
|  |  | 0000 0001 111 | macroblock_stuffing |
|  |  | 0000 0001 000 | macroblock_escape |

B2. Macroblock Type

Table B2a. Variable length code for macroblock_type in intra-coded pictures (I-pictures).

| VLC code | macroblock_quant |
|---|---|
| 1 | 0 |
| 01 | 1 |

Table B2b. Variable length code for macroblock_type in predictive-coded pictures (P-pictures).

| VLC code | macroblock_quant | macroblock_motion_forward | macroblock_pattern | Intra |
|---|---|---|---|---|
| 1 | 0 | 1 | 1 | 0 |
| 01 | 0 | 0 | 1 | 0 |
| 001 | 0 | 1 | 0 | 0 |
| 00001 | 0 | 0 | 0 | 1 |
| 00011 | 1 | 1 | 1 | 0 |
| 000100 | 1 | 0 | 1 | 0 |
| 000101 | 1 | 0 | 0 | 1 |

Table B2c. Variable length code for macroblock_type in bidirectionally predictive-coded pictures (B-pictures).

| VLC code | macroblock_quant | macroblock_motion_forward | macroblock_motion_backward | macroblock_pattern | Intra |
|---|---|---|---|---|---|
| 10 | 0 | 1 | 1 | 0 | 0 |
| 11 | 0 | 1 | 1 | 1 | 0 |
| 010 | 0 | 1 | 0 | 0 | 0 |
| 011 | 0 | 1 | 0 | 1 | 0 |
| 0010 | 0 | 0 | 1 | 0 | 0 |
| 0011 | 0 | 0 | 1 | 1 | 0 |
| 00001 | 0 | 0 | 0 | 0 | 1 |
| 000100 | 1 | 1 | 1 | 1 | 0 |
| 000101 | 1 | 1 | 0 | 1 | 0 |
| 0000010 | 1 | 0 | 1 | 1 | 0 |
| 0000011 | 1 | 0 | 0 | 0 | 1 |

Table B2d. Variable length code for macroblock_type in dc intra-coded pictures (D-pictures).

| VLC code | macroblock_quant |
|---|---|
| 1 | 0 |

B.3. Macroblock Pattern

Table B3. Variable length codes for coded_block_pattern.

| coded_block_pattern VLC code | cbp | coded_block_pattern VLC code | cbp |
|---|---|---|---|
| 111 | 60 | 0001 1100 | 35 |
| 1101 | 4 | 0001 1011 | 13 |
| 1100 | 8 | 0001 1010 | 49 |
| 1011 | 16 | 0001 1001 | 21 |
| 1010 | 32 | 0001 1000 | 41 |

| | |
|---|---|
| 1001 1 | 12 |
| 1001 0 | 48 |
| 1000 1 | 20 |
| 1000 0 | 40 |
| 0111 1 | 28 |
| 0111 0 | 44 |
| 0110 1 | 52 |
| 0110 0 | 56 |
| 0101 1 | 1 |
| 0101 0 | 61 |
| 0100 1 | 2 |
| 0100 0 | 62 |
| 0011 11 | 24 |
| 0011 10 | 36 |
| 0011 01 | 3 |
| 0011 00 | 63 |
| 0010 111 | 5 |
| 0010 110 | 9 |
| 0010 101 | 17 |
| 0010 100 | 33 |
| 0010 011 | 6 |
| 0010 010 | 10 |
| 0010 001 | 18 |
| 0010 000 | 34 |
| 0001 1111 | 7 |
| 0001 1110 | 11 |
| 0001 1101 | 19 |

| | |
|---|---|
| 0001 0111 | 14 |
| 0001 0110 | 50 |
| 0001 0101 | 22 |
| 0001 0100 | 42 |
| 0001 0011 | 15 |
| 0001 0010 | 51 |
| 0001 0001 | 23 |
| 0001 0000 | 43 |
| 0000 1111 | 25 |
| 0000 1110 | 37 |
| 0000 1101 | 26 |
| 0000 1100 | 38 |
| 0000 1011 | 29 |
| 0000 1010 | 45 |
| 0000 1001 | 53 |
| 0000 1000 | 57 |
| 0000 0111 | 30 |
| 0000 0110 | 46 |
| 0000 0101 | 54 |
| 0000 0100 | 58 |
| 0000 0011 1 | 31 |
| 0000 0011 0 | 47 |
| 0000 0010 1 | 55 |
| 0000 0010 0 | 59 |
| 0000 0001 1 | 27 |
| 0000 0001 0 | 39 |

B4. Motion Vectors

Table B4a. Variable length codes for motion_horizontal_forward, motion_vertical_forward, motion_horizontal_backward, and motion_vertical_backward when forward_f or backward_f is 1.

| motion VLC code | little | big |
|---|---|---|
| 0000 0011 001 | -16 | 16 |
| 0000 0011 011 | -15 | 17 |
| 0000 0011 101 | -14 | 18 |
| 0000 0011 111 | -13 | 19 |
| 0000 0100 001 | -12 | 20 |
| 0000 0100 011 | -11 | 21 |
| 0000 0100 11 | -10 | 22 |
| 0000 0101 01 | -9 | 23 |
| 0000 0101 11 | -8 | 24 |
| 0000 0111 | -7 | 25 |
| 0000 1001 | -6 | 26 |
| 0000 1011 | -5 | 27 |
| 0000 111 | -4 | 28 |
| 0001 1 | -3 | 29 |
| 0011 | -2 | 30 |
| 011 | -1 | 31 |
| 1 | 0 | |
| 010 | 1 | -31 |
| 0010 | 2 | -30 |
| 0001 0 | 3 | -29 |
| 0000 110 | 4 | -28 |
| 0000 1010 | 5 | -27 |
| 0000 1000 | 6 | -26 |
| 0000 0110 | 7 | -25 |
| 0000 0101 10 | 8 | -24 |
| 0000 0101 00 | 9 | -23 |
| 0000 0100 10 | 10 | -22 |
| 0000 0100 010 | 11 | -21 |
| 0000 0100 000 | 12 | -20 |
| 0000 0011 110 | 13 | -19 |
| 0000 0011 100 | 14 | -18 |
| 0000 0011 010 | 15 | -17 |
| 0000 0011 000 | N/A | N/A |
| N/A - These table entries are not used and should not be generated by an encoder. | | |

Table B4b. Variable length codes for motion_horizontal_forward, motion_vertical_forward, motion_horizontal_backward, and motion_vertical_backward when forward_f or backward_f is 2.

| motion VLC code (NOTE) | little | | big | |
|---|---|---|---|---|
| | b=0 | b=1 | b=1 | b=0 |
| 0000 0011 001 b | -31 | -32 | 32 | 33 |
| 0000 0011 011 b | -29 | -30 | 34 | 35 |
| 0000 0011 101 b | -27 | -28 | 36 | 37 |
| 0000 0011 111 b | -25 | -26 | 38 | 39 |
| 0000 0100 001 b | -23 | -24 | 40 | 41 |
| 0000 0100 011 b | -21 | -22 | 42 | 43 |
| 0000 0100 11 b | -19 | -20 | 44 | 45 |
| 0000 0101 01 b | -17 | -18 | 46 | 47 |
| 0000 0101 11 b | -15 | -16 | 48 | 49 |
| 0000 0111 b | -13 | -14 | 50 | 51 |
| 0000 1001 b | -11 | -12 | 52 | 53 |
| 0000 1011 b | -9 | -10 | 54 | 55 |
| 0000 111 b | -7 | -8 | 56 | 57 |
| 0001 1 b | -5 | -6 | 58 | 59 |
| 0011 b | -3 | -4 | 60 | 61 |
| 011 b | -1 | -2 | 62 | 63 |
| 1 | 0 | | | |
| 010 b | 1 | 2 | -62 | -63 |
| 0010 b | 3 | 4 | -60 | -61 |
| 0001 0 b | 5 | 6 | -58 | -59 |
| 0000 110 b | 7 | 8 | -56 | -57 |
| 0000 1010 b | 9 | 10 | -54 | -55 |
| 0000 1000 b | 11 | 12 | -52 | -53 |
| 0000 0110 b | 13 | 14 | -50 | -51 |
| 0000 0101 10 b | 15 | 16 | -48 | -49 |
| 0000 0101 00 b | 17 | 18 | -46 | -47 |
| 0000 0100 10 b | 19 | 20 | -44 | -45 |
| 0000 0100 010 b | 21 | 22 | -42 | -43 |
| 0000 0100 000 b | 23 | 24 | -40 | -41 |
| 0000 0011 110 b | 25 | 26 | -38 | -39 |
| 0000 0011 100 b | 27 | 28 | -36 | -37 |
| 0000 0011 010 b | 29 | 30 | -34 | -35 |
| 0000 0011 000 b | 31 | N/A | N/A | -33 |

NOTE - For VLC code 1, no b extension bit follows.

op,opc
```
00,000  ADD            rC = rA + rB
00,001  SUB            rC = rA - rB
00,010  AND            rC = rA & rB
00,011  ANDN           rC = rA &- rB
00,100  OR             rC = rA | rB
00,101  ORN            rC = rA |- rB
00,110  XOR            rC = rA ^ rB
00,111  XORN           rC = rA ^- rB 01,010  ST     Store (32-bit)    Mem[rA+rB] = rC
01,011  STD    Double    Mem64[rA+rB] = rC,r(C+1)
01,110  STA    Auto-increment  Mem[rB=rA+rB] = rC;
01,111  STDA   Store Double Auto-increment 10,010  LD     Load (32-bit)    rC=Mem[rA+rB]
10,011  LDD    Double   C,r(C+1)=Mem64[rA+rB]
10,110  LDA    Auto-increment  rC=Mem[rB=rA+rB]
10,111  LDDA   Load Double Auto-increment 11,010  Shift Right Logical (unsigned)     rC= rB >> rA
11,011  Shift Right Arithmetic (signed)    rC= rB >> rA
11,110  Shift Left Logical                 rC= rB << rA
``` br    branch
```
0000  BN    Never (decode J as special; J=0 nop)
1000  BA    Always
0001  BZ    Zero                              Z
1001  BNZ   Not Zero                          !Z
0010  BLE   Less or Equal (signed)  (Z or (N xor V))
1010  BGT   Greater Than (signed)   !(Z or (N xor V))
0011  BLE   Less Than (signed)      (N xor V)
1011  BGE   Greater or Equal        !(N xor V)
0100  BLEU  Less or Equal (Unsigned)  (C or Z)
1100  BGTU  Greater Than (Unsigned)   !(C or Z)
0101  BC    Less Than (Unsigned)      Carry
```

| 1101 | BNC  | Greater or Equal (Unsign) | !Carry |
|------|------|---------------------------|--------|
| 0110 | BPG  | Page cross                | (Result&070==0) |
| 1110 | BNPG | Not Page Cross            | !(Result&070==0) |
| 0111 | BV   | oVerflow                  | V |
| 1111 | BAL  | Always Long               | |

(trap to resident firmware e.g. JMP completion)

Table 84c. Variable length codes for motion_horizontal_forward, motion_vertical_forward, motion_horizontal_backward, and motion_vertical_backward when forwad_f or backward_f is 3.

| motion VLC code (NOTE) | little | | | big | | |
|---|---|---|---|---|---|---|
| | bb=0 | bb=10 | bb=11 | bb=11 | bb=10 | bb=0 |
| 0000 0011 001 bb | -46 | -47 | -48 | 48 | 49 | 50 |
| 0000 0011 011 bb | -43 | -44 | -45 | 51 | 52 | 53 |
| 0000 0011 101 bb | -40 | -41 | -42 | 54 | 55 | 56 |
| 0000 0011 111 bb | -37 | -38 | -39 | 57 | 58 | 59 |
| 0000 0100 001 bb | -34 | -35 | -36 | 60 | 61 | 62 |
| 0000 0100 011 bb | -31 | -32 | -33 | 63 | 64 | 65 |
| 0000 0100 11 bb  | -28 | -29 | -30 | 66 | 67 | 68 |
| 0000 0101 01 bb  | -25 | -26 | -27 | 69 | 70 | 71 |
| 0000 0101 11 bb  | -22 | -23 | -24 | 72 | 73 | 74 |
| 0000 0111 bb     | -19 | -20 | -21 | 75 | 76 | 77 |
| 0000 1001 bb     | -16 | -17 | -18 | 78 | 79 | 80 |
| 0000 1011 bb     | -13 | -14 | -15 | 81 | 82 | 83 |
| 0000 111 bb      | -10 | -11 | -12 | 84 | 85 | 86 |
| 0001 1 bb        | -7  | -8  | -9  | 87 | 88 | 89 |
| 0011 bb          | -4  | -5  | -6  | 90 | 91 | 92 |
| 011 bb           | -1  | -2  | -3  | 93 | 94 | 95 |
| 1                | 0   |     |     |    |    |    |
| 010 bb           | 1   | 2   | 3   | -93 | -94 | -95 |
| 0010 bb          | 4   | 5   | 6   | -90 | -91 | -92 |
| 0001 0 bb        | 7   | 8   | 9   | -87 | -88 | -89 |
| 0000 110 bb      | 10  | 11  | 12  | -84 | -85 | -86 |
| 0000 1010 bb     | 13  | 14  | 15  | -81 | -82 | -83 |
| 0000 1000 bb     | 16  | 17  | 18  | -78 | -79 | -80 |
| 0000 0110 bb     | 19  | 20  | 21  | -75 | -76 | -77 |
| 0000 0101 10 bb  | 22  | 23  | 24  | -72 | -73 | -74 |
| 0000 0101 00 bb  | 25  | 26  | 27  | -69 | -70 | -71 |
| 0000 0100 10 bb  | 28  | 29  | 30  | -66 | -67 | -68 |
| 0000 0100 010 bb | 31  | 32  | 33  | -63 | -64 | -65 |
| 0000 0100 000 bb | 34  | 35  | 36  | -60 | -61 | -62 |
| 0000 0011 110 bb | 37  | 38  | 39  | -57 | -58 | -59 |
| 0000 0011 100 bb | 40  | 41  | 42  | -54 | -55 | -56 |
| 0000 0011 010 bb | 43  | 44  | 45  | -51 | -52 | -53 |
| 0000 0011 000 bb | 46  | 47  | N/A | N/A | -49 | -50 |

NOTE - For VLC of 1, no bb extension bits follows. One or two extension bits follow the VLC as indicated in the heading.

Table B4d. Variable length codes for motion_horizontal_forward, motion_vertical_forward, motion_horizontal_backward, motion_vertical_backward when forward_f or backward_f is 4.

| motion VLC code (NOTE) | little bb= 00 | bb= 01 | bb= 10 | bb= 11 | big bb= 11 | bb= 10 | bb= 01 | bb= 00 |
|---|---|---|---|---|---|---|---|---|
| 0000 0011 001 bb | -61 | -62 | -63 | -64 | 64 | 65 | 66 | 67 |
| 0000 0011 011 bb | -57 | -58 | -59 | -60 | 68 | 69 | 70 | 71 |
| 0000 0011 101 bb | -53 | -54 | -55 | -56 | 72 | 73 | 74 | 75 |
| 0000 0011 111 bb | -49 | -50 | -51 | -52 | 76 | 77 | 78 | 79 |
| 0000 0100 001 bb | -45 | -46 | -47 | -48 | 80 | 81 | 82 | 83 |
| 0000 0100 011 bb | -41 | -42 | -43 | -44 | 84 | 85 | 86 | 87 |
| 0000 0100 11 bb | -37 | -38 | -39 | -40 | 88 | 89 | 90 | 91 |
| 0000 0101 01 bb | -33 | -34 | -35 | -36 | 92 | 93 | 94 | 95 |
| 0000 0101 11 bb | -29 | -30 | -31 | -32 | 96 | 97 | 98 | 99 |
| 0000 0111 bb | -25 | -26 | -27 | -28 | 100 | 101 | 102 | 103 |
| 0000 1001 bb | -21 | -22 | -23 | -24 | 104 | 105 | 106 | 107 |
| 0000 1011 bb | -17 | -18 | -19 | -20 | 108 | 109 | 110 | 111 |
| 0000 111 bb | -13 | -14 | -15 | -16 | 112 | 113 | 114 | 115 |
| 0001 1 bb | -9 | -10 | -11 | -12 | 116 | 117 | 118 | 119 |
| 0011 bb | -5 | -6 | -7 | -8 | 120 | 121 | 122 | 123 |
| 011 bb | -1 | -2 | -3 | -4 | 124 | 125 | 126 | 127 |
| 1 | 0 | | | | | | | |
| 010 bb | 1 | 2 | 3 | 4 | -124 | -125 | -126 | -127 |
| 0010 bb | 5 | 6 | 7 | 8 | -120 | -121 | -122 | -123 |
| 0001 0 bb | 9 | 10 | 11 | 12 | -116 | -117 | -118 | -119 |
| 0000 110 bb | 13 | 14 | 15 | 16 | -112 | -113 | -114 | -115 |
| 0000 1010 bb | 17 | 18 | 19 | 20 | -108 | -109 | -110 | -111 |
| 0000 1000 bb | 21 | 22 | 23 | 24 | -104 | -105 | -106 | -107 |
| 0000 0110 bb | 25 | 26 | 27 | 28 | -100 | -101 | -102 | -103 |
| 0000 0101 10 bb | 29 | 30 | 31 | 32 | -96 | -97 | -98 | -99 |
| 0000 0101 00 bb | 33 | 34 | 35 | 36 | -92 | -93 | -94 | -95 |
| 0000 0100 10 bb | 37 | 38 | 39 | 40 | -88 | -89 | -90 | -91 |
| 0000 0100 010 bb | 41 | 42 | 43 | 44 | -84 | -85 | -86 | -87 |
| 0000 0100 000 bb | 45 | 46 | 47 | 48 | -80 | -81 | -82 | -83 |
| 0000 0011 110 bb | 49 | 50 | 51 | 52 | -76 | -77 | -78 | -79 |
| 0000 0011 100 bb | 53 | 54 | 55 | 56 | -72 | -73 | -74 | -75 |
| 0000 0011 010 bb | 57 | 58 | 59 | 60 | -68 | -69 | -70 | -71 |
| 0000 0011 000 bb | 61 | 62 | 63 | N/A | N/A | -65 | -66 | -67 |

NOTE - For VLC of 1, no bb extension bits follow.

Table B4e. Variable length codes for motion_horizontal_forward, motion_vertical_forward, motion_horizontal_backward, motion_vertical_backward when forward_f or backward_f is 5.

| motion VLC code (NOTE) | little bbb= 00 | bbb= 01 | bbb= 10 | bbb= 110 | bbb= 111 | big bbb= 111 | bbb= 110 | bbb= 10 | bbb= 01 | bbb= 00 |
|---|---|---|---|---|---|---|---|---|---|---|
| 0000 0011 001 bbb | -76 | -77 | -78 | -79 | -80 | 80 | 81 | 82 | 83 | 84 |
| 0000 0011 011 bbb | -71 | -72 | -73 | -74 | -75 | 85 | 86 | 87 | 88 | 89 |
| 0000 0011 101 bbb | -66 | -67 | -68 | -69 | -70 | 90 | 91 | 92 | 93 | 94 |
| 0000 0011 111 bbb | -61 | -62 | -63 | -64 | -65 | 95 | 96 | 97 | 98 | 99 |
| 0000 0100 001 bbb | -56 | -57 | -58 | -59 | -60 | 100 | 101 | 102 | 103 | 104 |
| 0000 0100 011 bbb | -51 | -52 | -53 | -54 | -55 | 105 | 106 | 107 | 108 | 109 |
| 0000 0100 11 bbb | -46 | -47 | -48 | -49 | -50 | 110 | 111 | 112 | 113 | 114 |
| 0000 0101 01 bbb | -41 | -42 | -43 | -44 | -45 | 115 | 116 | 117 | 118 | 119 |
| 0000 0101 11 bbb | -36 | -37 | -38 | -39 | -40 | 120 | 121 | 122 | 123 | 124 |
| 0000 0111 bbb | -31 | -32 | -33 | -34 | -35 | 125 | 126 | 127 | 128 | 129 |
| 0000 1001 bbb | -26 | -27 | -28 | -29 | -30 | 130 | 131 | 132 | 133 | 134 |
| 0000 1011 bbb | -21 | -22 | -23 | -24 | -25 | 135 | 136 | 137 | 138 | 139 |
| 0000 111 bbb | -16 | -17 | -18 | -19 | -20 | 140 | 141 | 142 | 143 | 144 |
| 0001 1 bbb | -11 | -12 | -13 | -14 | -15 | 145 | 146 | 147 | 148 | 149 |
| 0011 bbb | -6 | -7 | -8 | -9 | -10 | 150 | 151 | 152 | 153 | 154 |
| 011 bbb | -1 | -2 | -3 | -4 | -5 | 155 | 156 | 157 | 158 | 159 |
| 1 | 0 | | | | | | | | | |
| 010 bbb | 1 | 2 | 3 | 4 | 5 | -155 | -156 | -157 | -158 | -159 |
| 0010 bbb | 6 | 7 | 8 | 9 | 10 | -150 | -151 | -152 | -153 | -154 |
| 0001 0 bbb | 11 | 12 | 13 | 14 | 15 | -145 | -146 | -147 | -148 | -149 |
| 0000 110 bbb | 16 | 17 | 18 | 19 | 20 | -140 | -141 | -142 | -143 | -144 |
| 0000 1010 bbb | 21 | 22 | 23 | 24 | 25 | -135 | -136 | -137 | -138 | -139 |
| 0000 1000 bbb | 26 | 27 | 28 | 29 | 30 | -130 | -131 | -132 | -133 | -134 |
| 0000 0110 bbb | 31 | 32 | 33 | 34 | 35 | -125 | -126 | -127 | -128 | -129 |
| 0000 0101 10 bbb | 36 | 37 | 38 | 39 | 40 | -120 | -121 | -122 | -123 | -124 |
| 0000 0101 00 bbb | -1 | 42 | 43 | 44 | 45 | -115 | -116 | -117 | -118 | -119 |
| 0000 0100 10 bbb | 46 | 47 | 48 | 49 | 50 | -110 | -111 | -112 | -113 | -114 |
| 0000 0100 010 bbb | 51 | 52 | 53 | 54 | 55 | -105 | -106 | -107 | -108 | -109 |
| 0000 0100 000 bbb | 56 | 57 | 58 | 59 | 60 | -100 | -101 | -102 | -103 | -104 |
| 0000 0011 110 bbb | 61 | 62 | 63 | 64 | 65 | -95 | -96 | -97 | -98 | -99 |
| 0000 0011 100 bbb | 66 | 67 | 68 | 69 | 70 | -90 | -91 | -92 | -93 | -94 |
| 0000 0011 010 bbb | 71 | 72 | 73 | 74 | 75 | -85 | -86 | -87 | -88 | -89 |
| 0000 0011 000 bbb | 76 | 77 | 78 | 79 | N/A | N/A | -81 | -82 | -83 | -84 |

NOTE - For VLC of 1, no bbb extension bits follow. Two or three bbb extension bits may follow as indicated in the heading.

Table 84f. Variable length codes for motion_horizontal_forward, motion_vertical_forward, motion_horizontal_backward, motion_vertical_backward when forward_f or backward_f 6.

| motion VLC code (NOTE) | little bbb=00 | bbb=01 | bbb=100 | bbb=101 | bbb=110 | bbb=111 | big bbb=111 | bbb=110 | bbb=101 | bbb=100 | bbb=01 | bbb=00 |
|---|---|---|---|---|---|---|---|---|---|---|---|---|
| 0000 0011 001 bbb | -91 | -92 | -93 | -94 | -95 | -96 | 96 | 97 | 98 | 99 | 100 | 101 |
| 0000 0011 011 bbb | -85 | -86 | -87 | -88 | -89 | -90 | 102 | 103 | 104 | 105 | 106 | 107 |
| 0000 0011 101 bbb | -79 | -80 | -81 | -82 | -83 | -84 | 108 | 109 | 110 | 111 | 112 | 113 |
| 0000 0011 111 bbb | -73 | -74 | -75 | -76 | -77 | -78 | 114 | 115 | 116 | 117 | 118 | 119 |
| 0000 0100 001 bbb | -67 | -68 | -69 | -70 | -71 | -72 | 120 | 121 | 122 | 123 | 124 | 125 |
| 0000 0100 011 bbb | -61 | -62 | -63 | -64 | -65 | -66 | 126 | 127 | 128 | 129 | 130 | 131 |
| 0000 0100 11 bbb | -55 | -56 | -57 | -58 | -59 | -60 | 132 | 133 | 134 | 135 | 136 | 137 |
| 0000 0101 01 bbb | -49 | -50 | -51 | -52 | -53 | -54 | 138 | 139 | 140 | 141 | 142 | 143 |
| 0000 0101 11 bbb | -43 | -44 | -45 | -46 | -47 | -48 | 144 | 145 | 146 | 147 | 148 | 149 |
| 0000 0111 bbb | -37 | -38 | -39 | -40 | -41 | -42 | 150 | 151 | 152 | 153 | 154 | 155 |
| 0000 1001 bbb | -31 | -32 | -33 | -34 | -35 | -36 | 156 | 157 | 158 | 159 | 160 | 161 |
| 0000 1011 bbb | -25 | -26 | -27 | -28 | -29 | -30 | 162 | 163 | 164 | 165 | 166 | 167 |
| 0000 111 bbb | -19 | -20 | -21 | -22 | -23 | -24 | 168 | 169 | 170 | 171 | 172 | 173 |
| 0001 1 bbb | -13 | -14 | -15 | -16 | -17 | -18 | 174 | 175 | 176 | 177 | 178 | 179 |
| 0011 bbb | -7 | -8 | -9 | -10 | -11 | -12 | 180 | 181 | 182 | 183 | 184 | 185 |
| 011 bbb | -1 | -2 | -3 | -4 | -5 | -6 | 186 | 187 | 188 | 189 | 190 | 191 |
| 1 | 0 | | | | | | | | | | | |
| 010bbb | 1 | 2 | 3 | 4 | 5 | 6 | -186 | -187 | -188 | -189 | -190 | -191 |
| 0010 bbb | 7 | 8 | 9 | 10 | 11 | 12 | -180 | -181 | -182 | -183 | -184 | -185 |
| 0001 0 bbb | 13 | 14 | 15 | 16 | 17 | 18 | -174 | -175 | -176 | -177 | -178 | -179 |
| 0000 110 bbb | 19 | 20 | 21 | 22 | 23 | 24 | -168 | -169 | -170 | -171 | -172 | -173 |
| 0000 1010 bbb | 25 | 26 | 27 | 28 | 29 | 30 | -162 | -163 | -164 | -165 | -166 | -167 |
| 0000 1000 bbb | 31 | 32 | 33 | 34 | 35 | 36 | -156 | -157 | -158 | -159 | -160 | -161 |
| 0000 0110 bbb | 37 | 38 | 39 | 40 | 41 | 42 | -150 | -151 | -152 | -153 | -154 | -155 |
| 0000 0101 10 bbb | 43 | 44 | 45 | 46 | 47 | 48 | -144 | -145 | -146 | -147 | -148 | -149 |
| 0000 0101 00 bbb | 49 | 50 | 51 | 52 | 53 | 54 | -138 | -139 | -140 | -141 | -142 | -143 |
| 0000 0100 10 bbb | 55 | 56 | 57 | 58 | 59 | 60 | -132 | -133 | -134 | -135 | -136 | -137 |
| 0000 0100 010 bbb | 61 | 62 | 63 | 64 | 65 | 66 | -126 | -127 | -128 | -129 | -130 | -131 |
| 0000 0100 000 bbb | 67 | 68 | 69 | 70 | 71 | 72 | -120 | -121 | -122 | -123 | -124 | -125 |
| 0000 0011 110 bbb | 73 | 74 | 75 | 76 | 77 | 78 | -114 | -115 | -116 | -117 | -118 | -119 |
| 0000 0011 100 bbb | 79 | 80 | 81 | 82 | 83 | 84 | -108 | -109 | -110 | -111 | -112 | -113 |
| 0000 0011 010 bbb | 85 | 86 | 87 | 88 | 89 | 90 | -102 | -103 | -104 | -105 | -106 | -107 |
| 0000 0011 000 bbb | 91 | 92 | 93 | 94 | 95 | N/A | N/A | -97 | -98 | -99 | -100 | -101 |

NOTE - For VLC of 1, no bbb extension bits follow. Two or three bbb extension bits may follow as indicated in the heading.

85. DCT Coefficients

Table 85a Variable length codes for dct_dc_size_luminance.

| VLC code | dct dc size luminance |
|---|---|
| 100 | 0 |
| 00 | 1 |
| 01 | 2 |
| 101 | 3 |
| 110 | 4 |
| 1110 | 5 |
| 11110 | 6 |
| 111110 | 7 |
| 111111 | 8 |

Table 85b. Variable length codes for dct_dc_size_chrominance.

| VLC code | dct dc size chrominance |
|---|---|
| 00 | 0 |
| 01 | 1 |
| 10 | 2 |
| 110 | 3 |
| 1110 | 4 |
| 11110 | 5 |
| 111110 | 6 |
| 1111110 | 7 |
| 1111111 | 8 |

Table 85c. Variable length codes for dct_coeff_first and dct_coeff_next.

| dct_coeff_first and dct_coeff_next variable length code (NOTE1) | run | level |
|---|---|---|
| 10 | end_of_block | |
| 1 s      (NOTE2) | 0 | 1 |
| 11 s     (NOTE3) | 0 | 1 |
| 011 s | 1 | 1 |
| 0100 s | 0 | 2 |
| 0101 s | 2 | 1 |
| 0010 1 s | 0 | 3 |
| 0011 1 s | 3 | 1 |
| 0011 0 s | 4 | 1 |
| 0001 10 s | 1 | 2 |
| 0001 11 s | 5 | 1 |
| 0001 01 s | 6 | 1 |
| 0001 00 s | 7 | 1 |
| 0000 110 s | 0 | 4 |
| 0000 100 s | 2 | 2 |
| 0000 111 s | 8 | 1 |
| 0000 101 s | 9 | 1 |
| 0000 01 | escape | |
| 0010 0110 s | 0 | 5 |
| 0010 0001 s | 0 | 6 |
| 0010 0101 s | 1 | 3 |
| 0010 0100 s | 3 | 2 |
| 0010 0111 s | 10 | 1 |
| 0010 0011 s | 11 | 1 |
| 0010 0010 s | 12 | 1 |
| 0010 0000 s | 13 | 1 |
| 0000 0010 10 s | 0 | 7 |
| 0000 0011 00 s | 1 | 4 |
| 0000 0010 11 s | 2 | 3 |
| 0000 0011 11 s | 4 | 2 |
| 0000 0010 01 s | 5 | 2 |
| 0000 0011 10 s | 14 | 1 |
| 0000 0011 01 s | 15 | 1 |
| 0000 0010 00 s | 16 | 1 |

NOTE1 - The last bit 's' denotes the sign of the level, '0' for positive, '1' for negative.
NOTE2 - This code is used if the coefficient is the first one.
NOTE3 - This code is used if the coefficient is not the first one.

Table 85d. Variable length codes for dct_coeff_first and dct_coeff_next (continued).

| dct_coeff_first and dct_coeff_next variable length code (NOTE) | run | level |
|---|---|---|
| 0000 0001 1101 s | 0 | 8 |
| 0000 0001 1000 s | 0 | 9 |
| 0000 0001 0011 s | 0 | 10 |
| 0000 0001 0000 s | 0 | 11 |
| 0000 0001 1011 s | 1 | 5 |
| 0000 0001 0100 s | 2 | 4 |
| 0000 0001 1100 s | 3 | 3 |
| 0000 0001 0010 s | 4 | 3 |
| 0000 0001 1110 s | 6 | 2 |
| 0000 0001 0101 s | 7 | 2 |
| 0000 0001 0001 s | 8 | 2 |
| 0000 0001 1111 s | 17 | 1 |
| 0000 0001 1010 s | 18 | 1 |
| 0000 0001 1001 s | 19 | 1 |
| 0000 0001 0111 s | 20 | 1 |
| 0000 0001 0110 s | 21 | 1 |
| 0000 0000 1101 0 s | 0 | 12 |
| 0000 0000 1100 1 s | 0 | 13 |
| 0000 0000 1100 0 s | 0 | 14 |
| 0000 0000 1011 1 s | 0 | 15 |
| 0000 0000 1011 0 s | 1 | 6 |
| 0000 0000 1010 1 s | 1 | 7 |
| 0000 0000 1010 0 s | 2 | 5 |
| 0000 0000 1001 1 s | 3 | 4 |
| 0000 0000 1001 0 s | 5 | 3 |
| 0000 0000 1000 1 s | 9 | 2 |
| 0000 0000 1000 0 s | 10 | 2 |
| 0000 0000 1111 1 s | 22 | 1 |
| 0000 0000 1111 0 s | 23 | 1 |
| 0000 0000 1110 1 s | 24 | 1 |
| 0000 0000 1110 0 s | 25 | 1 |
| 0000 0000 1101 1 s | 26 | 1 |

NOTE - The last bit 's' denotes the sign of the level, '0' for positive, '1' for negative.

Table B5e. Variable length codes for dct_coeff_first and dct_coeff_next (continued).

| dct_coeff_first and dct_coeff_next variable length code (NOTE) | run | level |
|---|---|---|
| 0000 0000 0111 11 s | 0 | 16 |
| 0000 0000 0111 10 s | 0 | 17 |
| 0000 0000 0111 01 s | 0 | 18 |
| 0000 0000 0111 00 s | 0 | 19 |
| 0000 0000 0110 11 s | 0 | 20 |
| 0000 0000 0110 10 s | 0 | 21 |
| 0000 0000 0110 01 s | 0 | 22 |
| 0000 0000 0110 00 s | 0 | 23 |
| 0000 0000 0101 11 s | 0 | 24 |
| 0000 0000 0101 10 s | 0 | 25 |
| 0000 0000 0101 01 s | 0 | 26 |
| 0000 0000 0101 00 s | 0 | 27 |
| 0000 0000 0100 11 s | 0 | 28 |
| 0000 0000 0100 10 s | 0 | 29 |
| 0000 0000 0100 01 s | 0 | 30 |
| 0000 0000 0100 00 s | 0 | 31 |
| 0000 0000 0011 000 s | 0 | 32 |
| 0000 0000 0010 111 s | 0 | 33 |
| 0000 0000 0010 110 s | 0 | 34 |
| 0000 0000 0010 101 s | 0 | 35 |
| 0000 0000 0010 100 s | 0 | 36 |
| 0000 0000 0010 011 s | 0 | 37 |
| 0000 0000 0010 010 s | 0 | 38 |
| 0000 0000 0010 001 s | 0 | 39 |
| 0000 0000 0010 000 s | 0 | 40 |
| 0000 0000 0011 111 s | 1 | 8 |
| 0000 0000 0011 110 s | 1 | 9 |
| 0000 0000 0011 101 s | 1 | 10 |
| 0000 0000 0011 100 s | 1 | 11 |
| 0000 0000 0011 011 s | 1 | 12 |
| 0000 0000 0011 010 s | 1 | 13 |
| 0000 0000 0011 001 s | 1 | 14 |

NOTE - The last bit 's' denotes the sign of the level, '0' for positive, '1' for negative.

Table B5f. Variable length codes for dct_coeff_first and dct_coeff_next (continued).

| dct_coeff_first and dct_coeff_next variable length code (NOTE) | run | level |
|---|---|---|
| 0000 0000 0001 0011 s | 1 | 15 |
| 0000 0000 0001 0010 s | 1 | 16 |
| 0000 0000 0001 0001 s | 1 | 17 |
| 0000 0000 0001 0000 s | 1 | 18 |
| 0000 0000 0001 0100 s | 6 | 3 |
| 0000 0000 0001 1010 s | 11 | 2 |
| 0000 0000 0001 1001 s | 12 | 2 |
| 0000 0000 0001 1000 s | 13 | 2 |
| 0000 0000 0001 0111 s | 14 | 2 |
| 0000 0000 0001 0110 s | 15 | 2 |
| 0000 0000 0001 0101 s | 16 | 2 |
| 0000 0000 0001 1111 s | 27 | 1 |
| 0000 0000 0001 1110 s | 28 | 1 |
| 0000 0000 0001 1101 s | 29 | 1 |
| 0000 0000 0001 1100 s | 30 | 1 |
| 0000 0000 0001 1011 s | 31 | 1 |

NOTE - The last bit 's' denotes the sign of the level, '0' for positive, '1' for negative.

Table B5g. Encoding of run and level following escape code as a 20-bit fixed length code (-127 <= level <= 127) or as a 28-bit fixed length code (-255 <= level <= -128, 128 <= level <= 255).

| fixed length code | run |
|---|---|
| 0000 00 | 0 |
| 0000 01 | 1 |
| 0000 10 | 2 |
| ... | ... |
| ... | ... |
| ... | ... |
| ... | ... |
| ... | ... |
| 1111 11 | 63 |

| fixed length code | level |
|---|---|
| forbidden | -256 |
| 1000 0000 0000 0001 | -255 |
| 1000 0000 0000 0010 | -254 |
| ... | ... |
| 1000 0000 0111 1111 | -129 |
| 1000 0000 1000 0000 | -128 |
| 1000 0001 | -127 |
| 1000 0010 | -126 |
| ... | ... |
| 1111 1110 | -2 |
| 1111 1111 | -1 |
| forbidden | 0 |
| 0000 0001 | 1 |

| ... | ... |
|---|---|
| 0111 1111 | 127 |
| 0000 0000 1000 0000 | 128 |
| 0000 0000 1000 0001 | 129 |
| ... | |
| 0000 0000 1111 1111 | 255 |

ANNEX C -- POST-PROCESSING AND DISPLAY

The following specifications apply to post-processing and display of 24, 25 and 30 pictures/second coded video on 59.94 fields/second 525-line and 50 fields/sec 625-line televisions by conversion compatible with standard CCIR Recommendation 601.

The use of other formats and displays is not precluded.

C1. Pictures for 525 and 625-line Television

The displayable part of the luminance picture is horizontal_size pels wide and vertical_size pels high, and it is positioned in the top left corner of the encoded picture. For 525-line video, the picture is 352 pel wide and 240 pels high. For 625-line video, the picture is 352 pels wide and 288 pels high. Since the dimensions are divisible by 16, the entire picture is displayable. The chrominance pictures are half as high and half as wide as the luminance picture. The luminance and chrominance samples are positioned as shown in the following figure, where x mark the position of the luminance pels and 0 marks the position of the chrominance pels:

```
  x       x    |   x       x    |   x       x
      0         |       0        |       0
  x       x    |   x       x    |   x       x
  -----  -----    -----  -----    -----  -----
                                    -
  x       x    |   x       x    |   x       x
      0         |       0        |       0
  x       x    |   x       x    |   x       x
  -----  -----    -----  -----    -----  -----
  x       x    |   x       x    |   x       x
      0         |       0        |       0
  x       x    |   x       x    |   x       x
```

Figure.    The position of the luminance and chrominance samples.

C2. Picture to Field Conversion

The first step is to convert pictures to CCIR Recommendation 601 fields is to increase the width of the decoded luminance and chrominance matrices to 360 pels and 180 pels respectively by adding the same number of black pels to each side.

The second step is to convert the chrominance pictures from 120 x 180 to 240 x 180 (525-line) or from 144 x 180 to 288 x 180 (625-line) by means of a vertical interpolation filter.

The third step is to double the width of all pictures by means of a horizontal interpolation filter.

The fourth step is to double the height of all pictures by means of a vertical interpolation filter.

An appropriate interpolation filter is:

| -12 | 0 | 140 | 256 | 140 | 0 | -12 | // 256 |
|---|---|---|---|---|---|---|---|

The resulting luminance fields are 480 x 720 (525-line) or 576 x 720 (625-line). The resulting chrominance fields are 480 x 360 (525-line) or 576 x 360 (625-line) as required for the CCIR Recommendation 601 standard.

Video coded at 25 pictures per second is converted to 50 fields/sec by displaying the originally decoded lines in the odd CCIR Recommendation 601 fields and the interpolated lines in the even CCIR Recommendation 601 fields. Video coded at 30 pictures per second is converted to 60 fields/sec by displaying the originally decoded lines in the odd CCIR Recommendation 601 fields and the interpolated lines in the even CCIR Recommendation 601 fields.

Video encoded from film at 24 pictures/sec is converted to 50 field/sec by being decoded as though it were encoded at 25 pictures/sec, i.e. it is speeded up by about 4%. The audio must be maintained in synchronization, either by increasing the pitch, by speeding up the audio without pitch change, or by playing an audio track recorded for this playback mode.
Video encoded at 24 pictures/sec is converted to 59.94 field/s by alternately creating 2 or 3 fields from each picture.

C3. Consideration of Variable Resolution, Aspect Ratio, Pel Aspect Ratio, and Color Systems The previous sections have relied upon CCIR Recommendation 601 for definition of resolution, aspect ratio, pel aspect ratio, color system and so forth, for display on conventional television.

Computer workstations may vary significantly with respect to resolution. In particular, 480 x 640, 600 x 800, and 768 x 1024 formats are in wide use, supported by many manufacturers of graphics display cards and component-input monitors capable of synchronizing on multiple formats. It is anticipated that video will be displayed on these and more advanced workstations, either directly in full-screen, or under the control of windowing systems. Personal computers and workstations typically use square pels. This standard provides flexibility within the syntax and decoding algorithm to support varying resolutions, aspect ratios, and pel aspect ratios, but the conversion of the decoded pictures to the fields needed for a specific display is beyond the scope of this statement.

Appendix B

| Name | Bits | Access | Description |
|---|---|---|---|
| hCntl | 0 0000 1x | R/W | HOST CONTROL REG |
| gRunEn | [0] | r/w | global Run enable; reset to 0 upon gReset; |
| dRunEn | [1] | r/w | decoder chain run enable; reset to 0 upon gReset; |
| iRunEn | [2] | r/w | CPU (Instruction Unit) run enable; reset to 0 upon gReset; |
| dIntrEn | [3] | r/w | DMEM interrupt enable; reset to 0 upon gReset; |
| iIntrEn | [4] | r/w | INST-UNIT interrupt enable; reset to 0 upon gReset; |
| vIntrEn | [5] | r/w | VMEM interrupt enable; reset to 0 upon gReset; |
| cIntrEn | [6] | r/w | CMEM interrupt enable; reset to 0 upon gReset; |
| reset | [7] | w | soft reset |
| dIntr | [8] | r | DMEM interrupt; assert IRQ- if dIntrEn & dIntr |
| iIntr | [9] | r | INST-UNIT "firmware" interrupt (iCntl.int) |
| vIntr | [10] | r | VMEM interrupt |
| cIntr | [11] | r | CMEM interrupt |
| – | [12:31] | r | zero |
| iCntl | 0 0001 1x | R/W | INSTRUCTION CONTROL REG (10/22) |
| pc | [5:0] | r/we | program counter (write if wepc=1; no change if wepc=0) |
| pc1 | [11:6] | r/w | alternate program counter (used during interrupt) |
| selPc1 | [12] | r | select program counter (read only) (pc if 0; pc1 if 1) |
| wepc | [12] | w | write enable of pc (write only; same bit position as pcSel) |
| wpc | [18:13] | r/w | write pointer; if (gSel==iDataW) then iMem[wpc]= gData |
| test0 | [19] | r/w | force iMem_JAddr=wpc (required for host bus to write iMem) |
| test1 | [20] | r/w | disable doInterupt special function (when IR unkown) |
| test2 | [21] | r/w? | spare |
| cEnb | [22] | r/w | code interrupt enable |
| dEnb | [23] | r/w | decode interrupt enable |
| vEnb | [24] | r/w | video interrupt enable |
| big | [25] | r/w | big endian byte order (used only be aligner) |
| int | [26] | r/w | software host interrupt (if 1 then host will set IRQ pin) |
| wepc1 | [27] | w | write enable of pc (write only) |
| wrap | [31:28] | r/w | vertical MB slice number (used by mStep special function) |
| iData | 0 0001 0x | R/W | INSTRUCTION (DATA) REGISTER |
| op | [31:30] | | major operation (arith, LD, ST, shift,) |
| d | [29] | | destination control (local, global) |
| C | [28:24] | | destination register |
| opc | [23:21] | | minor opcode |
| B | [20:16] | | 5-bit source register |
| src | [15:14] | | source cntl (RegA, imm5(A), imm14(br,J,A)) |
| br | [13:10] | | branch control |
| J | [9:5] | | jump/branch target |
| A | [4:0] | | source register (or imm literal) |
| cCntl | 0 0011 1x | R/W | CMEM CONTROL REG |
| dCntl | 0 0100 1x | R/W | DMEM CONTROL REG |
| wCount | [4:0] | r/we | write address (load if wCntLdEn=1; increment if gSel==dDataW) |
| wCntLdEn | [5] | w | |
| full | [5] | r | fifo full flag |
| rCount | [10:6] | r/we | read address (load if rCntLdEn=1; increment if pop or gSel==dDataR) |
| rCntLdEn | [11] | w | |
| empty | [11] | r | fifo empty flag |
| deltaCnt | [16:12] | r/we | difference counter (load if dCntLdEn=1; increment if pop or gSel==dDataR) |
| | [17] | r | undefinded? |
| dCntLdEn | [18] | w | |
| runEn | [19] | r/w | dMem run enable |
| hEmtyEn | [20] | r/w | half empty flag enable (reset to 0) |
| softRstEn | [21] | w | like reset except does not reset 1) runEn 2) hEmptyEn flags |
| dPop | [21] | r | dPop input (from Decoder block) |
| dirMode | [22] | r?/w | 0: normal mode; 1: direct from C-Bus |
| ..are | [31:23] | | undefined? |
| dCntl | 0 0101 1x | R/W | DECODER CONTROL REG |
| bitCnt | [4:0] | r/w | cumulative bit position pointer for input shifter; init value = 24 |
| dpopReg | [5] | r/w | SW pop request reg. for init & SW header decoding; init value = 0; after init and decoder coming out of dHalt, write a 010 pulse to it; |
| coeff | [11:6] | r/w | counter for coeff count; init value = 0 |
| blk | [14:12] | r/w | block count; init value = 0 |
| mode422 | [15] | r/w | video mode; updated by SW on per GOF basis |
| pType | [17:16] | r/w | frame type; updated by SW on per frame basis |
| field | [21:18] | r/w | decoder internal state; init value = 0; |

| Name | Bits | R/W | Description |
|---|---|---|---|
| mtype | [25:22] | r/w | Micro Block type (intra, interpo, predict, ie); updated on per MB basis |
| synch | [26] | r/w | set by Decoder when 1) header synch code encountered; 2) illegal code: The state machine is reset to initial state idle state (look for MBA); |
| runEnb | [27] | r/w | when = 0, Decoder will stop Decoding and reset state machine to initial idle state (look for MBA); It does not affect what the Unpacker is doing, ie. Unpacker will finish it job; when = 1, Decoder is enabled and starts decoding |
| datasel | [28] | r/w | selects ddata0 register; 1: selects ddata1 register; |
| drsdc | [29] | r/w | reset DC predictor (to value 128); init value = 010 pulse under decoder halt |
| undefined | [31:30] | | undefined |

Data0    00101 0x & ~dCntl[28]  DECODER DATA0 REG

| Name | Bits | R/W | Description |
|---|---|---|---|
| MBA | [5:0] | r/w | Macro Block address; MB header info; init value = don't care |
| quant | [10:6] | r/w | Quantization value; MB header info; initialized by SW, update by HW |
| CBP- | [16:11] | r/w | Code block pattern; MB header info; init value = don't care |
| runlenth | [22:17] | r/w | MB runLenth; MB header info; init value = don't care |
| level | [30:23] | r/w | level value; MB header info; init value = don't care |
| dnewmt | [31] | r/w | 0: current mtype tables are used; 1: new mtype tables are used |

Data1    00101 0x & dCntl[28  DECODER DATA1 REG (FRAME DISTANCES)

| Name | Bits | R/W | Description |
|---|---|---|---|
| dfy2 | [2:0] | r/w | (frame distance - 1) for dmv2, y-component |
| dfx2 | [5:3] | r/w | (frame distance - 1) for dmv2, x-component |
| dfy1 | [8:6] | r/w | (frame distance - 1) for dmv1, y-component |
| dfx1 | [11:9] | r/w | (frame distance - 1) for dmv1, x-component |
| - | [31:12] | | undefined | dMV1    0 0110 0x   R/W   DECODER MV1 (FOWARD) (DATA) REG

| Name | Bits | R/W | Description |
|---|---|---|---|
| dfy2 | [2:0] | r/w | (frame distance - 1) for dmv2, y-component |
| p | [0] | r/w | backward pFilter offset??; init value = 0 |
| y | [8:1] | r/w | forward MV y-component; init value = 0 |
| x | [16:9] | r/w | forward MV x-component; init value = 0 |
| valid | [17] | r/w | motion vector valid bit; init value = 0 | dMV2    0 0110 1x   R/W   DECODER MV2 (BACKWARD) (CNTL) REG dDiag    0 0111 0x   R/W   DECODER SHIFTER DATA REG (borrowed from coSine)

| Name | Bits | R/W | Description |
|---|---|---|---|
| dShifter | [31:0] | r | output of shifter |
| input | [31:0] | w | decoder input (diagnostic) | sCntl    0_0111_1x   R/W   coSINE CONTROL REG

| Name | Bits | R/W | Description |
|---|---|---|---|
| cosOut | [15:0] | r* | if RdSel=00, read CosTrans output register |
| RamOut | [15:0] | r* | if RdSel=01, read RAM output |
| adr | [5:0] | w/r* | address counter value (* read only if RdSel=1x) |
| adrLden | [6] | w/r* | load enable for address counter |
| RamLdEn | [7] | w/r* | load enable for RAM input |
| RdSel | [9:8] | w/r* | select control for Rd_Ctl_Data (00: cosOut; 01: RamOut; 1x: cntlStatus reg) |
| TMode | [10] | w/r* | 0: normal mode; 1: Test mode |
| - | [15:11] | w/r* | undefined |
| DataIn | [31:16] | w | data input for RAM loading | zCntl    0 1000 1x   R/W   ZIGZAG CONTROL REG

| Name | Bits | R/W | Description |
|---|---|---|---|
| WrAdrCntr | [5:0] | r/w | write address counter, zigzag count sequence; Initialize 0 |
| RdAdrCntr | [11:6] | r/w | write address counter, zigzag count sequence; Initialize H24 (d'36 or -d'28) |
| tMode | [12] | r/w | Test mode control bit; latched at falling edge of gclk | zData    0 1000 0x   R/W   ZIGZAG DATA REG

| Name | Bits | R/W | Description |
|---|---|---|---|
| WrAdrCntr | [5:0] | r | write address counter, zigzag count sequence; Initialize 0 |
| RdAdrCntr | [11:6] | r | write address counter, zigzag count sequence; Initialize H24 (d'36 or -d'28) | read address counter, linear count sequence

| Name | Bits | R/W | Description |
|---|---|---|---|
| tMode | [12] | r/w | Test mode control bit; latched at falling edge of gclk |
| zData | [22:13] | w | zzDataIn[7:0] |
| zData | [22:13] | r | zzDataOut[7:0] | qCntl    0_1001_1x   R/W   DEQUANTIZER CONTROL REG

| Name | Bits | R/W | Description |
|---|---|---|---|
| CtlDat0 | [7:0] | w | Control Data_0: zQcoeff[7:0] |
| Out | [11:0] | r | observable data of QOut |
| CtlDat1 | [13:8] | w | Control Data_1: dQqunt[5:0] |
| CtlDat0EnL | [14] | w | write enable (0:enable; 1:disable) for Control Data0 |
| CtlDat1En | [15] | w | write enable (1:enable; 0:disable) for control Data1 |
| AdrCntr[8:0] | [24:16] | r/w | address counter preset value |
| AdrLdEn | [25] | w | // address counter load enable |
| SS | [26] | w | single step |
| FWrEn | [27] | w | flag write enable for f0-f3 |
| F0 | [28] | r/w | spare flag |

| | | | |
|---|---|---|---|
| IPF | [29] | r/w | 1: interpolated frame; 0: predicted frame |
| mode420 | [30] | r/w | mode: 1: 420 mode; 0: 422 mode |
| testMode | [31] | r/w | 1: test mode; 0: normal mode |

| qData | 0_1001_0x | R/W | deQUANTIZER DATA REG |
|---|---|---|---|
| qRamData | [7:0] | r/w | data input to Quantizer RAM |
| - | [15:8] | | undefined |
| AdrCntr[8:0] | [24:16] | r | address counter preset value |
| - | [31:25] | | undefined |

\*\* Note, the QRAM address has a different offset value for different modes:
    422 mode: qAdrCntr[8:0] = 'h40 (RAM location 0) – 'hBF (RAM location 127)
    420 mode: aAdrCntr[8:0] = 'hC0 (RAM location 0) – 'h13F (RAM location 127)

| tCntl | 0_1010_1x | R/W | TRANSFORM (IDCT) CONTROL REG |
|---|---|---|---|
| dctSync | [0] | r/w | slave latches preloaded values of dct STATE counter & DCT mem address counter |
| testMode | [1] | r/w | 1: disables decompressor's global hold "dHalt" allowing dct to run in test mode |
| regSel | [5:2] | r/w | 4-bit register select |
| | | | // 0000: - nop |
| | | | // 0001: - write STATE counter in the dct core |
| | | | // 0010: - write dct coeff 10 |
| | | | // 0011: - write dct coeff 11 |
| | | | // 0100: - write dct coeff 12 |
| | | | // 0101: - write dct coeff 13 |
| | | | // 0110: - write dct coeff 20 |
| | | | // 0111: - write dct coeff 21 |
| | | | // 1000: - write dct coeff 22 |
| | | | // 1001: - write dct coeff 23 |
| | | | // 1010: - idct bottom adder test generation penb (see tc doc) |
| | | | // 1011: - idct top multiplier test generation nenb (see tc doc) |
| | | | // 1100: - idct |
| | | | // 1101: - |
| Ctest | [6] | r/w | mux input select control for test input at top 1st path test |
| Dtest | [7] | r/w | mux input select control for test input at bottom 1st path test |
| Ntest | [8] | r/w | mux input select control for test input at top 2nd path test |
| Ptest | [9] | r/w | mux input select control for test input at bottom 2nd path test |
| evenMemTest | [10] | r/w | 0: normal mode; 1: enabel even mem data output onto internal data bus |
| oddMemTest | [11] | r/w | 0: normal mode; 1: enabel odd mem data output onto internal data bus |
| adrWrEn | [12] | r/w | DCT mem address counter write enable |
| dctTest | [13] | r/w | 0: normal; 1: select dctMem input from GBus (used in test mode) |
| dctMemRun | [14] | r/w | 0: normal opreration: 1: overwrite dct internal mem write signal |
| dir | [15] | r/w | 0: decompression; 1: compression |
| dctAddr | [20:16] | r | idct memory address counter |
| dctInfo | [23:21] | r | idct internal state info: dctInfo[2:0] = {swap_sig,co_2, ado2n} |
| stateCnt' | [27:24] | r | idct state counter value |

| tData | 0_1010_0x | R/W | TRANSFORM (IDCT) DATA REG |
|---|---|---|---|
| idctDat | [15?:0] | r/w | as defined by idctCtl[5:2] |

| bCntl | 0_1011_1x | R/W | NEW BLOCK MEM CONTROL REG 11/6 |
|---|---|---|---|
| rstCnt | [0] | w | reset RdAddr and WrAddr |
| testDinSel | [25] | w | 1: whole data path; 0: only RAM path |
| testDoutSel | [26] | w | 1: access upper 18 of 36-bit output; 0: access lower 18-bit output; auto increment |

| bCntl | 0_1011_1x | R/W | OLD BLOCK MEM CONTROL REG |
|---|---|---|---|
| RdAddr | [6:0] | r/w | RAM read port address counter; init to zero; |
| – | [7] | r | zero |
| WrAddr | [14:8] | r/w | RAM write port address counter; init to (-latency) |
| – | [15] | r | zero |
| bank | [17:16] | r/w | mem bank select (0x: Y; 10: U; 11: V) |
| MBcount | [19:18] | r/w | macro block cycle count (420 mode: loops from 0 to 3; 422 mode: = 0) |
| RaddrWrEn | [20] | w | write enable bit for read address counter |
| initOver | [20] | r | indicates initial pipe latency delay is over, b_hold function is enabled |
| WaddrWrEn | [21] | w | write enable bit for write address counter |
| not1stMB | [21] | r | not first macro block |
| MBaddrWrEn | [22] | w | write enable bit for macro-block address counter |
| m422 | [22] | r | 1: 422 mode |
| – | [23] | r | zero |
| holdEn | [24] | r/w | 1: enable hold to block storage |
| testDinSel | [25] | r/w | 1: whole data path; 0: only RAM path |
| testDoutSel | [26] | r/w | 1: access upper 18 of 36-bit output; 0: access lower 18-bit output; auto increment |
| – | [27] | r | zero |
| hold | [28] | r | hold signal (HALT) |
| rwclose | [29] | r | Read_write counter too close |

| | | | |
|---|---|---|---|
| bm_hold_ | [30] | r | block memory hold output |
| brdy | [31] | r | bm_ready status bit |
| | | | |
| bData | 0_1011_0x | R/W | BLOCK MEM DATA REG |
| dataLow | [12:0] | w | latch & limit data to ±255; write bMem[++wrAddr]; (if bCntl[25] bypass limter) |
| dataHigh | [28:16] | w | latch & limit data to ±255; write bMem[++wrAddr]; (if bCntl[25] bypass limter) |
| dataLow | [8:0] | r | if gCntl[26] Y0 else U |
| dataHigh | [24:16] | r | if gCntl[26] Y1 else V |
| brdy | [31?] | r | bm_ready status bit |
| | | | |
| fCntl | 0_1100_1x | R/W | FILTER CONTROL REG |
| V0bit | [0] | r/w | valid bit of current phase); zero-out if valid=0 |
| V1bit | [1] | r | valid bit of previous phase |
| pftest2 | [2] | r/w | high order bit of pftest[2:0] |
| -- | [3] | r | zero? |
| mvy43 | [5:4] | r/w | vertical motion vector, bits [4:3] |
| -- | [10:6] | r/w | undefined |
| sx | [11] | r/w | sign of mvx, horizontal motion vector |
| ColCnt | [15:12] | r/w | 4-bit Col counter |
| Phase | [17:16] | r/w | phase control bit, written by CPU for each phase |
| RowCnt | [22:18] | r/w | 5-bit Row counter |
| SwReset | [23] | w | soft reset |
| mvy210 | [26:24] | r/w | 3 LSB's of Mv_y |
| mvx10 | [28:27] | r/w | 2 LSB's of horizontal motion vector |
| pftest10 | [30:29] | r/w | low order 2 bits of pftest[2:0] |
| sy | [31] | r/w | sign of mvy, vertical motion vector |
| | | | |
| pCntl | 0_1101_1x | R/W | PREDICTOR (MOTION COMP) CONTROL REG |
| weight | [4:0] | r/w | weight control or frame distance reg |
| lpf | [5] | r/w | low pass filter bit (for P*64) |
| intLace | [6] | r/w | interlace mode bit |
| m422 | [7] | r/w | m422 mode |
| McTest | [8] | r/w | MC test mode |
| | | | |
| vCntl | 0_1110_1x | R/W | VIDEO MEM CONTROL REG |
| cnt | [2:0] | r/w | indicates |
| mCntl | 0_1111_1x | R/W | MEMORY (DRAM) CONTROL REG |

```
// Memory Controller    Level Module, Written by Da    David Galbi module dg_munit(maddr,maddr0L,maddr0H,mras,mcas,mwe,mrdy1,mrdy2,mrdyh,mholdcpu,
        mhold,mreadL,mreadH,mread2,mpassL,mpassH,moutL0,moutL1,moutH,mawr,mldmd,
        mhdtv1,mbus16,gData, gSel,e_adr,ireqA,irw,isize,imemop,resetn,gclk);

output [9:1] maddr;          // multiplexed row/column address for DRAM
output maddr0L,maddr0H;      // LSB of DRAM address for low and high half of mdata
output [2:0] mras;           // RAS for 3 banks or (HDTV) ras[0]= RAS and ras[2:1]= bank
output mcas;                 // cas output from chip
output [1:0] mwe;            // DRAM write enable for high and low half of 64-bit bus
output mrdy1,mrdy2;          // m-unit can accept a request from i-unit on next clock
output mrdyh;                // m-unit can accept a request from host on next clock
output mholdcpu,mhold;       // i-unit load delayed (goes high after execute stage)
output mreadL,mreadH;        // drive gData with low or high half of mdata
output mread2;               // drive gData with 2nd half of load double data
output mpassL,mpassH;        // pass data from gbus or hbus directly to mdata flip-flips
output moutL0,moutL1;        // output enable for mdata[15:0] and mdata[31:16]
output moutH;                // output enable for mdata[63:32]
output mawr;                 // write to m-unit address register (indicates host access)
output mldmd;                // load flip-flops connected to mdata outputs
output mhdtv1;               // HDTV mode - controls mdata input register bypass
output mbus16;               // DRAM bus width (1=16-bits, 0=64-bits)
inout [31:0] gData;          // global data bus input [6:0] gSel;            // global address bus
input [23:2] e_adr;          // half word address from instruction unit
input ireqA;                 // i-unit is providing a valid address
input irw;                   // read(0)/write(1) signal from i-unit execute stage
input [1:0] isize;           // width of data being accessed from i-unit execute stage
input [2:0] imemop;          // special functions for memory controller
input resetn,gclk;           // active low reset, global clock wire clk;                    // local clock
wire [3:0] cstate;           // current state of DRAM state machine
wire nras,cas;               // DRAM address strobes
```

```
wire gtrow;              // output DRAM row address on next clock
wire ldmaddr;            // load multiplexed row/col address register (maddr)
wire ref,prech,prech2;   // perform DRAM refresh, ras precharge
wire mreq,mreq2;         // m-unit is accepting memory request
wire mhdtv2,mhdtv3;      // HDTV mode - controls page size and address calculation
wire rasL4,rasH4;        // keep ras low/high for 4 clocks instead of 3 clocks
wire mla3,m2a3;          // bit 3 of address being processed
wire m0w;                // 32-bit word address bit in execute stage
wire m0hit,m2hit;        // new memory request does not need RAS cycle ("page hit")
wire m0std;              // store double (STD) in execute stage
wire readmc,ldmc;        // read/write m-unit control register
wire [31:0] gRec;        // local buffer for global data bus
wire [2:0] delay;        // control for programmable CAS delay line
wire [12:0] refcnt;      // current state of refresh counter
wire [1:0] refstat;      // refresh status (indicates number of refresh pending)

buffer u0(clk, gclk);
dg_ms ms(cstate,nras,cas,gtrow,ldmaddr, ref,prech,mreq2,m2hit,m0std,rasL4,rasH4,
        resetn,clk);
dg_mr mr(ref,prech,prech2,refcnt,refstat,gRec[14:0],imemop,cstate,ldmc,resetn,clk);
dg_ma ma(maddr[9:1],maddr0L,maddr0H,mras,m0hit,m2hit,m0w,mla3,m2a3, gRec[23:2],
        e_adr[23:2],mbus16,mreq,nras,mhdtv2,mhdtv3,gtrow,imemop,ldmaddr,
        mawr,cstate,resetn,clk);
dg_mc mc(mrdy1,mrdy2,mrdyh,mholdcpu,mhold,mwe,mcas,moutL0,moutL1,moutH,mreadL,
        mreadH,mread2,mpassL,mpassH,mreq,mreq2,m0std,mawr,mldmd,ldmc,readmc,
        mhdtv1,mhdtv2,mhdtv3,mbus16,rasL4,rasH4,delay, gRec[23:15],gRec[31],gSel,
        irw,isize,ireqA,cstate,mla3,m2a3,m0w,cas,m0hit,prech,prech2,resetn,clk);
tbuff32SB u1(gRec,gData, readmc,{mrdy1,mrdy2,mholdcpu,mhold,cstate,delay,rasH4,
        rasL4,mhdtv1,mhdtv2,mhdtv3,mbus16,refstat,refcnt});
endmodule // State Machine Block
// Written by Dave Galbi, Modified by Ming Lin module dg_ms(cstate,nras,cas,gtrow,ldmaddr,
        ref,prech,mreq2,m2hit,m0std,rasL4,rasH4,resetn,clk);

// Comments on input/output statements indicate what block signal is connected to
// s= state machine      r= refresh block   a= address block   c= control logic bloc
// i= instruction unit   o= other signals   h= host interface output [3:0] cstate;    // rc: current state of state machine
output nras;            // a: ras for active bank on next clock
output cas;             // c: DRAM cas is high for half or all of current clock
output gtrow;           // a: output DRAM row address on next clock
output ldmaddr;         // a: load DRAM address register input ref;              // r: perform DRAM refresh when ras goes high
input prech;            // r: precharge ras after completing current page mode cycle
input mreq2;            // c: DRAM controller has a request from i-unit or h-unit
input m2hit;            // a: address is in same DRAM row as last request
input m0std;            // c: store double in progress
input rasL4;            // c: keep ras low  for 4 clocks instead of 3 clocks
input rasH4;            // c: keep ras high for 4 clocks instead of 3 clocks
input resetn;           // o: active low reset
input clk;              // o: local clock reg [3:0] nstate;       // next state of state machine parameter [3:0] s0=0, s1=1, s2=2, s3=3, s4=4, s5=5, s6=6,  // state machine state
        s7=7, s8=8, s9=9, s10=10, s11=11, s12=12, s13=13, s14=14, s15=15;

always @(cstate or ref or prech or mreq2 or m2hit or m0std or rasL4 or rasH4)
    case (cstate)   //synopsys parallel_case
        s0: nstate = (ref)           ? s10 :
                     (~ref & mreq2)  ? s1 : s0;
        s1: nstate = s2;
        s2: nstate = (rasL4) ? s3 : s4;
        s3: nstate = s4;
        s4: nstate = s5;
        s5: nstate = (~prech & ~mreq2)         ? s6 :
                     (~prech & mreq2 & m2hit)  ? s4 : s8;
```

```
    s6: nstate = (~prech & ~mreq2)                     ? s6 :
                 (~prech &  mreq2 & m2hit &  m0std)    ? s7 :
                 (~prech &  mreq2 & m2hit & ~m0std)    ? s4 : s8;
    s7: nstate = s4;
    s8: nstate = (rasH4) ? s9 : s0;
    s9: nstate = s0;
    s10: nstate = s11;
    s11: nstate = (rasL4) ? s12 : s13;
    s12: nstate = s13;
    s13: nstate = s14;
    s14: nstate = s8;
    s15: nstate = s0;
  endcase DREG4C u0(cstate, clk, resetn, nstate);

assign nras = (nstate==s8 | nstate==s9 | nstate==s10 | nstate==s0 | nstate==s1);
DREG u1(cas, clk, nstate==s8 | nstate==s9 | nstate==s0 | nstate==s1 | nstate==s2 |
                  nstate==s3 | nstate==s4 | nstate==s6 | nstate==s7);
DREG u2(gtrow, clk, nstate==s0 | nstate==s1 | nstate==s9);
DREG u3(ldmaddr, clk, nstate==s0 | nstate==s1 | nstate==s2 | nstate==s3 |
                  nstate==s5 | nstate==s6 | nstate==s9);

endmodule
// Refresh Block
// Written by Dave Ga  , Modified by Ming Lin
//            ^ Dave Galbi
module dg_mr(ref,prech,prech2,refcnt,refstat, gRec,imemop,cstate,ldmc,resetn,clk);

// Comments on input/output statements indicate what block signal is connected to
// s= state machine     r= refresh block  a= address block  c= control logic block
// i= instruction unit  o= other signals  h= host interface output ref;              // s: perform DRAM refresh when ras goes high
output prech;            // sc: make ras go high
output prech2;           // c: i-unit has a pending request for ras precharge
output [12:0] refcnt;    // o: current state of refresh counter
output [1:0] refstat;    // o: refresh status:
                         //     0= one refresh done before requested by needref
                         //     1= no refreshes pending
                         //     2= one refresh pending, do when ras goes high
                         //     3= two refreshes pending, ras will be forced high input [14:0] gRec;       // o: global data bus received by local buffer
input [2:0] imemop;      // i: special functions for memory controller
input [3:0] cstate;      // s: current state of state machine (s14 = refresh done)
input ldmc;              // c: load m-unit control register from gData bus
input resetn;            // o: active low reset
input clk;               // o: local clock wire [12:0] refnum;      // number of clock cycles between refresh requests
wire ldrefcnt;           // load refcnt (one clock after control register is loaded)
wire needref;            // refresh counter is zero so a refresh needs to be done
wire [2:0] addout;       // output of adder for refstat
wire [1:0] clamp;        // output of clamp circuit for refstat
wire refoff;             // i-unit has disabled DRAM refresh
wire ref2;               // i-unit has a pending request for DRAM refresh parameter [3:0] s0=0, s1=1, s2=2, s3=3, s4=4, s5=5, s6=6,  // state machine states
                s7=7, s8=8, s9=9, s10=10, s11=11, s12=12, s13=13, s14=14, s15=15;

LREG13 u0(refnum, clk, resetn ? gRec[12:0] : 13'd62, ldmc | ~resetn);

DREG u1(ldrefcnt, clk, ldmc | ~resetn);
DREG13 u2(refcnt, clk, (needref | ldrefcnt) ? refnum : refcnt-13'd1);
assign needref = (refcnt == 13'd0);

// add  1 to refstat if needref & ~(cstate==s14),
//         ie refresh counter expired and didn't just complete a refresh
// add -1 to refstat if ~needref & (cstate==s14),
//         ie just completed a refresh and counter didn't request one
```

```
// add  0 to refstat if needref ^~ (cstate==s14),
//      ie needed a refresh and got one or didn't need one and didn't get one assign addout = refstat + {{2{~needref & (cstate==s14)}},needref ^ (cstate==s14)};
assign clamp = (addout==3'd4) ? 2'd3 : ((addout==-3'd1) ? 2'd0 : addout[1:0]);
DREG2 u3(refstat, clk, ~resetn ? 2'h1        :
                      ldmc    ? gRec[14:13] : clamp[1:0]);

// imemop indicates the following special functions for the DRAM controller:
//      imemop = 0   no special function
//      imemop = 1   disable DRAM refresh
//      imemop = 2   enable  DRAM refresh
//      imemop = 3   perform DRAM refresh
//      imemop = 4   perform ras precharge
//      imemop = 5   perform scan line load (fetch 4x1 instead of 2x2 quad cell)

// set refoff when i-unit disables refresh; reset when i-unit enables refresh
LREGC u4(refoff, clk, resetn, imemop==3'd1, (imemop==3'd1 | imemop==3'd2));
// set ref2 when i-unit requests refresh; reset when refresh is done
LREGC u5(ref2, clk, resetn, cstate!=s14, (imemop==3'd3 | cstate==s14));

// set prech2 when i-unit requests ras precharge; reset when precharge is done
LREGC u6(prech2,clk,resetn,cstate!=s2,(imemop==3'd3 | imemop==3'd4 | cstate==s2));

assign ref   = ~refoff & (ref2   | refstat[1]);
assign prech = ~refoff & (prech2 | &refstat[1:0]);

endmodule

// Address Block
// Written by Dave Ga    , Modified by Ming Lin
module dg_ma(maddr,maddr0L,maddr0H,mras,m0hit,m2hit,m0w,m1a3,m2a3,  gRec,e_adr,
         mbus16,mreq,nras,mhdtv2,mhdtv3,gtrow,imemop,ldmaddr,mawr,cstate,
         resetn,clk);

// Comments on input/output statements indicate what block signal is connected to
// s= state machine     r= refresh block  a= address block  c= control logic block
// i= instruction unit  o= other signals  h= host interface p= output pads of chip output [9:1] maddr;      // p: multiplexed row/column address for DRAM
output maddr0L;          // p: LSB of DRAM address for mdata[31:0]
output maddr0H;          // p: LSB of DRAM address for mdata[63:32]
output [2:0] mras;       // p: RAS for 3 banks or HDTV: ras[0]=RAS and ras[2:1]=bank
output m0hit,m2hit;      // c: last memory request and new request are in same row
output m0w;              // c: 32-bit word address bit in execute stage
output m1a3,m2a3;        // c: bit 3 of address being processed input [23:2] gRec;       // o: global data bus received by local buffer
input [23:2] e_adr;      // i: half word address from instruction unit
input mbus16;            // c: bus size (1=16-bit, 0=64-bit)
input mreq;              // c: memory request being sent to m-unit on current clock
input nras;              // s: ras for active bank on next clock
input mhdtv2,mhdtv3;     // c: HDTV mode-controls DRAM page size and address calc
input gtrow;             // s: output row address to DRAM on next clock
input [2:0] imemop;      // i: special functions for memory controller
input ldmaddr;           // s: load multiplexed row/col address register (maddr)
input mawr;              // c: write to m-unit address register (mla)
input [3:0] cstate;      // s: current state of DRAM state machine
input resetn;            // o: active low reset
input clk;               // o: local clock wire [20:0] m0a;         // DRAM word address from ALU or gData
wire [20:0] mla;         // DRAM word address being processed
wire [20:0] m2a;         // DRAM word address that will be output on next clock
wire m1hit;              // new memory request does not need RAS cycle ("page hit")
wire [3:0] rout;         // remainder after dividing part of address by 15 for HDTV
wire [1:0] hbank;        // DRAM bank for HDTV (quotient of address div 15)
wire [3:0] ha0,ha1,ha2;  // sections of memory address for HDTV
wire [17:0] ha;          // memory address for HDTV
wire [2:0] nbank;        // decoded DRAM bank for non-HDTV
```

```
wire allras;            // drop all 3 RAS for CAS-before-RAS refresh cycle
wire [2:0] ras0,ras1;   // ras outputs when nras is 0 and 1
wire [9:0] haddr,naddr; // multiplexed DRAM address for HDTV and non-HDTV
wire [9:0] da;          // multiplexed DRAM address
wire m0scan,m1scan,m2scan;// load 4 pixels along scan line parameter [3:0] s0=0, s1=1, s2=2, s3=3, s4=4, s5=5, s6=6,  // state machine states
                s7=7, s8=8, s9=9, s10=10, s11=11, s12=12, s13=13, s14=14, s15=15;

// Shift address right to form DRAM word address
// e_adr[23:0] and gRec[23:0] are 1/8 DRAM word addresses (ie byte when mbus16==0)
assign m0a = mawr ? gRec[23:3] : e_adr[23:3];
LREG21 u0(m1a, clk, m0a&{21{resetn}}, mreq | ~resetn);
assign m2a = mreq ? m0a : m1a;

// Calculate address bits used in control logic block
assign m0w = mawr ? gRec[2] : e_adr[2];
assign m1a3 = m1a[3];
assign m2a3 = m2a[3];

// Determine if memory access is a scan line load (for VMEM)
assign m0scan = (imemop==3'd5);
LREG u4(m1scan, clk, m0scan, mreq);
assign m2scan = mreq ? m0scan : m1scan;
// Determine if RAS cycle is needed; do RAS cycle whenever MB changes for HDTV
assign m0hit = (m0a[20:8]==m1a[20:8]) & (~mhdtv2 | m0a[7:6]==m1a[7:6]);
LREGC u1(m1hit, clk, resetn, m0hit, mreq);
assign m2hit = mreq ? m0hit : m1hit;

// Compute address and DRAM bank for HDTV
// In HDTV mode, as in the normal mode, the suggested mapping from pixel location
// to address has all the pixels for a 16x16 macroblock in sequential addresses.
// The mapping for HDTV mode differs from the normal mode in that horizontal
// strips of MBs switch between DRAM banks every 15 MBs in HDTV mode. When
// hdtv3=1, if the programmer's address space is viewed as a 2 dimensional array
// with location zero in the upper right hand corner, it would look like this:

//      <-- 15MBs -->  <-- 15MBs -->  <-- 15MBs -->  <-- 15MBs --> <-4MBs->
//      |  'Bank 0  |  | Bank 1    |  | Bank 2    |  | Bank 3    | unused |
//      |           |  |           |  |           |  |           |        |
//      |    .      |  |    .      |  |    .      |  |    .      |   .    |
//      |    .      |  |    .      |  |    .      |  |    .      |   .    |
//           .             .             .             .
// Sequential macroblock locations cover horizontal strips of MBs one MB high.
// The quotient of a DIV 15 determines the DRAM bank and the remainder is used as
// part of the DRAM address.  Since the remainder of DIV 15 can not be 15, the
// remainder is ORed with high order bits of the address so that all DRAM
// locations can be used.
dg_div15 u2(hbank,rout,m2a[11:6]);
assign ha0 = {4{m2a[20]}} | rout;
assign ha1 = {4{m2a[20]&m2a[16]}} | (m2a[20] ? rout : m2a[15:12]);
assign ha2 = {4{m2a[20]&m2a[16]&m2a[12]}} | (
             m2a[20]&m2a[16] ? rout :
             m2a[20]         ? m2a[15:12] : m2a[19:16]);
assign ha  = {ha2,ha1,ha0,m2a[5:0]};

// Compute bank for non-HDTV mode
// There are 3 memory banks, each with a separate RAS signal.  Any bank can be
// either 256K deep DRAM or 64K deep DRAM regardless of what the other banks are.
// Each bank is mapped to two different places in the address space.  The
// microcoder is responsible for only using addresses with memory connected to
// them.  The mapping of DRAM word addresses (m2a) to memory banks is shown below:
//
//       m2a[19:16]      Bank selected
//       19 18 17 16
//        0  0  X  X    bank0 (256K deep DRAM)
//        0  1  X  X    bank1 (256K deep DRAM)
//        1  0  X  X    bank2 (256K deep DRAM)
//        1  1  0  0    bank0 (64K deep DRAM)
//        1  1  0  1    bank1 (64K deep DRAM)
//        1  1  1  0    bank2 (64K deep DRAM)
// All 3 RAS cycles are low during a CAS-before-RAS refresh cycle
```

```
assign allras = (cstate==s10 | cstate==s11 | cstate==s12 | cstate==s13);
assign nbank[0] = m2a[19:18]==2'd0 | m2a[19:16]==4'b1100 | allras;
assign nbank[1] = m2a[19:18]==2'd1 | m2a[19:16]==4'b1101 | allras;
assign nbank[2] = m2a[19:18]==2'd2 | m2a[19:16]==4'b1110 | allras;

// Compute RAS/SEL signals
assign ras0 = mhdtv3 ? {1'h0,hbank} : ~nbank;
assign ras1 = mhdtv3 ? {1'h1,hbank} : 3'h7;
DREG3 u3(mras, clk, nras ? ras1 : ras0);

// Compute multiplexed DRAM address
assign haddr = gtrow ? {ha[17:16],ha[13:6]} : {ha[17],ha[15:14],ha[5:0]};
assign naddr = gtrow ? {m2a[8],m2a[17:9]}   : {m2a[7],m2a[8:0]};
assign da = mhdtv3 ? haddr : naddr;

// To support both 256Kx4 DRAMs (9 row/9 column addresses) and 256Kx16 DRAMs
// (10 row/8 column addresses), the 9th DRAM word address bit (m2a[8]) is output
// as both the 9th column address bit and the 10th row address bit. Systems
// using 256Kx4 DRAMs will leave the 10th multiplexed DRAM address (maddr[9])
// unconnected. To support 64Kx16 DRAMs (8 row/8 column addresses), the 8th DRAM
// word address bit (m2a[7]) is output as the 10th column address bit. Banks
// that have 64K deep DRAMs should use maddr[9], maddr[6:1], maddr0L and maddr0H
// as the multiplexed row/column address. The diagram below shows which DRAM
// word address bits (m2a) are used for each type of DRAM:

// maddr bits                              9   8   7   6   5   4  0L/0H 3   2   1

// m2a bits output as column address       7   8   7   6   5   4   3   2   1   0
// m2a bits output as row     address      8  17  16  15  14  13  12  11  10   9

// bits used for 256Kx4  column address        C   C   C   C   C   C   C   C   C
// bits used for 256Kx4  row    address        R   R   R   R   R   R   R   R   R // bits used for 256Kx16 column address            C   C   C   C   C   C   C   C
// bits used for 256Kx16 row    address    R   R   R   R   R   R   R   R   R // bits used for 64Kx16  column address    C           C   C   C   C   C   C   C
// bits used for 64Kx16  row    address    R           R   R   R   R   R   R   R // Quad pels are stored as follows on the 64-bit bus:
//
//        address(m2a)    upper 32-bits    lower 32-bits
//          0XXX          UT VT YT YT      UB VB YB YB
//          1XXX          UB VB YB YB      UT VT YT YT
//
//   T=top 2 pixels of quad    B=bottom 2 pixels of quad
//
// Storing the top 2 pixels of the quad pel in alternating halves of the 64-bit
// bus makes it possible to fetch 4 top or 4 bottom pixels with one 64-bit fetch
// by having separate control on one address bit for the 2 halves of the 64-bit
// bus. This type of access is used when loading scan lines into the V-MEM.

// The figure below shows the suggested way of mapping DRAM word addresses (m2a's)
// to screen locations. Sequential addresses cover a column of quad pixels on the
// screen that is 8 quads high followed by an adjacent column of quad pixels.
//          0    8   16   24
//          1    9   17   25
//          2   10   18   26
//          3   11   19    .
//          4   12   20    .
//          5   13   21    .
//          6   14   22
//          7   15   23

// To fetch 4 pixels along a scan line, the top pixels from quads at m2a=0 and
// m2a=8 need to be fetched at the same time. To do this, there is separate
// control of bit 3 of m2a for the 2 halves of the 64-bit bus. To make the chip
// appear simpler to the casual observer, maddr0L and maddr0H are the 2 address
// signals that are not shared between the high and low half of the 64-bit bus.
// Thus bit 3 of m2a is moved to maddr0L and maddr0H. If a user wants to view
```

```
// the DRAM address bits in the same order as they are provided on m2a, they
// should look at: {maddr[8:4], maddr0H, maddr[3:1]}

// When loading 2x2 quad pixels, maddr0L = maddr0H = registered da[3].
// When loading 4x1 scans, da[3] in the column address determines if the load
// fetches even or odd scan lines.
//                                      maddr0L   maddr0H
//          load even scans (da[3]=0)      1         0
//          load odd  scans (da[3]=1)      0         1

// When the DRAM bus is 16 bits, quad pixels are stored in 3 16-bit locations
// (YY UV YY) and require 3 memory requests to complete. The mdata pads will put
// the data from the last load on gData[31:16] so that the destination of a load
// (e.g. DMEM), does not have to know that the DRAM bus is only 16 bits. maddr0H
// is not used in 16-bit DRAM mode since there is no scan load in this mode.

LREG9 u5(maddr, clk, {da[9:4],da[2:0]}, ldmaddr);
LREG1 u6(maddr0L, clk, (~gtrow&~mbus16&m2scan ^ da[3]), ldmaddr);
LREG1 u7(maddr0H, clk, da[3], ldmaddr);

endmodule

// Control Logic Block
// Written by Dave G., Modified by Ming Lin module dg_mc(mrdy1,mrdy2,mrdyh,mholdcpu,mhold,mwe,mcas,moutL0,moutL1,moutH,mreadL,
      mreadH,mread2,mpassL,mpassH,mreq,mreq2,m0std,mawr,mldmd,ldmc,readmc,
      mhdtv1,mhdtv2,mhdtv3,mbus16,rasL4,rasH4,delay, gRec,gRec31,gSel,irw,
      isize,ireqA,cstate,m1a3,m2a3,m0w,cas,m0hit,prech,prech2,resetn,clk);

// Comments on input/output statements indicate what block signal is connected to
// s= state machine     r= refresh block  a= address block  c= control logic block
// i= instruction unit  o= other signals  h= host interface p= output pads of chip output mrdy1;             // i: m-unit can accept a non-STD from i-unit on next clock
output mrdy2;             // i: m-unit can accept a STD from i-unit on next clock
output mrdyh;             // h: m-unit can accept a request from host on next clock
output mholdcpu;          // i: hold cpu due to i-unit load delayed
output mhold;             // i: hold cpu status pipe due to i-unit load delayed
output [1:0] mwe;         // p: DRAM write enable for high and low half of 64-bit bus
output mcas;              // p: cas output from chip
output moutL0,moutL1;     // p: output enable for mdata[15:0] and mdata[31:16]
output moutH;             // p: output enable for mdata[63:32]
output mreadL,mreadH;     // p: drive gData with low or high half of mdata
output mread2;            // p: drive gData with 2nd half of load double data
output mpassL,mpassH;     // p: pass data from gbus or hbus directly to mdata FFs
output mreq;              // a: m-unit is accepting memory request on current clock
output mreq2;             // s: m-unit request on current clock or request pending
output m0std;             // s: store double (STD) in execute stage
output mawr;              // ap: write to m-unit address reg (indicates host access)
output mldmd;             // p: load flip-flops connected to mdata outputs
output ldmc;              // rs: write m-unit control register
output readmc;            // rs: read  m-unit control register
output mhdtv1;            // p: HDTV mode-controls mdata input register bypass
output mhdtv2;            // a: HDTV mode-controls forced page miss at MB boundary
output mhdtv3;            // a: HDTV mode-controls use of HDTV address calculation
output mbus16;            // ap: DRAM bus width (1=16-bits, 0=64-bits)
output rasL4,rasH4;       // s: keep ras low/high for 4 clocks instead of 3 clocks
output [2:0] delay;       // o: programmable CAS delay line control (output on gData)

input [23:15] gRec;       // o: global data bus received by local buffer
input gRec31;             // o: bit 31 of global data bus received by local buffer
input [6:0] gSel;         // o: global address bus
input irw;                // i: read(0)/write(1) signal from i-unit execute stage
input [1:0] isize;        // i: width of data being accessed from execute stage
input ireqA;              // i: i-unit is providing a valid address
input [3:0] cstate;       // s: current state of DRAM state machine
input m1a3,m2a3;          // a: bit 3 of address being processed
input m0w;                // a: 32-bit word address bit in execute stage
input cas;                // s: DRAM cas is high for half or all of current clock
input m0hit;              // a: memory request doesn't need RAS cycle ("page hit")
```

```
input prech;              // r: precharge ras after current page mode cycle
input prech2;             // r: precharge ras special function set
input resetn;             // o: active low reset
input clk;                // o: local clock wire mpend;               // m-unit has a request pending
wire dmreq;               // mreq delayed one clock (2nd half of STD data on gbus)
wire d0hit;               // delayed m0hit, allows mrdy2 if last request was a hit
wire m0rw,m1rw,m2rw;      // type of memory access (read=0,write=1)
wire m3a3,m4a3;           // bit 3 of address after state 5
wire m1w,m2w,m3w,m4w;     // 32-bit word address bit
wire [1:0] nwe;           // value of mwe on next clock
wire lpend;               // load operation in progress
wire mread00;             // load operation in state 5 (clock data comes out of DRAM)
wire mread0,mread1;       // mread00 delayed by 1 and 2 clocks
wire mhold1;              // generate mhold due to a page miss
wire sethold;             // set mhold on next clock
wire rsthold;             // reset mhold on next clock
wire s6prev;              // state machine was in state on previous clock
wire m0std;               // isize and irw indicate store double
wire dcas1,dcas2,dcas3;   // signals used to create cas output
wire [1:0] m0size,m1size,m2size,m3size,m4size; // width of data being accessed // signal names starting with m0,m1,m2 or m3 mean the following:
// m0 - signal valid during execute stage
// m1 - signal valid first clk after execute stage until next access started
// m2 - signal valid during execute stage and when m1 signals are valid
// m3 - signal valid from clock after state 5 to next state 5
// m4 - signal valid one clock after m3 signal parameter [1:0] size8=0,size16=1,size32=2,size64=3;
parameter [3:0] s0=0, s1=1, s2=2, s3=3, s4=4, s5=5, s6=6,  // state machine states
                s7=7, s8=8, s9=9, s10=10, s11=11, s12=12, s13=13, s14=14, s15=15;

assign mawr   = (gSel=={4'hF,2'h1});  // 7'h 3D  write m-unit data register (addr)
assign readmc = (gSel=={4'hF,2'h2});  // 7'h 3E  read  m-unit control register
assign ldmc   = (gSel=={4'hF,2'h3});  // 7'h 3F  write m-unit control register LREG9 u0({delay,rasH4,rasL4,mhdtv3,mhdtv2,mhdtv1,mbus16}, clk, gRec[23:15],ldmc);

// Set mreq if i-unit (ireqA) or host (mawr) makes a request on current clock
assign mreq = ireqA | mawr;

// Set mpend when m-unit request is made; reset mpend when request is completed.
// Once set, mpend stays high during ras precharge and DRAM refresh so that when
// the state machine reaches state 0 with ref low, it will process the memory
// request. For store doubles, mpend has the effect of delaying the ireqA, which
// goes high in state 4, to state 5 where it is used to start the memory cycle.
LREGC u1(mpend, clk, resetn, mreq, mreq | cstate==s4);

// Generate request signal used by state machine
// For HDTV mode, mreq2 is delayed one clock from mreq if in state s0 so that the
// HDTV row address calculation can be done before RAS is dropped
assign mreq2 = mreq&~((cstate==s0)&mhdtv3) | mpend;

// Calculate load enable for mdata flip-flops. The mdata flip-flops are loaded
// on any request but the data in them is only used for stores.
DREGC u2(dmreq, clk, resetn, mreq);
assign mldmd = mreq&(m0size!=size64) | dmreq&(m1size==size64);

DREGC u3(d0hit, clk, resetn, m0hit | ~mreq);

// Generate m-unit ready signals
// These signals indicate if the m-unit can accept a request on the next clock.
// The i-unit will not make a request that would cause contention on the gbus.
// For example, the i-unit will not issue a store until the data for outstanding
// loads is delivered by the m-unit.
assign mrdy1 = ~mreq & (~mpend&(cstate==s0 | cstate==s8 | cstate==s9) |
                       cstate==s4 | cstate==s6);
assign mrdy2 = ~mreq & (~mpend&(cstate==s0 | cstate==s8 | cstate==s9) |
```

```
                       ~prech&d0hit&(cstate==s5 | cstate==s7) | cstate==s6);
assign mrdyh = ~mreq & (~mpend&(cstate==s0) | cstate==s6);

// Generate mhold with a clocked set-reset flip-flop
// mhold goes high one clock after ireqA if load data will be delayed
// set mhold if i-unit load is delayed by page miss, precharge or ras to cas delay
//           note: s5 and s6 are the only states where a page cycle can start on
//                 the next clock.  In other states (s0, s8, s10), mhold will be
//                 set one clock after the ireqA for a load since the load data
//                 will be delayed until the cas cycle can be started
// reset mhold if will be in state 4 on next clock when returning from a ras cycle
assign m0std = irw & (isize==size64);
assign sethold = ireqA & ~m0std & (~m0hit | prech | ~(cstate==s5 | cstate==s6));
assign rsthold = (cstate==s3) | (cstate==s2)&~rasL4;
LREGC u4(mhold, clk, resetn, sethold, sethold | rsthold);
assign mholdcpu = mhold & lpend & ~prech2;

// Latch size, word address bit and read/write signal when an access is started
assign m0size = mawr ? size32 : isize;
LREG2 u5(m1size, clk, m0size, mreq);
assign m2size = mreq ? m0size : m1size;
LREG2 u6(m3size, clk, m2size, cstate==s4);
DREG2 u7(m4size, clk, m3size);

LREG u8(m1w, clk, m0w, mreq);
assign m2w = (mreq ? m0w : m1w) ^ m2a3;
LREG u9(m3w, clk, m2w, cstate==s4);
DREG u10(m4w, clk, m3w);

assign m0rw = mawr ? gRec31 : irw;
LREGC u11(m1rw, clk, resetn, m0rw, mreq);
assign m2rw = (mreq ? m0rw : m1rw);

// Generate output enables for mdata
// Drive mdata if idle in state 6 to keep input at a valid logic level
// Drive mdata if doing a store double
// Drive half of mdata if doing a store single
// Tristate upper 48-bits if in 16-bit DRAM bus mode so that the pullups will
// be able to keep the inputs at a valid logic level
DREGC u12(s6prev, clk, resetn, cstate==s6);
LREGC u13(moutL0, clk, resetn, (cstate==s6 & s6prev & ~prech & ~mreq2) | (cstate==s0 |
           m2rw&( (m2size==size64) | (m2size!=size64)& m2w | mbus16), cstate!=s4);
LREGC u14(moutL1, clk, resetn,
       ~mbus16 & ((cstate==s6 & s6prev & ~prech & ~mreq2) | (cstate==s0) |
                  m2rw&( (m2size==size64) | (m2size!=size64)& m2w)), cstate!=s4);
LREGC u15(moutH, clk, resetn,
       ~mbus16 & ((cstate==s6 & s6prev & ~prech & ~mreq2) | (cstate==s0) |
                  m2rw&( (m2size==size64) | (m2size!=size64)&~m2w)), cstate!=s4);

LREG u16(m3a3, clk, m2a3, cstate==s4);
DREG u17(m4a3, clk, m3a3);

// Make DRAM WE high if doing a read or if accessing a 32-bit word connected
// to the other WE on a 64-bit bus
assign nwe = {~m2rw | ( m2w)&(m2size!=size64)&(~mbus16) | cstate==s0 |
              cstate==s1 | (cstate>s7 & cstate<s15),
              ~m2rw | (~m2w)&(m2size!=size64)&(~mbus16) | cstate==s0 |
              cstate==s1 | (cstate>s7 & cstate<s15)} ;
DREG2 u18(mwe, clk, nwe);

// Store data is passed from gbus to mdata FFs whenever mreq is high (this covers
// the case of non-store doubles) or during the 2nd transfer clock of STD (when
// mreq=0) for the half of mdata that is transferred during the 2nd transfer clock
assign mpassL = mreq | ~m1a3;
assign mpassH = mreq | m1a3;

// Generate output enables for tristate buffers connected to gData in mdata pads.
// These output enables obey the following rules:
// 1. When the DRAM bus is 16-bits, only the low half is enabled
// 2. The 32-bit word address bit determines which half is read when the size
//    being read is not 64-bits
```

```
// 3. When reading a quad pel (64-bits), the bit 3 of the quad pel address
//    determines which half of the 64-bit bus is sent on gdata first so that
//    the top 2 pixels of the quad are sent first LREGC u19(lpend,   clk, resetn, ~m0rw&mreq, ~m0rw&mreq | (cstate==s4));
DREGC u20(mread00, clk, resetn, lpend&(cstate==s4));
DREGC u21(mread0,  clk, resetn, mread00);
DREGC u22(mread1,  clk, resetn, mread0);
DREGC u23(mread2,  clk, resetn, mread1&(m4size==size64));

DREGC u27(mreadL, clk, resetn, mbus16 & mread0
                              | (m4size!=size64) & m4w  & mread0
                              | (m4size==size64) & m4a3 & mread0);

DREGC u28(mreadH, clk, resetn, ~mbus16 & ( (m4size!=size64) & ~m4w & mread0
                                         | (m4size==size64) & ~m4a3 & mread0));

// Generate mcas: make high for half of clock in state 4 and delaying falling edge // dcas1 is low during the 2nd half of state 4 and 1st half of state 5
DREG u29(dcas1, ~clk, cstate!=s4);
// dcas2 is inverted cas output without falling edge delayed
nand2 casgate1(dcas2, dcas1, cas);
// dcas3 is dcas2 delayed by an amount determined by delay[2:0]
dg_delay u30(dcas3, dcas2, delay);
// mcas is high when dcas2 is low or when delayed version of dcas2 (dcas3) is low
nand2 casgate2(mcas, dcas3, dcas2);

endmodule
// Combinational logic to calculate X DIV 15 and X MOD 15
// Used in Address Block to calculate HDTV memory addresses
// Written by Dave Galbi module dg_div15(qout,rout, din);

output [1:0] qout;      // 2 LSBs of quotient
output [3:0] rout;      // remainder
input  [5:0] din;       // dividend
wire   [3:0] r1,r2;     // partial remainders // Function to divide a 5-bit number by 15, maximum valid input is 29
// Returns 1-bit quotient concatenated to 4-bit remainder
function [4:0] qr;  input [4:0] in;

qr ={(in[4] | &in[3:0]), (&in[3:0] ? 4'd0 : in[3:0] + in[4])};

endfunction

// Divide 4 MSBs of din by 15
assign r2 = &din[5:2] ? 0 : din[5:2];

// Concatenate din[1] with partial remainder and divide by 15
assign {qout[1],r1}  = qr({r2,din[1]});

// Concatenate din[0] with partial remainder and divide by 15
assign {qout[0],rout} = qr({r1,din[0]});

endmodule
// Programmable delay line
// Used by Control Logic Block to delay the falling edge of CAS
// Written by Dave Galbi module dg_delay(out, in,delay);

output out;             // output
input  in;              // input
input [2:0] delay;      // amount of delay
```

```
wire n0,n1,n2,n3,n4,n5,n6; // signals used to delay CAS
wire d0,d1,d2,d3,d4,d5,d6; // signals used to delay CAS
reg out;                   // output of delay line nor3 delay1(n0,in,in,in);
nor3 delay2(d0,n0,n0,n0);
nor3 delay3(n1,d0,d0,d0);
nor3 delay4(d1,n1,n1,n1);
nor3 delay5(n2,d1,d1,d1);
nor3 delay6(d2,n2,n2,n2);
nor3 delay7(n3,d2,d2,d2);
nor3 delay8(d3,n3,n3,n3);
nor3 delay9(n4,d3,d3,d3);
nor3 delay10(d4,n4,n4,n4);
nor3 delay11(n5,d4,d4,d4);
nor3 delay12(d5,n5,n5,n5);
nor3 delay13(n6,d5,d5,d5);
nor3 delay14(d6,n6,n6,n6);

always @(in or d0 or d1 or d2 or d3 or d4 or d5 or d6 or delay)
  case(delay) // synopsys parallel_case
    3'd0: out = in;
    3'd1: out = d0;
    3'd2: out = d1;
    3'd3: out = d2;
    3'd4: out = d3;
    3'd5: out = d4;
    3'd6: out = d5;
    3'd7: out = d6;
  endcase endmodule
```

Appendix D

```
vint:    NOOP;                         ba vcont;        /*** SLICE ***/
veos:    xor d64,vaddr,vaddr;          bn TEST_INTRPT;
         add -0174,vaddr,vaddr;
d2:      andn d_adr,cd_size,d_adr;     bpg delay;       /* Make cAdr an 12-bit counter*/
dint:    ldda 8,d_adr,dDat;            ba d2;
iret:    ld 0,r00,r00;                 bn TEST_INTRPT;  /* Return from subroutine */
         NOOP;
c2:      andn c_adr,cd_size,c_adr;     bpg iret;        /* Make cAdr an 12-bit counter*/
cint:    stda 8,c_adr,cDat;            ba c2;
vcont:   ldda x20000080,vaddr,vDat;    bn SCANLINE_LOAD;
         add -8,vcnt,vcnt;             bcc vint;
         andn c0174,vaddr,r00;         bnz iret;
         add r00, BperLin,vcnt;        bz veos;
         sub vaddr,stripm0200,vaddr;   ba veos;
delay:   ld 0,r00,r00;                 ba iret;
sminild: OUT pcinit,iCtl;              bn PRECHARGE;    /* Setup Imem write address */
         add LOW_LOADER,r00,mlcode;                     /*Setup address of rull loader*/
sgetld:  ldda 8,mlcode,iDat;           bnpg sgetld;     /* Load the whole thing in */
         NOOP;                         blong loader;
foo:     add mv2,r00,mv1;                               /* Setup for other direction */
         xor 1,dir,dir;                blong bar;       /* Forward <-> Backward */
_slice:  add mv1_new,r00,mv1;
         add mv2_new,r00,mv2;          bn TEST_INTRPT;  _( Initialize MacroBlock )
         add fAdr, r00,adr;                             _( DRAM Addr for forwd ref. )
blk:     and 0x38, mv1,delta;                           _( How far away from bot of MB?)
         shra 1,mv1,r00;               BN PRECHARGE;
         OUT mv1,fCtl;                 BN MV_LOAD;      _( Tell filter what to do )
         shl 20,mv1,mv1;                                _( How far away from bot of MB?)
         shra 20,mv1,mv1;
         add mv1,adr,adr;              BN MV1;          _( How far away from bot of MB?)
         add adr,wide ,adr;            BN MV3;          _( Stage-2 of above)
         add adr,wide3,adr;
         ldda 0, adr,fDat;             ba hlp1;         _( Grab first QuadPel )
a1:      ldda 8, adr,fDat;             BPG cd1;         _( LDD(fDat, adr += 8); )
c1:      add -8, cnt,cnt;              ba a1;           _( cnt -= 8; and loop )
ad1:     ldda delta, adr,fDat;         BNPG c1;         _( LDD(fDat, adr += delta);)
cd1:     sub cnt, delta,cnt;           Bnz ad1;         _( cnt -= delta )
         NOOP;                         bn TEST_INTRPT;
```

```
        NOOP;
        xor  -1, half,half;       BN PRECHARGE;  _( switch halves              )
        sub  d64, delta,delta;    bge hel;       _( delta = 64-delta;          )
        ldda strip, adr,fDat;                    _( LDD(fDat, adr += strip);)
hlpl:   sub  568, delta,cnt;                     _( How far do we have to go? )
        add  8, delta,delta;      BPG cdl;       _(                            )
        add  -8, cnt,cnt;         ba al;         _( cnt -= 8;                  )
hel:    shl  7, pos512, templ;    blong foo;     /* flag to indicate Phase 1 */
bar:    or   mv1, templ, mv1;     bnz bngf2;     /* Test if MV2 is valid */
        add  bAdr, r00,adr;       blong blk;     _( adr = bAdr + mv2;          )
bngf2:  add  -1,mCnt,mCnt;                       _( mCnt-=1;)
_wfaz2: IN   templ, dCtl;         blt nxtmb;
        IN   mv2_new, eCtl;       bn TEST_INTRPT;
        IN   mv1_new, eDat;                      _( Check Decoder for Start Code)
        shl  5,templ,r00;                        _( dsync off? )
        shl  1,templ,r00;         bge btest;     _( dsync on so is dValid off? )
        NOOP;                     bge nxtmb;
btest:  add  15,r00,temp3;        BN TEST_BRDY;  _( Block ready -> next ba works)
        shl  8, pos512, templ;    ba _wfaz2;     _( Loop until block is ready)
phase2: add  pos512, bAdr,bAdr;   blt nxtmb;     _( bAdr += 512;)
        OUT  templ,fCtl;                         _( Tell filter phase 2 )
sdelay: add  -1,temp3,temp3;      bnz sdelay;    _( Wait 7 ticks )
mx:     stda 8, mAdr,pDat;        B2 md;         _( STD(mAdr+=8, pDat)         )
        andn pos496, mAdr,sink;   ba mx;         _( 0760 & ~mAdr               )
md:     add  pos512, fAdr,fAdr;   BLONG _slice;  _( fAdr += 512;               )
nxtmb:  add  _endMBS,r00,jmpadr;  blong sminild;
```

Appendix E op.opc

| | | |
|---|---|---|
| 00,000 | ADD  | rC = rA + rB |
| 00,001 | SUB  | rC = rA - rB |
| 00,010 | AND  | rC = rA & rB |
| 00,011 | ANDN | rC = rA &-rB |
| 00,100 | OR   | rC = rA \| rB |
| 00,101 | ORN  | rC = rA \|-rB |
| 00,110 | XOR  | rC = rA ^ rB |
| 00,111 | XORN | rC = rA ^-rB |

| | | | |
|---|---|---|---|
| 01,010 | ST   | Store (32-bit) | Mem[rA+rB] = rC |
| 01,011 | STD  | Double         | Mem64[rA+rB] = rC,r(C+1) |
| 01,110 | STA  | Auto-increment | Mem[rB=rA+rB]=rC; |
| 01,111 | STDA | Store Double Auto-increment | |

| | | | |
|---|---|---|---|
| 10,010 | LD   | Load (32-bit) | rC=Mem[rA+rB] |
| 10,011 | LDD  | Double        | C,r(C+1)=Mem64[rA+rB] |
| 10,110 | LDA  | Auto-increment | rC=Mem[rB=rA+rB] |
| 10,111 | LDDA | Load Double Auto-increment | |

| | | |
|---|---|---|
| 11,010 | Shift Right Logical (unsigned)   | rC= rB >> rA |
| 11,011 | Shift Right Arithmetic (signed)  | rC = rB >> rA |
| 11,110 | Shift Left Logical               | rC= rB << rA |

| br | branch | | |
|---|---|---|---|
| 0000 | BN   | Never (decode J as special; J=0 nop) | |
| 1000 | BA   | Always | |
| 0001 | BZ   | Zero | Z |
| 1001 | BNZ  | Not Zero | !Z |
| 0010 | BLE  | Less or Equal (signed) | (Z or (N xor V)) |
| 1010 | BGT  | Greater Than (signed) | !(Z or (N xor V)) |
| 0011 | BLE  | Less Than (signed) | (N xor V) |
| 1011 | BGE  | Greater or Equal | !(N xor V) |
| 0100 | BLEU | Less or Equal (Unsigned) | (C or Z) |
| 1100 | BGTU | Greater Than (Unsigned) | !(C or Z) |
| 0101 | BC   | Less Than (Unsigned) | Carry |
| 1101 | BNC  | Greater or Equal (Unsign) | !Carry |
| 0110 | BPG  | Page cross | (Result&070==0) |
| 1110 | BNPG | Not Page Cross | !(Result&070==0) |
| 0111 | BV   | oVerflow | V |
| 1111 | BAL  | Always Long | |

(trap to resident firmware e.g. JMP completion)

We claim:

1. An apparatus for decompressing coded compressed video signal, comprising:
    a bus;
    a memory coupled to said bus, said bus being used for providing read and write accesses to said memory;
    a first-in-first-out (FIFO) buffer for receiving from said memory via said bus compressed video signals that are interframe or intraframe coded, said compressed video signals being represented by variable-length codes;
    a decoding circuit, coupled to said FIFO buffer, for decoding the variable-length codes of said intraframe coded compressed video signals received from said FIFO buffer;
    an inverse discrete cosine transform (IDCT) circuit, receiving said decoded video signals, for performing an inverse discrete cosine transform on said decoded video signals;
    a motion compensation circuit, coupled to receive said transformed video signals from said inverse discrete cosine transform circuit and coupled to receive over said bus reference frames from said memory, said motion compensation circuit reconstructs video signals using said reference frames to further decode said transformed video signals, and storing said reconstructed video signals in said memory via said bus; and
    a memory controller, coupled to said memory, said FIFO, said IDCT circuit, and said motion compensation circuit, for controlling memory access by said FIFO, said IDCT circuit, in accordance with a predetermined priority scheme;
    wherein said variable length codes are embedded in a bit stream, each said variable length code being of one of a plurality of code types, said apparatus further comprising:
    means for extruding from said bit stream a string of bits;
    a plurality of logic circuits each associated with one code type for receiving said string of bits, for decoding a varaible length code from said string of bits, and for providing the length of said variable length code decoded and a decoded datum;
    means for identifying a code type in accordance with a syntax state machine;
    means for selecting one datum from said decoded data in accordance with said code type identified; and
    means for advancing the bit stream the number of bits equal to the length of the variable code 2. An apparatus for decompressing coded compressed video signal, comprising
    a bus;
    a memory coupled to said bus, said bus being used for providing read and write accesses to said memory;
    a first-in-first-out (FIFO) buffer for receiving from said memory via said bus compressed video signals that are interframe or intraframe coded, said compressed video signals being represented y variable-length codes;
    a decoding circuit, coupled to said FIFO buffer, for decoding the variable-length codes of said intraframe coded compressed video signals received from said FIFO buffer;
    an inverse discrete cosine transform (IDCT) circuit, receiving said decoded video signals, for performing an inverse discrete cosine transform on said decoded video signals;
    a motion compensation circuit, coupled to receive said transformed video signals from said inverse discrete cosine transform circuit and coupled to receive over said bus reference frames from said memory, said motion compensation circuit reconstructs video signals using said reference frames to further decode said transformed video signals, and storing said reconstructed video signals in said memory via said bus;
    a memory controller, coupled to said memory, said FIFO, said IDCT circuit, and said motion compensation circuit, for controlling memory access by said FIFO, said IDCT circuit, in accordance with a predetermined priority scheme;
    means for receiving interframe coded current video data having motion vectors(s, y) coded with respect to reference video data for defining said reference frames;
    means for receiving said reference video data;
    a filter for resampling said video data in x and y directions;
    weighted adder for interpolating said reference video data and for summing said interpolated reference video data with said decoded data; and
    a pixel memory for containing said summed video data.

3. An apparatus as in claim 2, wherein said filter further comprises:
    a 2-tap filter for resampling in the horizontal direction; and
    a 3-tap filter for resampling in the vertical direction.

4. An apparatus as in claim 2, wherein said motion vector comprises first and second portions, said first portion being provided to said filter for resampling, said apparatus further comprising means for computing the sum of the screen locations of said reference data and the screen locations of said current video data, of set by said second portion of said motion vector.

5. An apparatus for decompressing coded compressed video signal, comprising:
    a bus;
    a memory coupled to said bus, said bus being used for providing read and write accesses to said memory;
    a first-in-first-out (FIFO) buffer for receiving from said memory via said bus compressed video signals that are interframe or intraframe coded, said compressed video signals being represented by variable-length codes;
    a decoding circuit, coupled to said FIFO buffer, for decoding the variable-length codes of said intraframe coded compressed video signals received from said FIFO buffer;
    an inverse discrete cosine transform (IDCT) circuit, receiving said decoded video signals, for performing an inverse discrete cosine transform on said decoded video signals;
    a motion compensation circuit, coupled to receive said transformed video signals from said inverse discrete cosine transform circuit and coupled to receive over said bus reference frames from said memory, said motion compensation circuit reconstructs video signals using said reference frames to further decode said transformed video signals, and storing said reconstructed video signals in said memory via said bus; and
    a memory controller, coupled to said memory, said FIFO, said IDCT circuit, and said motion compensation circuit, for controlling memory access by said FIFO, said IDCT circuit, in accordance with a predetermined priority scheme;

wherein said processor performs bilinear interpolation of two values, said interpolation being of the form $c = w^*a + ((2^{n-1}) - w)^*b$, n being an integer and $0 \leq w < 2^{n-1}$, said processor comprising:

means for generating signal $w'[0:n-1]$ having value $2^{n-1}$ when $w = 2^{n-1}$, and w otherwise;

multiplexer $M_0$ having as input data said values a and b, said multiplexer $M_1$ selecting as output datum input datum a when $w'[0] = 1$ and input datum b otherwise;

multiplexer $M_1$ having as input data said values a and b, said multiplexer $M_1$ selecting as output datum input datum a when $w'[1] = 1$ and input datum b otherwise;

n-2 multiplexers $M_2, M_3, \ldots$, and $M_{n-1}$, each having as input data said values a and b, multiplexers $M_i$, $i = 2, \ldots, n-1$, selecting input datum a when $w'[i]$ is 1, and selecting input datum b otherwise, and providing as output datum said selected datum shifted by $i-1$ bits; and means for adding said selected data.

6. An apparatus for decompressing coded compressed video signal, comprising:

a bus;

a memory coupled to said bus, said bus being used for providing read and write accesses to said memory;

a first-in-first-out (FIFO) buffer for receiving from said memory via said bus compressed video signals that are interframe or intraframe coded, said compressed video signals being represented by variable-length codes;

a decoding circuit, coupled to said FIFO buffer, for decoding the variable-length codes of said intraframe coded compressed video signals received from said FIFO buffer;

an inverse discrete cosine transform (IDCT) circuit, receiving said decoded video signals, for performing an inverse discrete cosine transform on said decoded video signals;

a motion compensation circuit, coupled to receive said transformed video signals from said inverse discrete cosine transform circuit and coupled to receive over said bus reference frames from said memory, said motion compensation circuit reconstructs video signals using said reference frames to further decode said transformed video signals, and storing said reconstructed video signals in said memory via said bus; and a memory controller, coupled to said memory, said FIFO, said IDCT circuit, and said motion compensation circuit, for controlling memory access by said FIFO, said IDCT circuit, in accordance with a predetermined priority scheme;

wherein said processor computes the expression $a + b * c$ using an accumulator, comprising:

means for expressing c into a ternary (1, 0, −1) representation having digits $d_{n-1}, \ldots, d_2, d_1$ and $d_0$;

means for computing the multiples of b having the form $b^*3^i$, where $i = 0, 1, 2, \ldots n-1$ and storing each multiple of b in a register; and means for adding to said accumulator, for each i, where $i = 0, 1, 2, \ldots, n-1$, the content of the register corresponding to $b^*3^i$, when $d_i = 1$, the value 0 when $d_8 = 0$, and the negated value of the register corresponding to $b^*3^i$.

7. An apparatus as in claim 6, wherein said expression computes a memory address under index mode, said apparatus further comprising means for adding to said accumulator a value a being the content of one of first and second registers selected in accordance with a signal indicating whether the sum of the content of said first register and $b^*c$ exceeds a predetermined value.

8. A method for decompressing coded compressed video signal, comprising the steps of:

providing a bus;

providing a memory coupled to said bus, such that said bus being used for read and write accesses to said memory;

providing a first-in-first-out (FIFO) buffer for receiving from said memory via said bus entropy encoded compressed video signals that are both interframe and intraframe coded, said entropy encoded compressed video signals being represented by variable-length codes;

providing a decoding circuit, coupled to said FIFO buffer, for decoding the variable-length codes of said compressed video signals received from said FIFO buffer;

providing an inverse cosine transform circuit, receiving from said decoding circuit said decoded video signals, for performing an inverse discrete cosine transform on said decoded video signals, and for providing said transformed video signals;

providing a motion compensation circuit, coupled to receive said transformed video signals from said inverse cosine transform circuit and coupled to receive over said bus reference frames from said memory, said motion compensation circuit reconstructs video signals using said reference frames to decode said transformed video signals, and storing said reconstructed video signals via said bus in said memory; and providing a memory controller, coupled to said memory, said FIFO, said IDCT circuit, and said motion compensation circuit, for controlling memory access y said FIFO, said IDCT circuit, in accordance with a predetermined priority scheme;

wherein said processor computes the expression b * c using an accumulator, comprising the steps of:

expressing c into a ternary (1, 0, −1) representation having digits $d_{n-1}, \ldots, d_2, d_1$ and $d_0$;

computing the multiples of b having the form $b^*3^i$, where $i = 0, 1, 2, \ldots, n-1$ and storing each multiple of b in a register; and for each i, where $i = 0, 1, 2, \ldots, n-1$, adding to said accumulator the content of the register corresponding to $b^*3^i$, when $d_i = 1$, the value 0 when $d_i = 0$, and the negated content of the register corresponding to $b^*3^i$.

9. A method as in claim 8, wherein said expression computes a memory address under index mode, said method further comprising the step of adding to said accumulator a value a being the content of one of first and second registers selected in accordance with a signal indicating whether the sum of the content of said first register and $b^*c$ exceeds a predetermined value.

10. A method for decompressing coded compressed video signal, comprising the steps of:

providing a bus;

providing a memory coupled to said bus, such that said bus being used for read and write accesses to said memory;

providing a first-in-first-out (FIFO) buffer for receiving from said memory via said bus entropy encoded compressed video signals that are both interframe and intraframe coded, said entropy encoded compressed video signals being represented by variable-length codes;

providing a decoding circuit, coupled to said FIFO buffer, for decoding the variable-length codes of said compressed video signals received from said FIFO buffer;

providing an inverse cosine transform circuit, receiving from said decoding circuit said decoded video signals, for performing an inverse discrete cosine transform on said decoded video signals, and for providing said transformed video signals;

providing a motion compensation circuit, coupled to receive said transformed video signals from said inverse cosine transform circuit and coupled to receive over said bus reference frames from said memory, said motion compensation circuit reconstructs video signals using said reference frames to decode said transformed video signals, and storing said reconstructed video signals via said bus in said memory; and providing a memory controller, coupled to said memory, said FIFO, said IDCT circuit, and said motion compensation circuit, for controlling memory access by said FIFO, said IDCT circuit, in accordance with a predetermined priority scheme;

wherein said variable length codes are embedded in a bit stream, each said variable length code being of one of a plurality of code types, said method further comprising the steps of:

extracting from said bit stream a string of bits;

providing a plurality of logic circuits each associated with one code type for receiving said string of bits, for decoding a variable length code from said string of bits, and for providing the length of said variable length code decoded and a decoded datum;

identifying a code type in accordance with a syntax state machine;

selecting one datum from said decoded data in accordance with said code type identified; and advancing the bit stream the number of bits equal to the length of the variable code decoded.

11. A method for decompressing coded compressed video signal, comprising the steps of:

providing a bus;

providing a memory coupled to said bus, such that said bus being used for read and write accesses to said memory;

providing a first-in-first-out (FIFO) buffer for receiving from said memory via said bus entropy encoded compressed video signals that are both interframe and intraframe coded, said entropy encoded compressed video signals being represented y variable-length codes;

providing a decoding circuit, coupled to said FIFO buffer, for decoding the variable-length codes of said compressed video signals received from said FIFO buffer;

providing an inverse cosine transform circuit, receiving from said decoding circuit said decoded video signals, for performing an inverse discrete cosine transform on said decoded video signals, and for providing said transformed video signals;

providing a motion compensation circuit, coupled to receive said transformed video signals from said inverse cosine transform circuit and coupled to receive over said bus reference frames from said memory, said motion compensation circuit reconstructs video signals using said reference frames to decode said transformed video signals, and storing said reconstructed video signals via said bus in said memory;

providing a memory controller, coupled to said memory, said FIFO, said IDCT circuit, and said motion compensation circuit, for controlling memory access by said FIFO, said IDCT circuit, in accordance with a predetermined priority scheme;

receiving interframe coded current video data having motion vectors (x, y) coded with respect to reference video data for defining said reference frames;

receiving said reference video data;

providing a filter for resampling said video data in x and y directions;

providing a weighted adder for interpolating said reference video data and for summing said interpolated reference video data with said decoded data; and providing a pixel memory for containing said summed video data.

12. A method as in claim 11, wherein said filter providing step further comprises:

providing a 2-tap filter for resampling in the horizontal direction; and providing a 3-tap filter for resampling in the vertical direction.

13. A method as in claim 11, wherein said motion vector comprises first and second portions, said first portion being provided to said filter for resampling, said apparatus further comprising means for computing the sum of the screen locations of said reference data and the screen locations of said current video data, offset by said second portion of said motion vector.

* * * * *

UNITED STATES PATENT AND TRADEMARK OFFICE
CERTIFICATE OF CORRECTION

PATENT NO. : 5,379,356  Page 1 of 1
APPLICATION NO. : 08/046474
DATED : January 3, 1995
INVENTOR(S) : Purcell et al.

It is certified that error appears in the above-identified patent and that said Letters Patent is hereby corrected as shown below:

In column 113, line 37, replace "extruding" with --extracting--.

In column 113, line 41, replace "varaible" with --variable--.

In column 113, line 50, insert --decoded.-- after "code".

In column 114, line 16, replace "(s, y)" with --(x, y)--.

Signed and Sealed this

Twenty-ninth Day of June, 2010

David J. Kappos
*Director of the United States Patent and Trademark Office*